United States Patent
Nicol et al.

(10) Patent No.: US 7,127,664 B2
(45) Date of Patent: Oct. 24, 2006

(54) RECONFIGURABLE ARCHITECTURE FOR DECODING TELECOMMUNICATIONS SIGNALS

(75) Inventors: Christopher J. Nicol, Springwood (AU); Mark Andrew Bickerstaff, Carlingford (AU); Bing Xu, Tempe, AZ (US); Ran-Hong Yan, Holmdel, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 583 days.

(21) Appl. No.: 09/908,003

(22) Filed: Jul. 18, 2001

(65) Prior Publication Data

US 2002/0129317 A1    Sep. 12, 2002

Related U.S. Application Data

(60) Provisional application No. 60/233,369, filed on Sep. 18, 2000.

(51) Int. Cl.
   *H03M 13/00* (2006.01)

(52) U.S. Cl. ............ 714/792; 714/795; 714/755; 375/265; 375/262

(58) Field of Classification Search ........... 714/786, 714/792, 795, 796, 755; 375/262, 265
See application file for complete search history.

(56) References Cited

U.S. PATENT DOCUMENTS

| | | | | |
|---|---|---|---|---|
| 5,068,859 A | | 11/1991 | Collins et al. ............ 371/43 |
| 5,327,440 A | | 7/1994 | Fredrickson et al. ........ 371/43 |
| 5,930,298 A | * | 7/1999 | Choi .................... 375/262 |
| 5,933,462 A | | 8/1999 | Viterbi et al. ............ 375/341 |
| 5,995,562 A | * | 11/1999 | Koizumi ................ 375/341 |
| 6,115,436 A | * | 9/2000 | Ramesh et al. ........... 375/341 |
| 6,400,290 B1 | * | 6/2002 | Langhammer et al. ....... 341/94 |
| 6,539,367 B1 | * | 3/2003 | Blanksby et al. .......... 706/14 |
| 6,571,366 B1 | * | 5/2003 | Doetsch et al. .......... 714/751 |
| 6,665,357 B1 | * | 12/2003 | Somayazulu ............. 375/341 |
| 6,690,737 B1 | * | 2/2004 | Kim ..................... 375/265 |
| 6,782,060 B1 | * | 8/2004 | Hartmann et al. ......... 375/341 |

FOREIGN PATENT DOCUMENTS

| | | |
|---|---|---|
| EP | 0 963 048 A2 | 12/1999 |
| GB | 2 357 938 A | 7/2001 |

(Continued)

OTHER PUBLICATIONS

S. S. Pietrobon, "Implementation and Performance Of A Turbo/Map Decoder", John Wiley and Sons, US, XP-000856961, vol. 16, No. 1, 1998, pp. 23-46.

(Continued)

*Primary Examiner*—Albert Decady
*Assistant Examiner*—Esaw Abraham

(57) ABSTRACT

The present invention discloses a single unified decoder for performing both convolutional decoding and turbo decoding in the one architecture. The unified decoder can be partitioned dynamically to perform required decoding operations on varying numbers of data streams at different throughput rates. It also supports simultaneous decoding of voice (convolutional decoding) and data (turbo decoding) streams. This invention forms the basis of a decoder that can decode all of the standards for TDMA, IS-95, GSM, GPRS, EDGE, UMTS, and CDMA2000. Processors are stacked together and interconnected so that they can perform separately as separate decoders or in harmony as a single high speed decoder. The unified decoder architecture can support multiple data streams and multiple voice streams simultaneously. Furthermore, the decoder can be dynamically partitioned as required to decode voice streams for different standards.

48 Claims, 38 Drawing Sheets

FOREIGN PATENT DOCUMENTS

| | | |
|---|---|---|
| WO | WO 99/52216 | 10/1999 |
| WO | WO 00/38366 A1 | 6/2000 |
| WO | WO 01/26527 A1 | 4/2001 |

OTHER PUBLICATIONS

European Search Report.

* cited by examiner

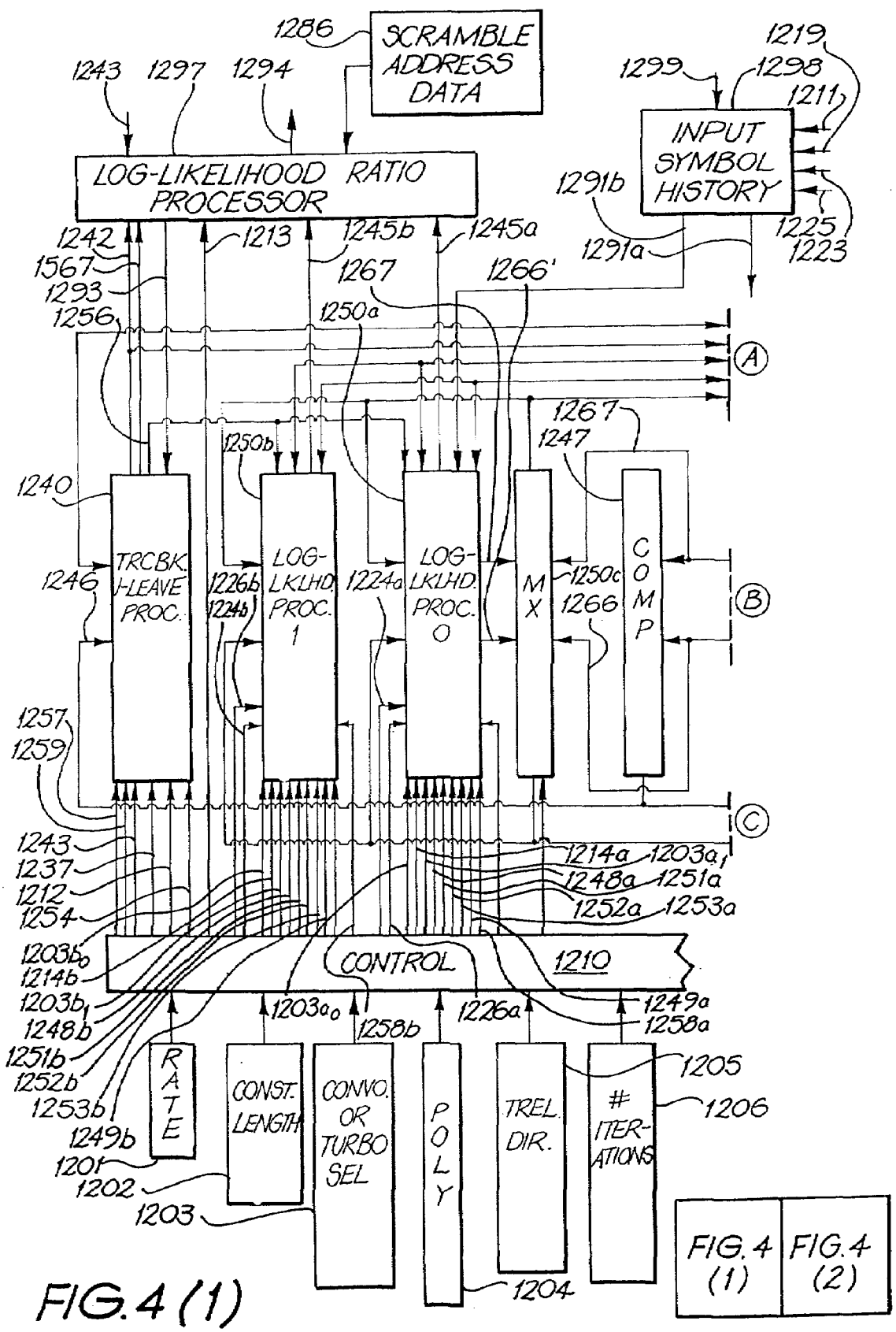
FIG.4 (1)

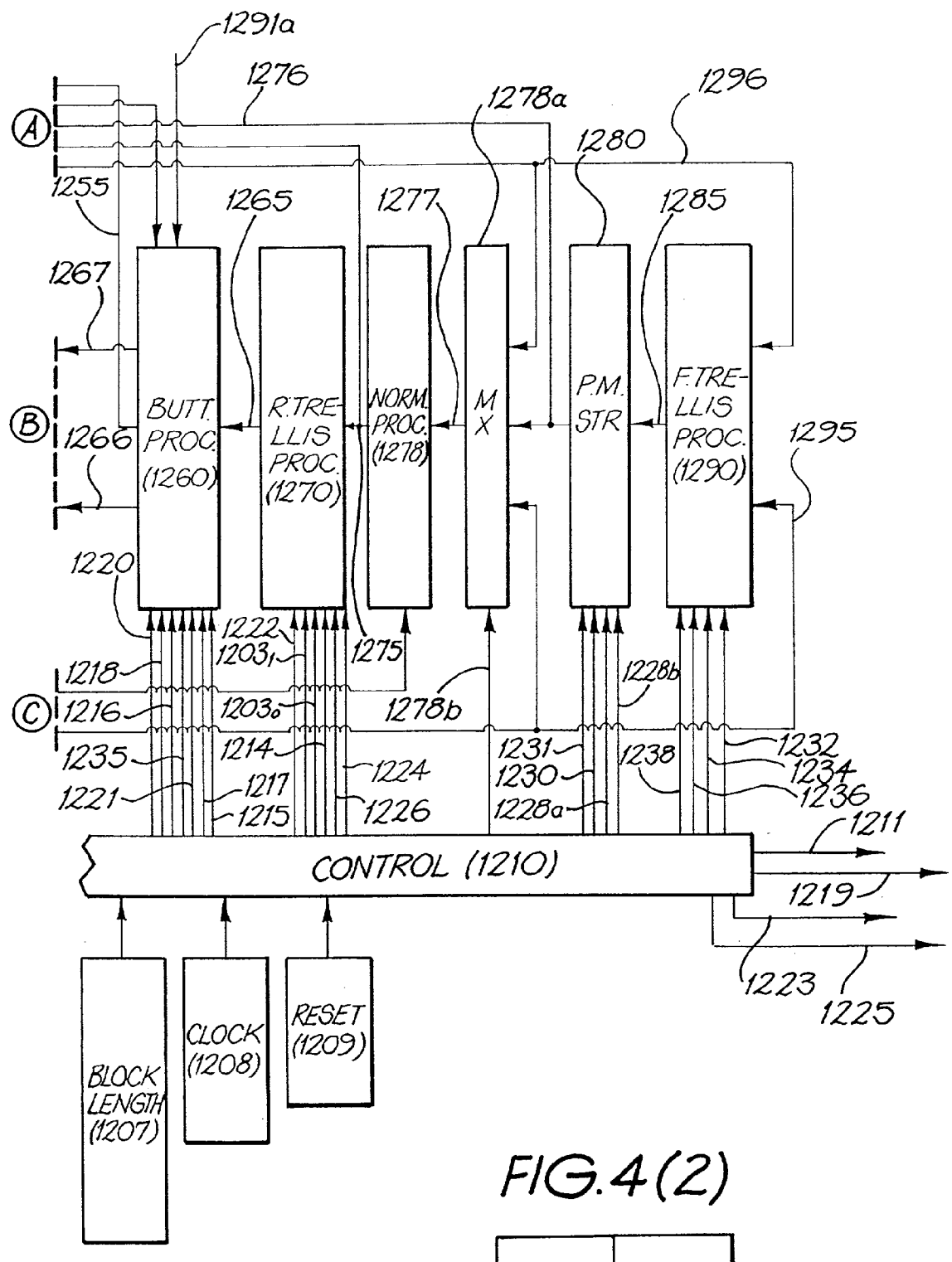
FIG.4(2)
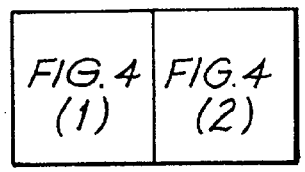

$$A \begin{array}{|c|c|c|c|} \hline 0 & 8 & 16 & 24 \\ 1 & 9 & 17 & 25 \\ 2 & 10 & 18 & 26 \\ 3 & 11 & 19 & 27 \\ \hline 4 & 12 & 20 & 28 \\ 5 & 13 & 21 & 29 \\ 6 & 14 & 22 & 30 \\ 7 & 15 & 23 & 31 \\ \hline \end{array} \equiv \begin{array}{c|c|c|c|c|} A & C_{0A} & C_{1A} & C_{2A} & C_{3A} \\ \hline B & C_{0B} & C_{1B} & C_{2B} & C_{3B} \\ \end{array}$$

FIG. 8A $$t=1 \quad \begin{array}{c|c|c|c|c|} A & & C_{1A} & C_{2A} & C_{3A} \\ \hline B & C_{0B} & C_{1B} & C_{2B} & C_{3B} \\ \end{array}$$

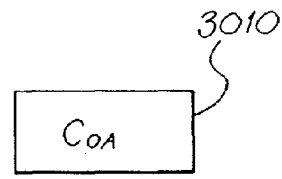

FIG. 8B $$t=2 \quad \begin{array}{c|c|c|c|c|} A & C_{0A}' & C_{1A} & & C_{3A} \\ \hline B & C_{0B}' & C_{1B} & C_{2B} & C_{3B} \\ \end{array}$$

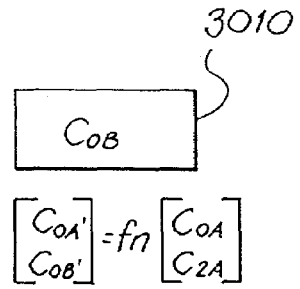

$$\begin{bmatrix} C_{0A}' \\ C_{0B}' \end{bmatrix} = fn \begin{bmatrix} C_{0A} \\ C_{2A} \end{bmatrix}$$

FIG. 8C $$t=3 \quad \begin{array}{c|c|c|c|c|} A & C_{0A}' & & C_{1A}' & C_{3A} \\ \hline B & C_{0B}' & C_{1B} & C_{1B}' & C_{3B} \\ \end{array}$$

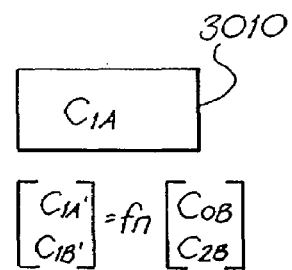

$$\begin{bmatrix} C_{1A}' \\ C_{1B}' \end{bmatrix} = fn \begin{bmatrix} C_{0B} \\ C_{2B} \end{bmatrix}$$

FIG. 8D $$t=4 \quad \begin{array}{c|c|c|c|c|} A & C_{0A}' & C_{2A}' & C_{1A}' & \\ \hline B & C_{0B}' & C_{2B}' & C_{1B}' & C_{3B} \end{array}$$

$$\overbrace{\boxed{C_{1B}}}^{3010}$$

$$\begin{bmatrix} C_{2A}' \\ C_{2B}' \end{bmatrix} = fn \begin{bmatrix} C_{1A} \\ C_{3A} \end{bmatrix}$$

FIG. 8E $$t=5 \quad \begin{array}{c|c|c|c|c|} A & C_{0A}' & C_{2A}' & C_{1A}' & C_{3A}' \\ \hline B & C_{0B}' & C_{2B}' & C_{1B}' & C_{3B}' \end{array}$$

$$\begin{bmatrix} C_{3A}' \\ C_{3B}' \end{bmatrix} = fn \begin{bmatrix} C_{1B} \\ C_{3B} \end{bmatrix}$$

$$|||$$

| | | | | |
|---|---|---|---|---|
| A | 0<br>1<br>2<br>3 | 16<br>17<br>18<br>19 | 8<br>9<br>10<br>11 | 24<br>25<br>26<br>27 |
| B | 4<br>5<br>6<br>7 | 20<br>21<br>22<br>23 | 12<br>13<br>14<br>15 | 28<br>29<br>30<br>31 |

FIG. 8F

RECONFIGURABLE ARCHITECTURE FOR DECODING TELECOMMUNICATIONS SIGNALS

CROSS REFERENCE TO RELATED APPLICATION

This application claims priority of U.S. Provisional Patent Application Ser. No. 60/233,369, which was filed Sep. 18, 2000, U.S. patent application Ser. No. 09/908,188 entitled "Method and Apparatus for Path Metric Processing in Telecommunications Systems" filed on even date herewith, and U.S. patent application Ser. No. 09/908,000 entitled "Butterfly Processor for Telecommunications" filed on even date herewith.

TECHNICAL FIELD OF THE INVENTION

The present invention relates generally to wireless communications and, in particular, to a decoder architecture for wireless communications systems.

BACKGROUND ART

Communication systems deal with the transmission of information from a transmitter to a receiver. The transmission medium through which the information passes often contains many sources of noise, including cosmic radiation, Additive White Gaussian Noise (AWGN), Rayleigh scattering (multipath propagation) and electromagnetic noise. The presence of these noise sources corrupts or prevents the transmission of the desired information, thus limiting the ability to communicate.

It is well known in the art that coding of the information to be transmitted, through the addition of redundant information calculated from the source information, improves the ability to successfully receive the transmitted information. Decoding uses the redundant information to detect the presence of errors or estimate the most probable emitted bits, given those received. Errors are detected when the transmitted redundancy is different from that subsequently calculated with the received data.

The weight of a codeword is a measure of the capacity to recover data from the codeword. A codeword with a high number of bits has a high weight. A low weight codeword exhibits a low ability to recover data, whereas, conversely, a high weight codeword exhibits improved recovery of data.

Automatic-repeat-request (ARQ) coding schemes employ an error-detection code. If the presence of an error is detected in the information received, a message requesting retransmission of the relevant information is sent from the receiver to the transmitter. ARQ coding schemes are relatively simple, but require the use of a feedback channel and deliver variable and comparatively slow throughput.

Forward error correction (FEC) coding schemes are used to encode information in systems in which propagation delays and latency are of concern. The receiver is able to detect and correct errors, without requiring a feedback channel.

Coding schemes can be broadly categorised into block codes and convolutional codes.

Block codes map a message of k information bits into a structured sequence of n bits, where n>k. The code is referred to as a (n,k) code. The ratio (n−k)/k is called the redundancy of the code and the ratio of information bits to the total number of bits, k/n, is called the code rate. The extra bits inserted provide redundancy and are used by the decoder to provide error detection and correction. The redundant bits added during encoding are only dependent on the k information bits in the message block. Block codes are often used to detect errors when ARQ is implemented.

Convolutional encoding generates a block of n code bits in a given period of time from k information bits, where n and k are typically small. The block of n bits generated by the encoder is dependent not only on the k information bits of the time period, but also on the message blocks generated during a predefined number of preceding time periods. The memory thus imparted on the coding enables errors to be corrected based on allowable sequences of codes. Convolutional decoding may be performed using either a Viterbi algorithm or LogMAP algorithm.

Convolutional codes are preferred for wireless voice communications systems in which the retransmission of data and its associated delay is intolerable. Block codes are capable of delivering higher throughput and are preferred for the transmission of data where latency is less of a concern.

Turbo codes, also known as parallel concatenated codes, are a class of codes whose performance is very close to the Shannon capacity limit. Turbo coders are implemented by connecting convolutional encoders either in parallel or series to produce concatenated outputs. Bit sequences passing from one encoder to another are permuted by an interleaver. In this manner, low-weight code words produced by a single encoder are transformed into high-weight code words. Turbo decoding thus takes two low weight codewords and obtains the effect of a much higher weight codeword.

At present, consumer wireless communication systems are primarily concerned with the transmission of voice. Such wireless communication systems include Advanced Mobile Phone Service (AMPS), Global System for Mobile Communication (GSM) and Code Division Multiple Access (CDMA). These represent the first (1G) and second (2G) generation systems. With the convergence of data and voice communication systems, the second-and-a-half generation (2.5G) and third generation (3G) systems are emerging in which the transmission of data is becoming a more important concern. In order to achieve superior error performance at higher transmission rates, turbo block encoding is preferred. The latency endemic to block coding is not as significant an issue as it is with the transmission of voice. New, third generation mobile wireless standards, like Universal Mobile Telecommunication Service (UMTS) and CDMA2000 require turbo encoding for data streams and convolutional encoding for voice streams. These systems require a complex turbo decoder for data and a Viterbi decoder for voice. Furthermore, backward compatibility requires that second generation standards are also supported.

The transmission of voice and data provides conflicting requirements of transmission rate versus latency and propagation delay. The current mode of addressing these problems is to provide separate encoding systems: turbo encoding for data streams and convolutional encoding for voice streams. Consequently, different decoders are also required, resulting in a multiplicity of hardware platforms and thus increased costs for telecommunications operators.

SUMMARY OF THE INVENTION

The prior art's problem with decoding is overcome, in accordance with the principles of the invention, by a single unified decoder for performing both convolutional decoding and turbo decoding in the one architecture. The unified decoder architecture can support multiple data streams and multiple voice streams simultaneously. The unified decoder can be partitioned dynamically to perform required decoding operations on varying numbers of data streams at different throughput rates. The unified decoder also supports simultaneous decoding of voice (convolutional decoding) and data (turbo decoding) streams. Advantageously, the unified decoder can be used to decode all of the standards for TDMA, IS-95, GSM, GPRS, EDGE, UMTS, and CDMA2000. The preferred embodiment is modular and thus readily scalable.

The reconfigurable architecture is capable of decoding data communication signals transmitted according to one of the plurality of coding schemes. The architecture includes: a trellis processing arrangement for receiving an input signal derived from the transmitted signals and new path metrics for determining intermediate decoded results using path metrics; an intermediate store for receiving modified decoded results and for providing a decoding output; and a controller. The controller is coupled to the trellis processing arrangement and is able to configure the architecture to perform one of convolutional or turbo decoding by forming the new path metrics using generated path metrics output from the trellis processing arrangement, determining the modified decoded results from the intermediate decoded results, and determining the decoded output from a selected one of the modified decoded results.

In accordance with one embodiment, a telecommunications decoding device consists of decoding processors and at least one store arranged in a processing loop. The device includes a control arrangement capable of reconfiguring the processing loop such that the processing loop can operate in accordance with at least two different coding schemes.

Another embodiment is directed to a telecommunications decoding device, which is capable of being scaled in either one or both of the time and space domains. In accordance with the principles of the invention, the decoding device consists of atomic processing units, each of which is capable of decoding input data provided according to one of a plurality of coding schemes. The atomic processing units may be stacked together and interconnected using an hierarchical switching structure. The individual processing units can perform independently as separate decoders. Alternatively, the individual processing units may be combined to form a signal high speed decoder with a predetermined processor being dominant. The flexibility of the architecture allows multiple parallel streams of input symbols to be processed contemporaneously or a single stream of input symbols to be processed more quickly by combining a plurality of processing units.

Advantageously, embodiments can perform both Viterbi and Log Map calculations by enabling one of two processors to evaluate a trellis in accordance with a determined coding arrangement of presented input symbols. The flexibility afforded by the invention allows telecommunications operators to reduce hardware costs and respond dynamically to variations in the coding of transmitted signals.

BRIEF DESCRIPTION OF THE DRAWINGS

A number of preferred embodiments of the present invention will now be described with reference to the drawings, in which:

FIG. 4 is a schematic block diagram representation of an architecture for a unified decoder;

FIGS. 8A–8F are representations of the in-place path metric addressing of a reverse trellis configuration;

DETAILED DESCRIPTION

The preferred embodiment provides a unified decoder architecture for wireless communication systems. The unified decoder implements the decoding required for convolutional encoded and turbo encoded data streams. The unified decoder architecture can support multiple data streams and multiple voice streams simultaneously. Furthermore, the decoder can be dynamically partitioned, as required, to decode voice streams for different standards. The preferred embodiment is modular and thus readily scalable.

Figure 1:
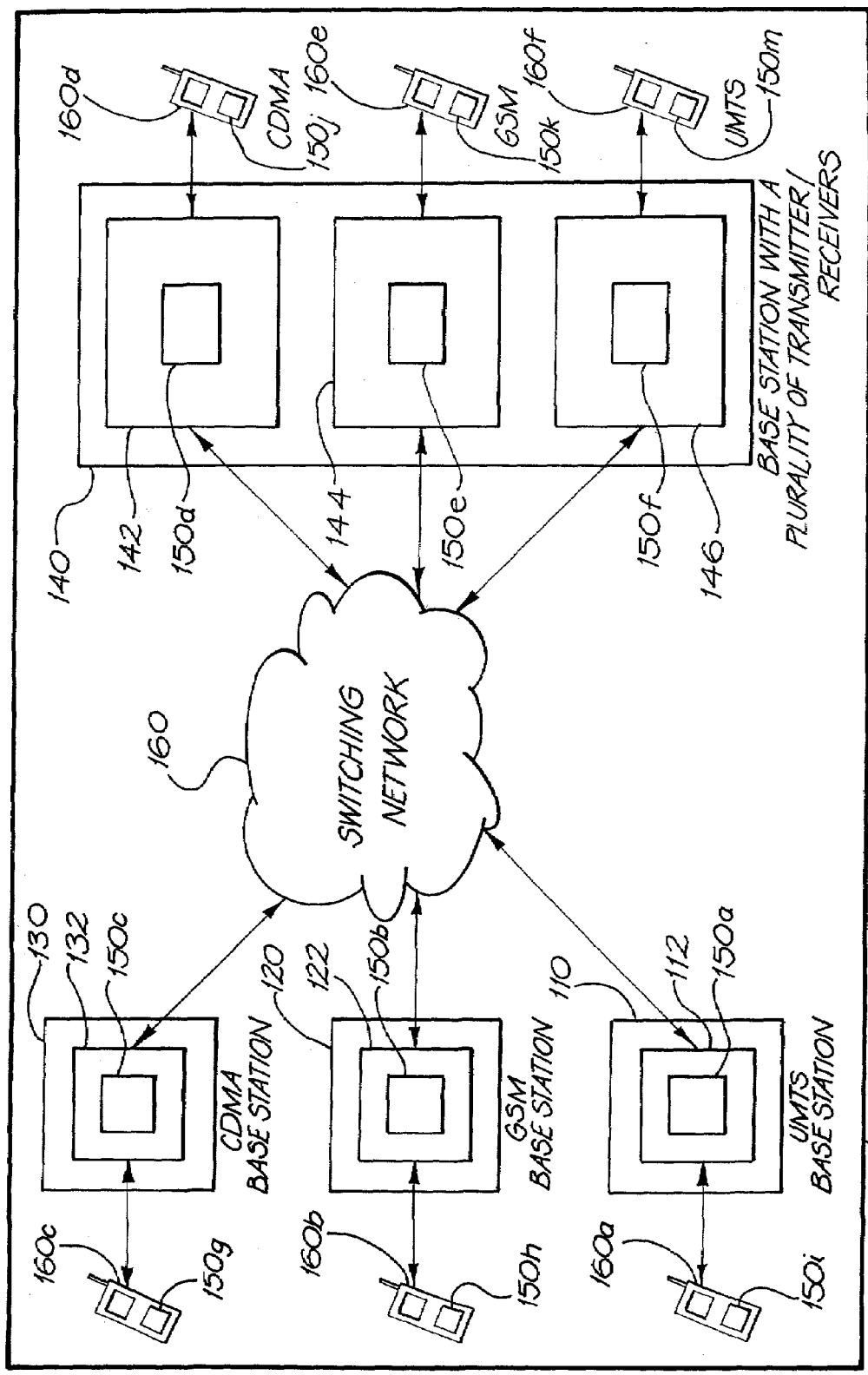
FIG. 1 is a schematic block diagram representation of a communication network employing multiple protocols.

FIG. 1 shows a wireless communication network 100. A UMTS base station 110 contains a transmitter/receiver 112, which contains a decoder module 150a. The transmitter/receiver 112 communicates via a switching network 160 with another UMTS transmitter/receiver 146 located in a remote base station 140 and containing a decoder module 150f. The transmitter/receiver 112 also communicates with a mobile handset 160a, which contains a decoder module 150i. The transmitter/receiver 146 communicates with another mobile handset 160f, which contains a decoder unit 150m.

The base station 140 contains further transmitter/receivers 142 and 144, containing decoder units 150d and 150e respectively. Transmitter/receiver 142 is configured to operate as a CDMA transmitter/receiver and communicates via the switching network 160 with remote CDMA base station 130 containing CDMA transmitter/receiver 132 and decoder unit 150c. The transmitter/receiver 142 also communicates with a mobile handset 160d, containing decoder unit 150j. The transmitter/receiver 132 communicates with a mobile handset 160c, containing decoder unit 150g.

Transmitter/receiver 144 communicates via the switching network 160 with remotely located base station 120, containing transmitter/receiver 122 and decoder unit 150b. The transmitter/receiver 144 also communicates with a mobile handset 160e, containing a decoder unit 150k. The transmitter/receiver 122 communicates with a mobile handset 160b, containing decoder unit 150h.

The decoder units 150a, 150b, 150c, 150d, 150e, 150f, 150g, 150h, 150i, 150j, 150k and 150m located in the transmitter/receivers 112, 122, 132, 142, 144 and 146 and mobile handsets 160a . . . 160f are embodiments of the unified decoder architecture, which have been configured to conform to different cellular network standards.

The unified decoder architecture of FIG. 1 offers telecommunication companies operating multiple network standards great benefits in flexibility and cost reduction as the same decoder block can be used to implement many different coding schemes in different network components.

Figure 2A:
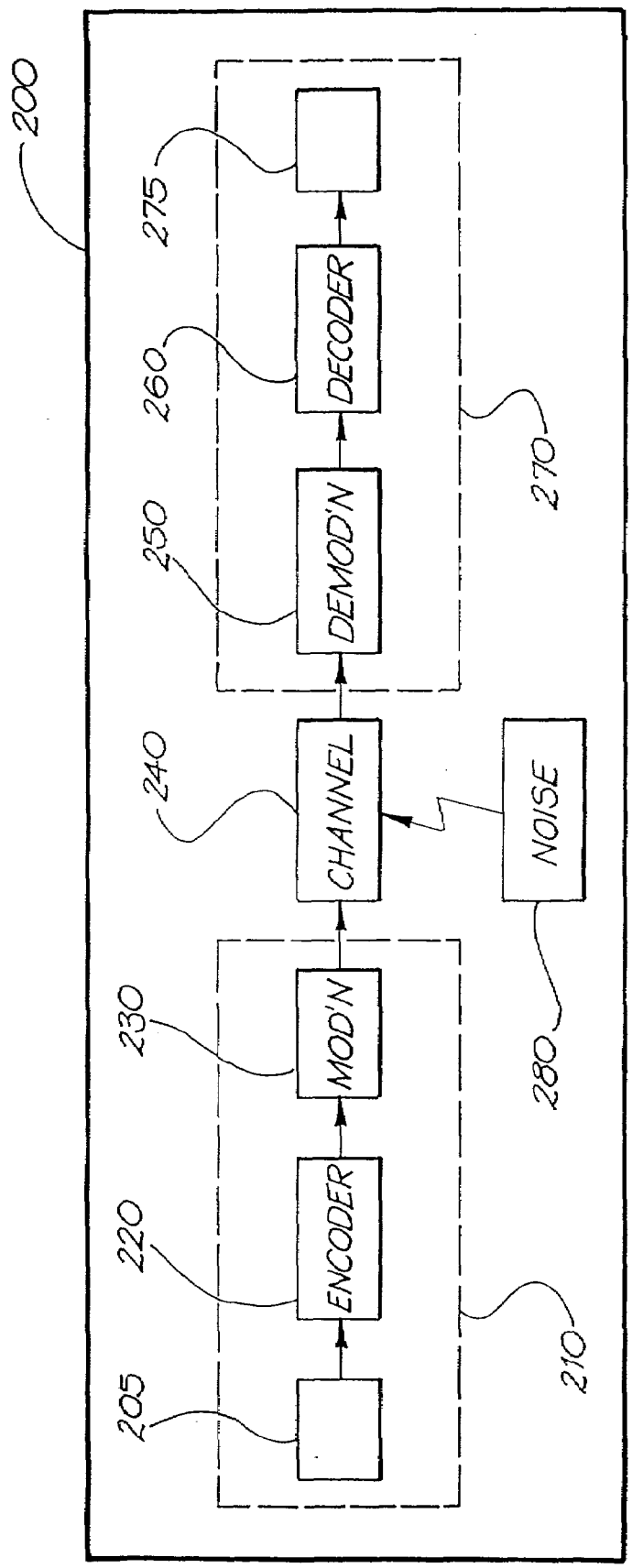
FIG. 2A is a schematic block diagram representation of a communication system employing coding.

FIG. 2A shows a typical communication system 200 in which coding is used to improve the transmission of information from a transmitter 210 to a receiver 270. The transmitter 210 has an information source 205 supplying an input data stream to an encoder 220, in which redundant information is added to the input data stream in accordance with a predefined coding algorithm so as to improve the ability to detect and correct errors which may occur during the transmission of information as a result of noise sources present in a communication channel 240. The encoded input stream is then modulated 230 to impress the encoded data stream onto a waveform to be transmitted. The encoded information is transmitted over a channel 240, which has many sources of noise 280 acting upon it. The channel 240 couples to a receiver 270 having a demodulator 250 complementing the modulator 230, the demodulator 250 producing an output to a decoder 260, which outputs a received information signal 275.

Figure 2B:
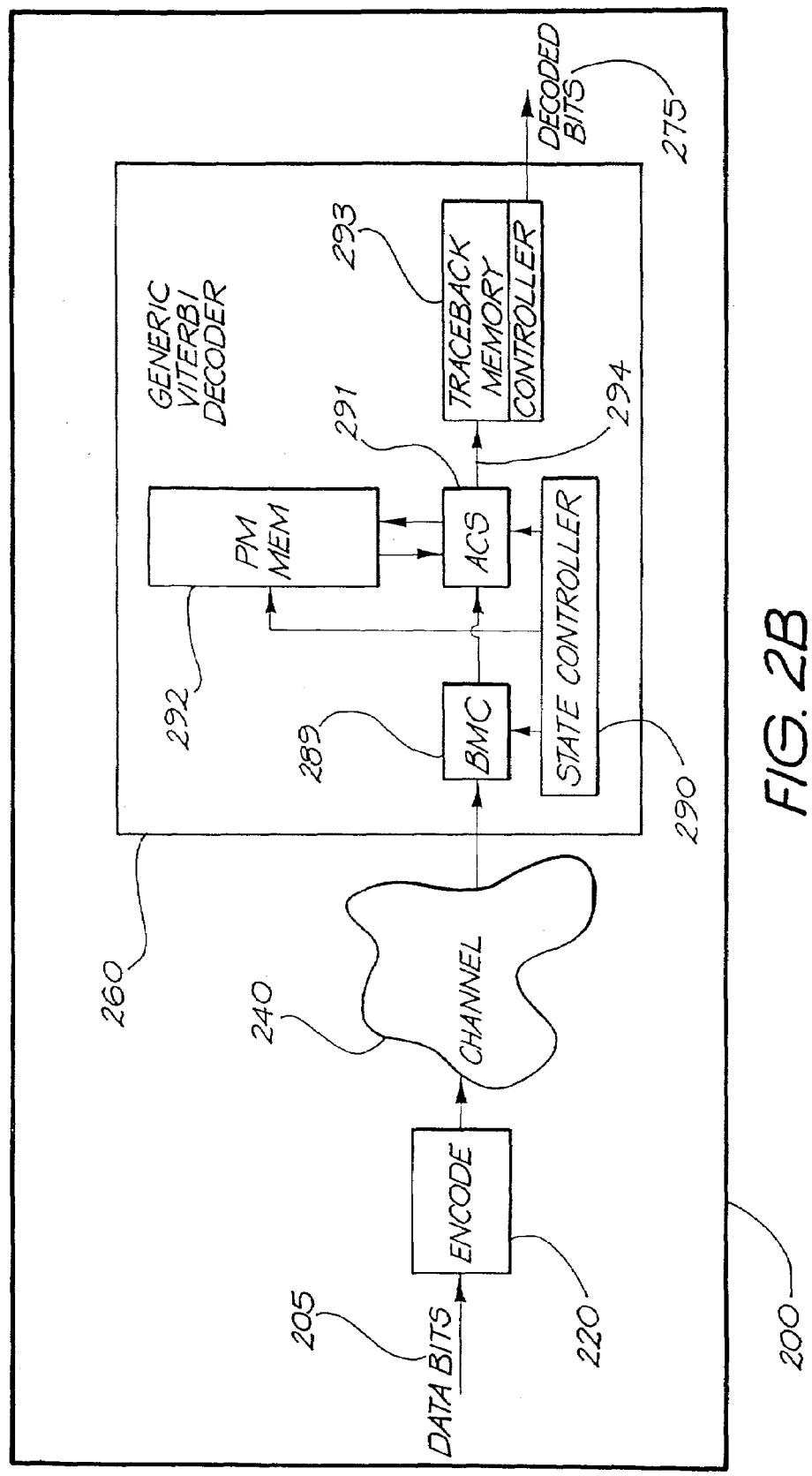
FIG. 2B is a schematic block diagram representation of a generic Viterbi decoder in a communication system employing coding.

FIG. 2B shows the communication system 200, in which the decoder 260 is a generic Viterbi decoder. The input to the Viterbi decoder 260 is coded information received from the channel 240. The Viterbi decoder includes a branch metric calculator (BMC) unit 289, whose output is presented to an add-compare-select (ACS) unit 291. A state controller 290 provides inputs to the BMC unit 289, the ACS unit 291 and a path metric memory 292. The path metric memory 292 acts as a double buffer and interchanges information with the ACS unit 291. A borrow output 294 of the ACS unit 291 is presented to a traceback memory and controller 293, whose output is the received information signal 275.

Figure 2C:
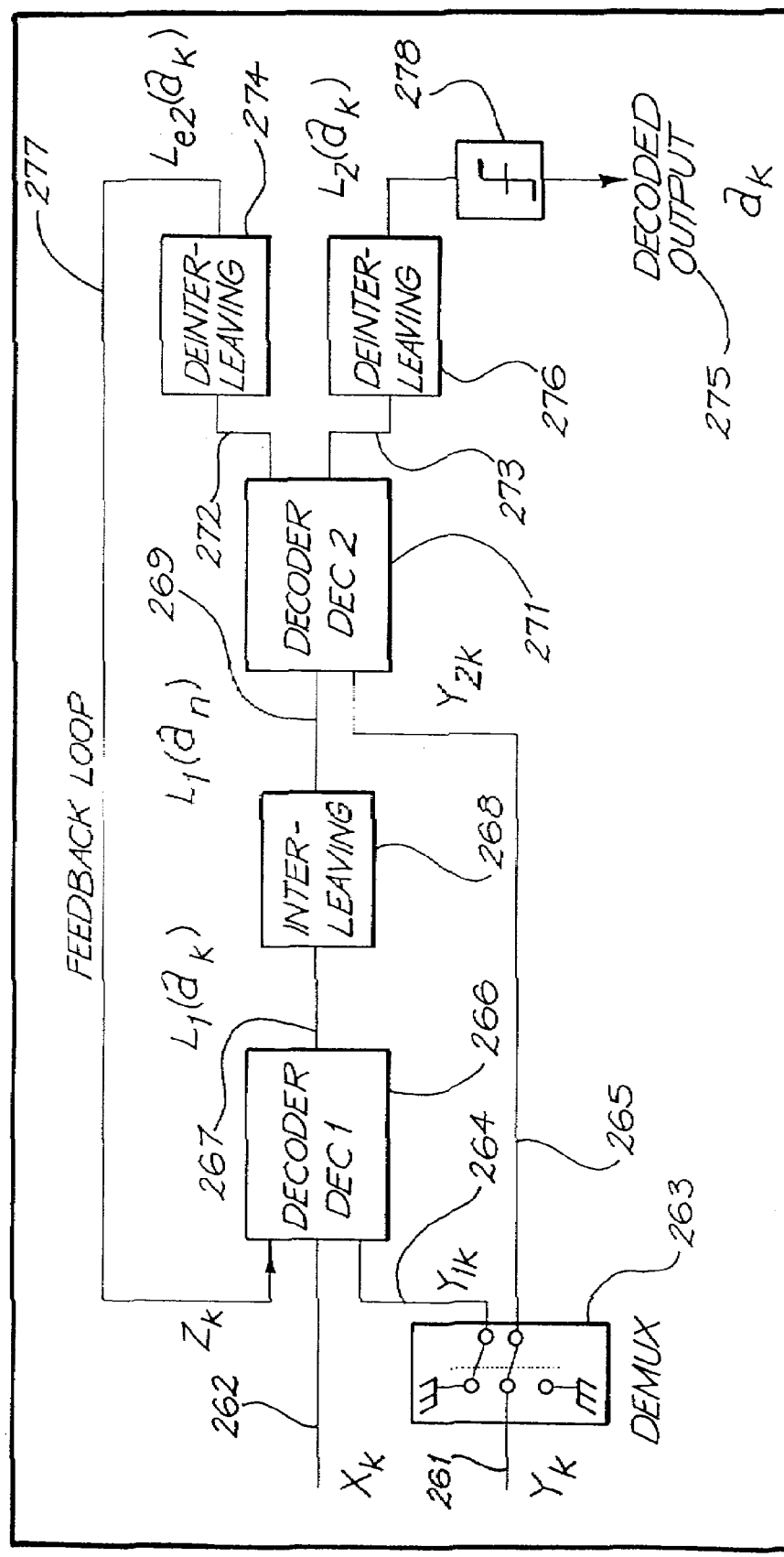
FIG. 2C is a schematic block diagram representation of a generic turbo decoder in a communication system employing coding.

FIG. 2C shows a Turbo decoding configuration of the decoder 260 of FIG. 2A. A received symbol in a turbo decoder consists of systematic data, representing the actual data being transmitted, and parity data, which represents the coded form of the data being transmitted. A first input 261, being the parity data of the received symbol, is presented to a demultiplexer 263. A first output 264 of the demultiplexer 263 is presented to a first decoder 266. A second input 262, being the systematic data of the received symbol, is presented to the first decoder 266. A recursive input 277 is also presented to the first decoder 266. The output 267 of the first decoder 266 is then presented to an interleaver 268, whose output 269 is presented to a second decoder 271. A second output 265 of the demultiplexer 263 is also presented to the second decoder 271. A first output 272 of the second decoder 271 is presented to a first deinterleaver 274, whose output is the recursive input 277. A second output 273 of the second decoder 271 is presented to a second deinterleaver 276. The output of the second deinterleaver 276 is presented to a slicer 278, which applies a threshold to a soft output to convert it to a hard output, being a received information signal 275.

The unified decoder architecture of the preferred embodiment is intended to replace the decoder 260 in wireless communication systems having both voice and data capabilities and exploits the similarity in the computations needed for Viterbi decoding and LOG-MAP Turbo decoding so that memory and processing units are used efficiently when configured for either of such schemes. LogMAP is an algorithm which may be utilised in the decoding of convolutional codes. LogMAP is also used in one half cycle of a turbo decode iteration. Processors within the preferred embodiment are stacked together and interconnected using a hierarchical switching structure so that they can perform independently as separate decoders or, alternatively, they may be combined to form a single high speed decoder, with a predetermined processor being dominant.

Figure 3:
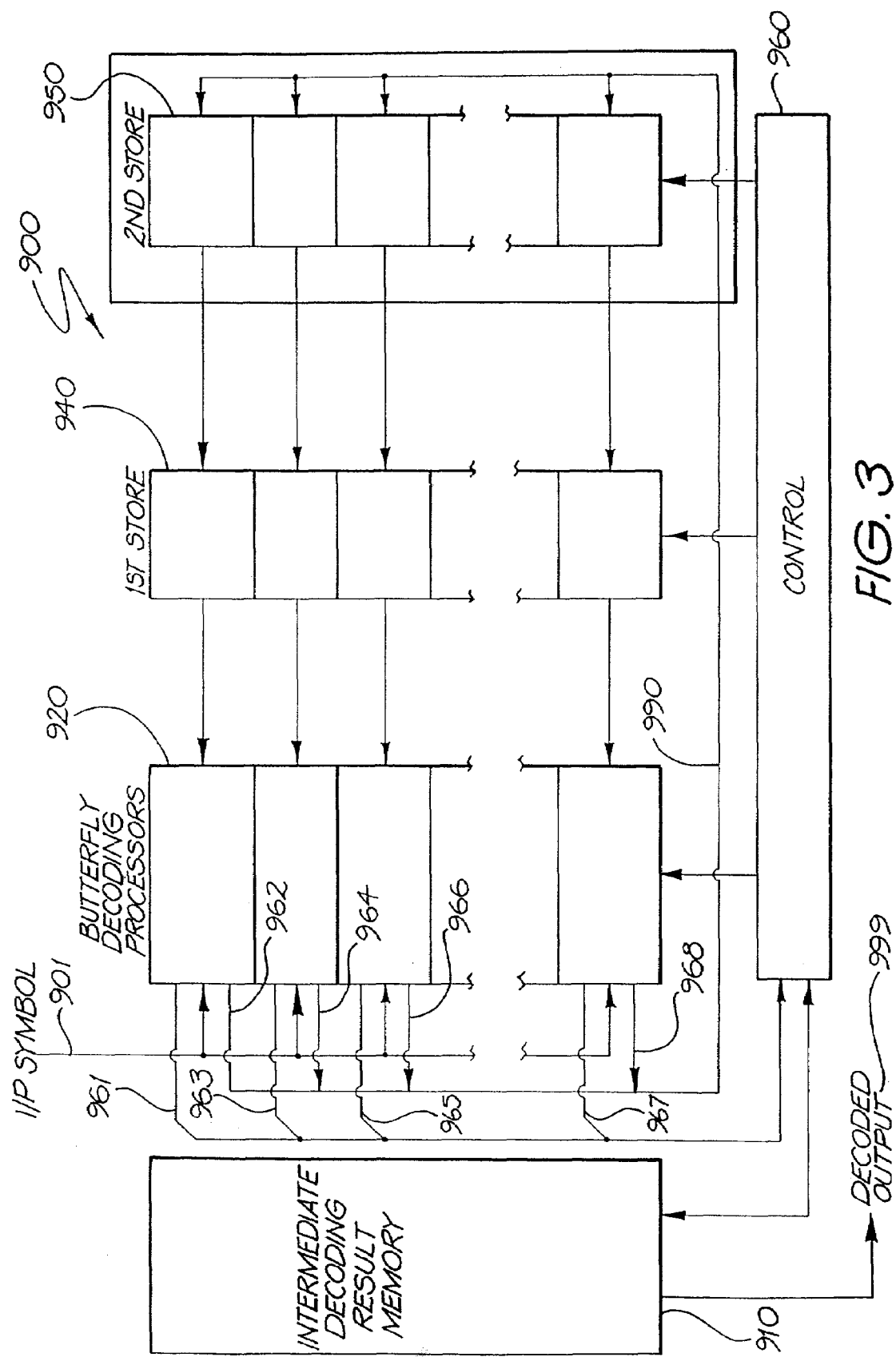
FIG. 3 is a schematic block diagram representation of a unified decoder.

FIG. 3 shows the block architecture of a unified decoder structure 900 in accordance with an embodiment of the present invention. A multi-bit input symbol 901 from an alphabet of a prior agreed coding scheme for a particular transmission is broadcast to a bank of butterfly decoding processors 920. The bank of butterfly decoding processors 920 also receives as inputs the outputs of a bank of first stores 940. A control unit 960 provides inputs to each of an intermediate decoding result memory 910, the bank of butterfly decoding processors 920, the bank of first stores 940 and a bank of a second stores 950. The control unit 960 issues appropriate control signals via the inputs to implement convolutional or turbo coding, as desired.

The embodiment depicted in FIG. 3 is that of a single row decoder. When multiple decoder rows are interconnected to form a single decoder, each of the decoder rows in the single decoder is presented with the same multi-bit input symbol 901. When multiple decoder rows are acting as multiple decoders, each decoder being implemented is presented with a separate multi-bit input symbol 901.

The bank of butterfly decoding processors 920 produces first outputs 962, 964, 966 and 968, which are transmitted via a bus 990 to the bank of second stores 950. Outputs of the bank of second stores 950 are presented as inputs to the bank of first stores 940. A generic embodiment of the decoder typically uses a bank of first stores 940 and a bank of second stores 950 in a double buffering mode.

The bank of butterfly decoding processors 920 produces second outputs 961, 963, 965 and 967, which are intermediate decoding results presented to the control unit 960.

The bank of butterfly decoding processors 920 and the loop feedback connection via at least one of the stores form a loop functioning as a trellis processor.

The intermediate decoding result memory 910 produces a decoded output 999. The intermediate decoding result memory 910 may provide recursive results to the control unit 960 when computing a LogMAP algorithm, as described later.

FIG. 4 shows the block architecture of a unified decoder 1200 in accordance with a preferred embodiment of the present invention. A control unit 1210 of the unified decoder 1200 receives a number of inputs, including rate 1201, constraint length 1202, convolutional or turbo selector 1203, polynomials 1204, trellis direction 1205, number of iterations 1206, block length 1207, clock 1208 and reset 1209. The rate 1201 indicates how much information is used to represent a single data bit present in a transmitted block. The constraint length 1202 indicates how many previous input symbols are used to encode a presented input information bit and is, thus, also an indicator of the complexity of the trellis being processed to decode a given input symbol. The polynomials 1204 are generator polynomial coefficients used in the decoding process. The number of iterations 1206 determines how many loops are executed by the decoder 1200 when operating in turbo mode. A larger value for the number of iterations 2106 indicates a more accurate decoded output 1294 at the cost of increased computational time.

The control unit 1210 is interconnected to an Intermediate Decoding Memory and Processor 1240, LogLikelihood Processors 1250a and 1250b, a bank of multiplexers 1250c, a Comparator 1247, Butterfly Decoding Processors 1260, a Reverse Address Processor 1270, Normalisation Subtractors 1278, a bank of multiplexers 1278a, a Path Metric Store 1280, a Forward Address Processor 1290, a LogLikelihood Ratio Processor 1297 and an Input Symbol History 1298. The Control unit 1210 is able to reconfigure the architecture of the unified decoder 1200 via these connections to implement either a convolutional decoder or a turbo decoder, as desired.

Input symbols 1299 are presented to an Input Symbol History 1298, which functions as a double buffer to ensure that a constant data flow is maintained. The Input Symbol History 1298 also receives an Input Symbol History Bank Select 1211, an Input Symbol History Address 1219, an Input Symbol History Clock 1223 and an Input Symbol History Reset 1225 from the control unit 1210. The Input Symbol History 1298 produces a first output 1291a, which is presented to Butterfly Decoding Processors 1260, and a second output 1291b, which is presented to LogLikelihood Processor 1250a.

The Butterfly Decoding Processors 1260 also receive as inputs reverse trellis path metrics 1265 from the Reverse Address Processor 1270, and extrinsic information 1242 from the Intermediate Decoding Memory and Processor 1240. The control unit 1210 also provides a number of inputs to the Butterfly Decoding Processors 1260, including a Butterfly Reset 1215, Butterfly Rate 1216, Butterfly Clock 1217, Butterfly Polynomials 1218, Butterfly Constraint 1220, Butterfly Mode 1221 and beta-phase enable 1235.

The Butterfly Decoding Processors 1260 produce new multiple bit path metrics for a corresponding state in a trellis diagram, the new path metrics being output on the 32 bit buses 1266 and 1267, which are connected to a Comparator 1247 and a bank of multiplexers 1250c. The Butterfly Decoding Processors 1260 also produce decision bits 1255, which are presented as inputs to the Intermediate Decoding Memory and Processor 1240.

In a first phase of a LogMAP computation, the Butterfly Decoding Processors 1260 compute gammas and alphas. In a second phase, the Butterfly Decoding Processors 1260 calculate betas using dummy betas computed by LogLikelihood Processor 1250a and LogLikelihood Processor 1250b in the first phase.

Figure 5A:
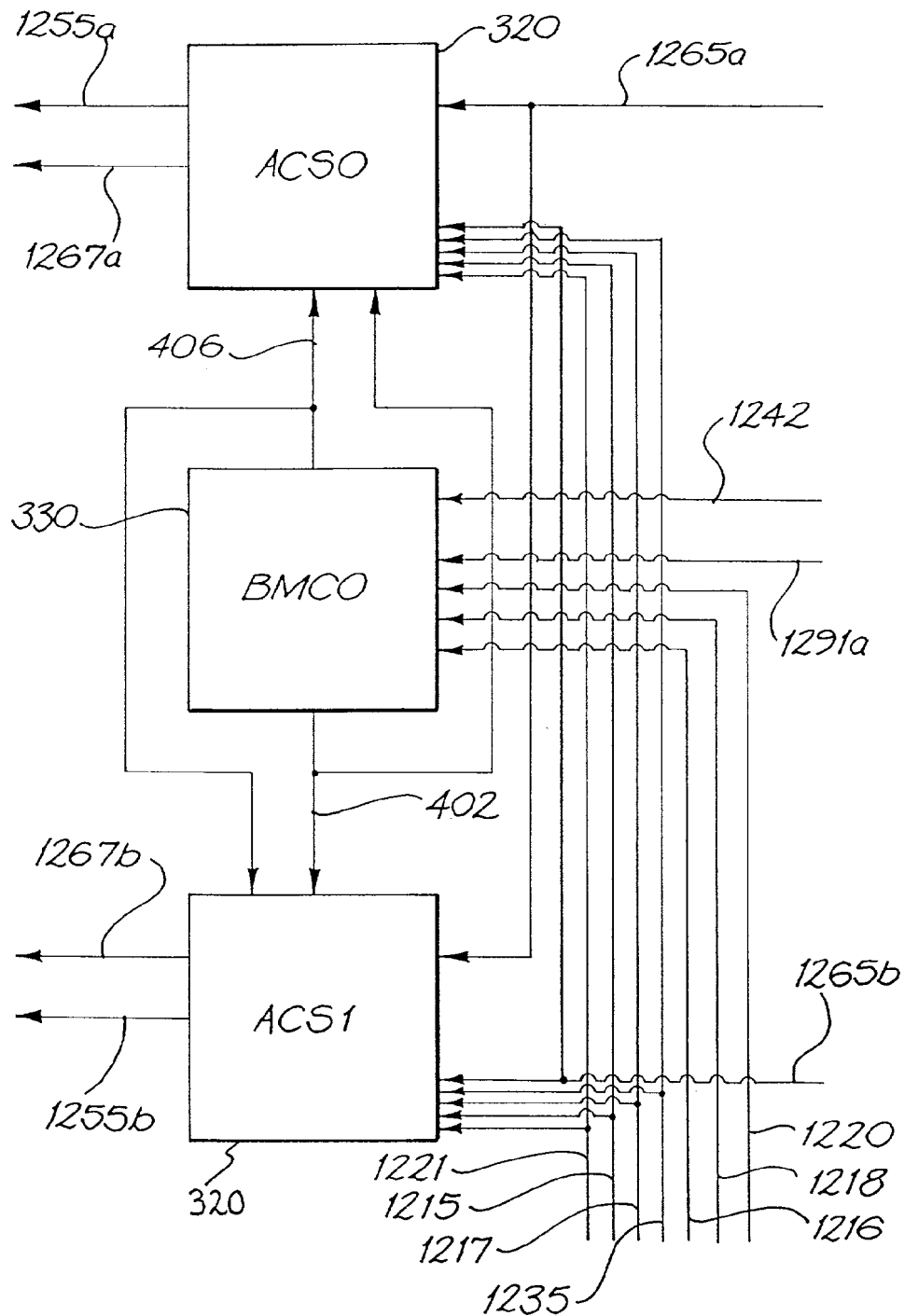
FIG. 5A is a schematic block diagram representation of a butterfly processor of FIG. 4.

Each butterfly processor within the bank of butterfly processor 1260 contains two Add-Compare-Select units (shown as ACS) 320 and an intermediary Branch-Metric Calculator (BMC) 330, as depicted in FIG. 5A. The BMC 330 executes the same functions as the Branch Metric Units (BMUs) in well-known Viterbi decoders and each ACS 320 performs path metric calculation for trellis decoding.

FIG. 5A shows an exemplary butterfly unit of the butterfly processors 1260 of FIG. 4, having two Add-Compare-Select units 320 and an intermediary Branch-Metric calculator 330. Each of the Add-Compare-Select units 320 is presented with input path metric-0 1265a and input path metric-1 1265b. The Input Symbol 1291a and extrinsic information 1242 are broadcast to each of the Branch Metric Calculators 330 in the bank of butterfly processors 1260. The intermediary Branch-Metric calculator is also presented with a butterfly rate 1216, a butterfly constraint 1220 and butterfly polynomials 1218.

Each state in a column of a trellis has a pair of branch metrics leading to it. Each of the individual branch metrics has a symbol associated with it. Therefore, when navigating a trellis in a given direction, one of two possible symbols is expected for a state under consideration, depending on the previous states. The BMC 330 determines a measure of the proximity of the received input symbol 1291a to an expected symbol. The BMC 330 generates an output branch metric-0 406, which is presented to a first ACS unit-0 320 and a second ACS unit-1 320 on a bus being m bits wide. The BMC 330 exploits the symmetry of the trellis and produces a second branch metric-1 402, by arithmetically inverting the branch metric-0 406. The branch metric-1 402 is presented to the first ACS unit-0 320 and the second ACS unit-1 320 on a bus which is also m bits wide. A butterfly mode 1221 is presented to each of the ACS units 320 to configure them appropriately for the coding scheme in use. The ACS units 320 and the BMC unit 330 also receive a butterfly reset 1215, a butterfly clock 1217 and a beta-phase enable 1235.

Each of the ACS units 320 generates two outputs which, for ACS 0 in FIG. 5A, consist of a first output 1255a and a second output 1267*a*. The first output 1255*a* is a decision bit which is the value of the comparison borrow bit, indicating which of the upper or lower potential path metrics is selected. A decision bit with a value of 0 corresponds to the lower potential path metric being selected, whereas conversely a value of 1 corresponds to the upper potential path metric being selected. The second output 1267*a* is a new multiple bit path metric for a corresponding state in a trellis diagram. ACS 1 produces corresponding outputs 1255*b* and 1267*b*.

Figure 5B:
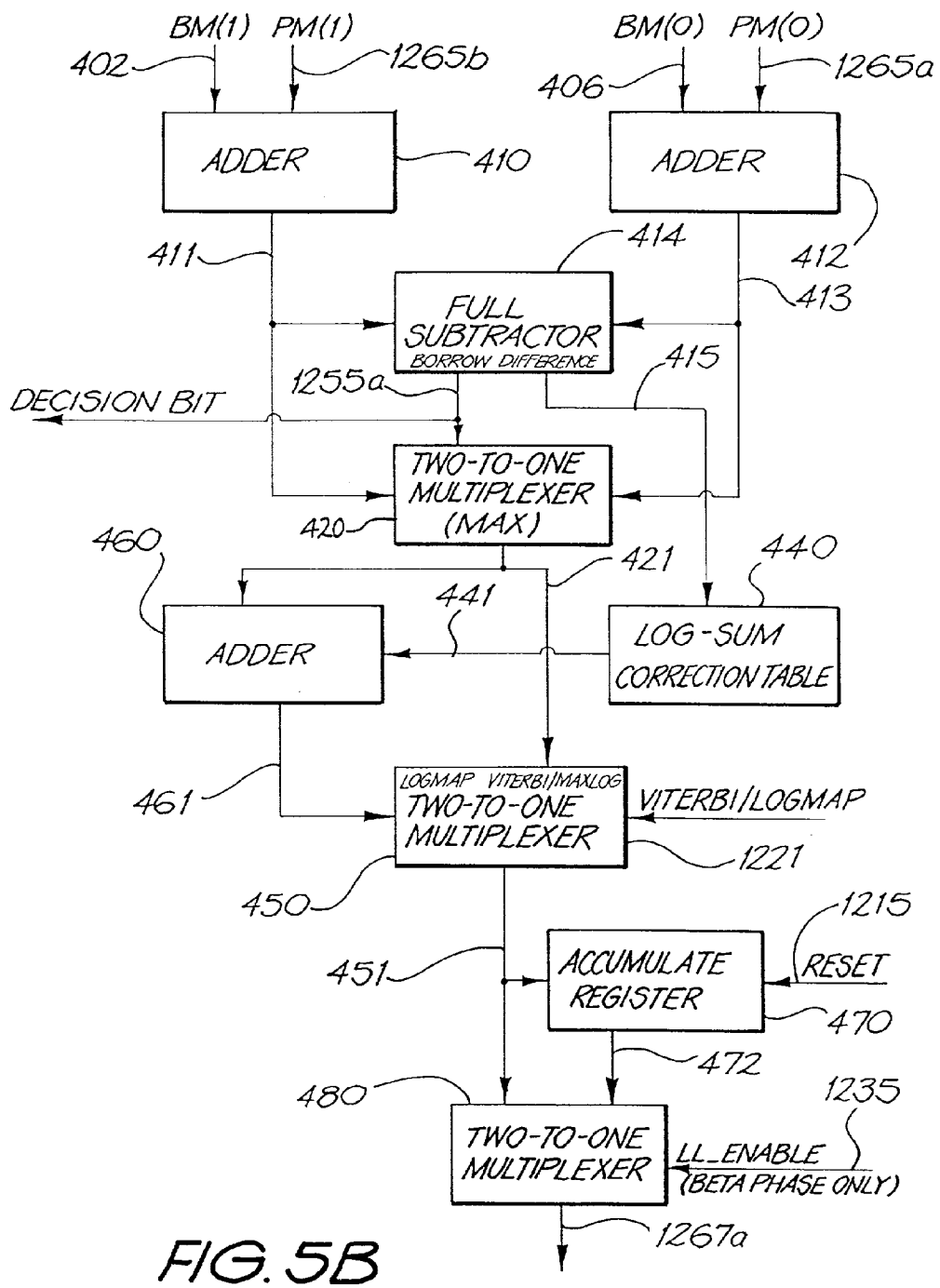
FIG. 5B is a schematic block diagram representation of an Add-Compare-Select (ACS) unit of FIG. 4.

FIG. 5B shows an architecture of an ACS unit-0 320 of FIG. 5A. Two pairs of inputs 402 and 1265*b*, and 406 and 1265*a* are presented to respective Adders 410 and 412. The first pair of inputs consists of the branch metric-1 402 and path metric-1 1265*b*, whereas the second pair of inputs consists of branch metric-0 406 and path metric-0 1265*a*. The constituent elements of each of the input pairs are added in respective adders 410 and 412, the corresponding outputs 411 and 413 of the adders 410 and 412 being presented to a Full Subtractor 414. The outputs 411 and 413 are also presented to a first two-to-one multiplexer 420. A borrow output 1255*a* of the Full Subtractor 414 is fed to the first multiplexer 420 to compute a maximum MAX of the input values. The borrow bit 1255*a* is also presented as an output of the ACS unit 320, with a value of 0 indicating that the lower path metric has been chosen and a value of 1 indicating that the upper path metric has been selected. A second output 415 of the Full Subtractor 414, representing the difference of the two adder results 411 and 413, is presented to a Log-sum correction table 440, which adjusts the result of the new path metric, when the output of the Full Subtractor 414 is small, to produce a more accurate result in the Log domain for LogMAP decoding. An output 441 of the Log-sum correction table 440 is presented to an Adder 460. An output 421 of the first multiplexer 420 is presented to the Adder 460 and to a second two-to-one multiplexer 450. A result 461 from the Adder 460 is then presented as a second input to the second multiplexer 450. A control signal, being butterfly mode 1221, is also presented as an input to the second multiplexer 450 and is used to determine whether the Viterbi or LogMAP coding scheme is being implemented. The second multiplexer 450 forms an output 451, which feeds an Accumulate Register 470 and a further multiplexer 480. The Accumulate Register 470 receives a butterfly reset 1215 and produces an output 472 to the multiplexer 480. The multiplexer 480 receives a beta-phase enable 1235 as a select signal that selects the output 451 when inactive and the output 472 from the Accumulate register 470 when active. The selected output of the multiplexer 480 is the output path metric 1267*a* of the ACS unit 320.

The bank of multiplexers 1250*c* receives a select signal 1258 from the control unit 1210, which is used to select either the butterfly path metrics 1266 and 1267 output from the Butterfly Processors 1260 or the path metrics produced by the LogLikelihood Processor-0 1250*a* and LogLikelihood Processor-1 1250*b*. During a Viterbi calculation, the butterfly path metrics 1266 and 1267 are selected. In the first phase of a LogMAP computation, butterfly path metrics 1266 and 1267 are chosen whilst the Butterfly Decoding Processors 1260 compute gammas and alphas. Contemporaneously, LogLikelihood Processor 1250*a* calculates dummy betas. At the end of the first phase, the path metrics produced by the LogLikelihood Processor-0 1250*a* are selected by the bank of multiplexers 1250*c* to be broadcast to enable the calculation of betas in the second phase of the LogMAP computation.

The bank of multiplexers 1250*c* outputs new path metrics on Lower Path Metric Bus 1295 and Upper Path Metric Bus 1296. The buses 1295 and 1296 are connected to LogLikelihood processors 1250*a* and 1250*b*, a bank of multiplexers 1278*a* and a Forward Address Processor 1290.

The Forward Address Processor 1290 receives a Forward Trellis Select 1232, a Forward Trellis Hold 1234, a Forward Trellis Transparent Bit 1236 and a Path Metric Input MUX Select 1238 from the control unit 1210, which are used to configure the Forward Address Processor 1290 in accordance with whether the unified decoder 1200 is being used to navigate a trellis in the forward or reverse direction.

The Forward Address Processor 1290 orders the new path metrics received on buses 1295 and 1296 such that an apparently sequential list of path metrics is presented to the butterfly processor 1260 for computation of the next column of the trellis, when the trellis is being navigated in the forward direction. When a trellis is being navigated in the reverse direction, the Forward Address Processor 1290 acts transparently.

The Path Metric Store 1280 receives addressing information ADDR0 1228*a* and ADDR1 1228*b*, Path Metric Reset 1230 and Path Metric Read/Write Clock 1231 from the control unit 1210, in addition to forward trellis path metrics 1285, which are output from the Forward Address Processor 1290. The Path Metric Store 1280 outputs stored path metrics 1276 to a bank of multiplexers 1278*a* and to LogLikelihood Processors 1250*a* and 1250*b*.

The bank of multiplexers 1278*a* is used as an interconnect point for multiple decoder row configurations, and receives stored path metrics 1276, a control signal 1278*b* from the control unit 1210, and new path metrics on buses 1295 and 1296. The bank of multiplexers 1278*a* allows the initialisation of the beta computation during LogMAP calculation and produces an output 1277 to Normalisation Subtractors 1278.

A comparator 1247 receives the butterfly path metrics output on buses 1266 and 1267 from the Butterfly Decoding Processors 1260 and determines a maximum new path metric. This maximum new path metric is then compared with a stored maximum path metric and the greater of the two values is presented as normalising output 1246, which is sent to the Normalisation Subtractors 1278 and the Intermediate Decoding Memory and Processor 1240.

The Normalisation Subtractors 1278 receive the output 1277 from the bank of multiplexers 1278*a* and subtract the Normalising Output 1246 to ensure that the path metrics are contained within the dynamic range of the architecture. The normalised path metrics 1275 are output and presented to a Reverse Address Processor 1270 and LogLikelihood Processors 1250*a* and 1250*b*. The Reverse Address Processor 1270 also receives as inputs LogLikelihood Enable 1214, LogLikelihood 0 Enable 1203$_0$ and LogLikelihood 1 Enable 1203$_1$, Reverse Trellis Select 1222, a Reverse Trellis Hold 1224 and a Reverse Trellis Transparent Bit 1226 from the control unit 1210. The inputs from the control unit 1210 are used to configure the Reverse Address Processor 1270 appropriately, depending on whether the decoder 1200 is traversing a trellis in the forward or reverse direction. The output of the Reverse Address Processor 1270 is presented as reverse trellis path metrics 1265 to the Butterfly Decoding Processors 1260.

The Reverse Address Processor 1270 orders the normalised path metrics such that a desired sequence of path metrics is presented to the butterfly processor 1260 for computation of the next column of the trellis, when the trellis is being navigated in the reverse direction. When the trellis is being navigated in the forward direction, the Reverse Address Processor 1270 acts transparently.

The LogLikelihood Processor 1250a receives a LogLikelihood Mode 1214a, reverse trellis hold 1224a, reverse trellis transparent bit 1226a, a LogLikelihood rate 1248a, a LogLikelihood constraint 1249a, a LogLikelihood clock 1251a, a LogLikelihood reset 1252a, LogLikelihood polynomials 1253a, LogLikelihood 0 Enable 1203$a_0$, LogLikelihood Enable 1203$a_1$, reverse trellis select 1222a, and select signal 1258a from the control unit 1210. The LogLikelihood Processor 1250a also receives as inputs the normalised path metrics 1275, the output 1291b from the Input Symbol History 1298, stored path metrics 1276, new path metrics on buses 1296 and 1295 and interleaver extrinsic information 1256. The LogLikelihood processor 1250a produces a first output 1245a, which is presented to a LogLikelihood Ratio Processor 1297. The LogLikelihood processor 1250a also presents inputs 1266' and 1267' to the bank of multiplexers 1250c.

A second LogLikelihood processor 1250b receives corresponding inputs 1214b, 1224b, 1226b, 1248b, 1249b, 1251b, 1252b, 1253b, 1203$b_0$. 1203$b_1$, 1222b and from the control unit 1210. The LogLikelihood Processor 1250b also receives as inputs the normalised path metrics 1275, stored path metrics 1276, interleaver extrinsic information 1256 and the new path metrics on buses 1296 and 1295. The LogLikelihood processor 1250b produces an output 1245b, which is presented to the LogLikelihood Ratio Processor 1297.

The LogLikelihood Processor 1250a is used to compute dummy betas in the first phase of a LogMAP calculation. In the second phase of the LogMAP calculation, LogLikelihood Processors 1250a and 1250b are used in conjunction with the Butterfly Decoding Processors 1260 to create a LogLikelihood result for a "1" and a "0", respectively.

The Intermediate Decoding Memory and Processor 1240 acts as a buffer for producing output during a Viterbi computation. During a LogMAP computation, the Intermediate Decoding Memory and Processor 1240 acts as an extended store for the path metric store 1280. The Intermediate Decoding Memory and Processor 1240 receives an Intermediate Decoding Mode 1212, an Intermediate Decoding Direction 1237, a Spreading Input 1243, read/write clock 1257, a reset 1259 and a clocking signal 1254 from the control unit 1210. The Intermediate Decoding Memory and Processor 1240 also receives the Normalising Output 1246 and Decision Bits 1255. The Intermediate Decoding Memory and Processor 1240 produces extrinsic information 1242 and Traceback processor output 1567 to the LogLikelihood Ratio Processor 1297, and receives an input 1293 from the LogLikelihood Ratio Processor 1297. The Intermediate Decoding Memory and Processor 1240 also produces interleaver extrinsic information 1256 to LogLikelihood Processors 1250a and 1250b.

The LogLikelihood Ratio Processor 1297 receives a Hard or Soft Output Select 1213 and Spreading Input 1243 from the control unit 1210 in addition to the outputs 1245a and 1245b from the LogLikelihood Processors 1250a and 1250b. The LogLikelihood Ratio Processor 1297 also receives as inputs the extrinsic information 1242 of the Intermediate Decoding Memory and Processor 1240 and Scramble Address Data 1286. The LogLikelihood Ratio Processor 1297 then produces a Decoded Output 1294 and an output 1293 to the Intermediate Decoding Memory and Processor 1240.

The outputs 1245a and 1245b represent the probability of the decoded output being a "1" or a "0", respectively. The LogLikelihood Ratio Processor 1297 performs a subtraction of the outputs 1245a and 1245b in the log domain, which is equivalent to performing a division in the natural number domain. The result of the subtraction provides the Decoded Output 1294. The LogLikelihood Ratio Processor 1297 also subtracts the outputs 1245a and 1245b and the extrinsic information 1242 to produce the output 1293, which represents new extrinsic information.

Figure 6A:
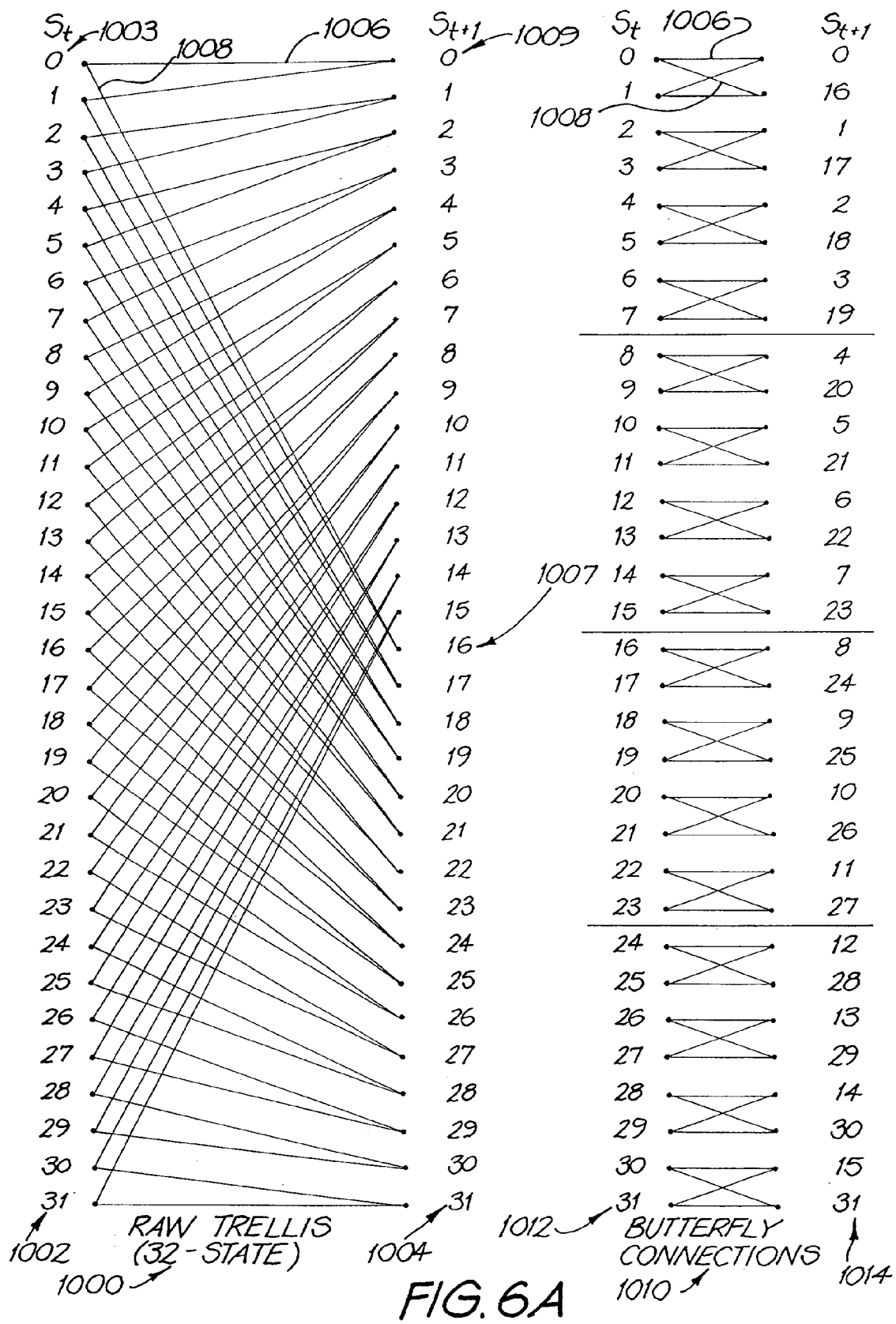
FIG. 6A is a representation of a 32-state trellis and its corresponding butterfly processors and path metrics.

A code of maximum constraint length k produces a trellis diagram with $2^k$-states. FIG. 6A shows a 32-state raw trellis diagram 1000, corresponding to a code having a maximum constraint length of 6. Each of the 32 states 1002 at time $S_t$ has two possible branch metrics mapping to one of 32 states 1004 at time $S_{t+1}$. For example state 0 1003 at time $S_t$ has branch metrics 1006 and 1008 leading to state 0 1009 and state 16 1007 at time $S_{t+1}$.

The 32-state raw trellis diagram 1000 may be represented by 16 corresponding butterfly connections 1010 of the same trellis. It can be seen that pairs of states in one column 1012 of the trellis map to corresponding pairs of states in another column 1014 of the trellis. The trellis states 1014 at time $S_{t+1}$ represent resultant path metrics. Each of the butterfly connections 1010 may be processed by a single butterfly processor 1260. In accordance with a preferred embodiment of the invention, as shown in FIG. 4, four butterfly processors 1260 are provided. This allows 8 resultant path metric locations to be calculated in each clock cycle.

Figure 6B:
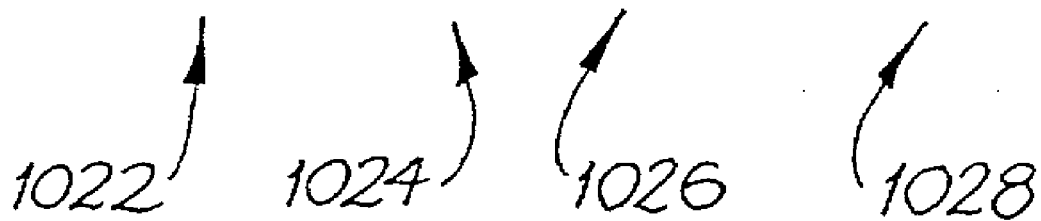
FIG. 6B shows the resultant path metric locations.

FIG. 6B shows the resultant path metric locations 1014 for a 32-state trellis diagram. The 32 resultant path metric locations have been ordered into four columns 1022, 1024, 1026 and 1028, each of which contains eight resultant path metric locations produced by four butterfly processors.

Figure 7A:
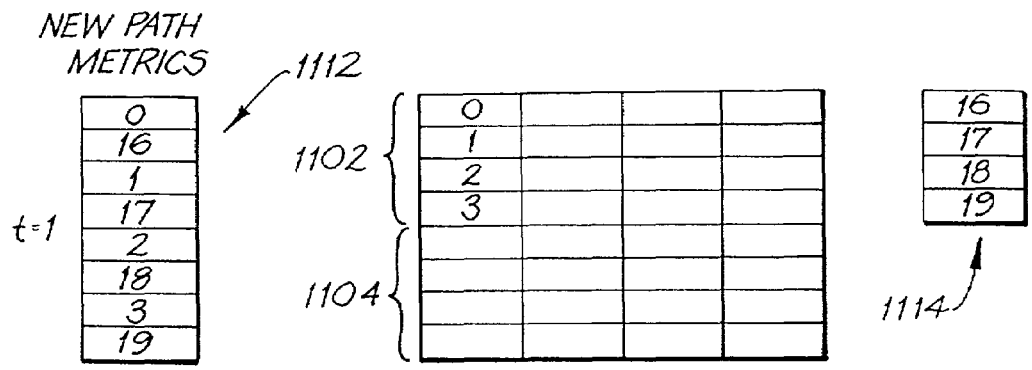
FIGS. 7A–7E are representations of the in-place path metric addressing at times t=1 to t=5 respectively.

A trellis operation incorporates several sub-trellis operations, each of which corresponds to a single clock cycle. FIGS. 7A, 7B, 7C, 7D and 7E show the process by which a preferred embodiment of the invention implements in-place path metric addressing. FIG. 7A shows time t=1, corresponding to the first sub-trellis operation, in which eight new path metrics 1112 are presented as inputs. New path metrics 1112 representing 0, 1, 2 and 3 are written into a first column of memory 1102, corresponding to upper memory blocks B0 of Path Metric Store 1280, whilst path metrics 16, 17, 18 and 19 are written into four holding registers 1114. Path metrics 16, 17, 18 and 19 are held for a clock cycle before being written to memory, as the memory locations to which they will be written will not become available until the next clock cycle when the new path metrics for trellis states 8 to 15 have been calculated.

Figure 7B:
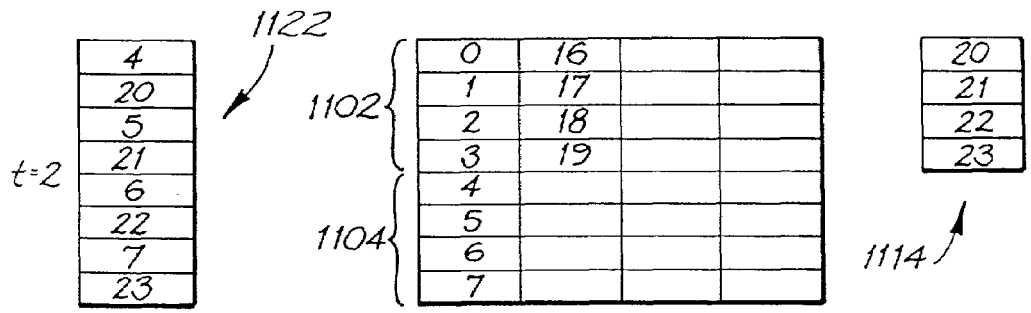

In the next clock cycle t=2, shown in FIG. 7B, a further eight new path metrics 1122 are presented as inputs. The path metrics 1122 corresponding to new path metric locations 4, 5, 6 and 7 are written into a first column of memory 1104, corresponding to lower memory blocks B1 of Path Metric Store 1280. The contents of the holding registers 1114 are written into a second column of memory 1102, corresponding to Path Metric Store 1280 B0 and the new path metrics corresponding to path metric locations 20, 21, 22 and 23 are written in as the new contents of the holding registers 1114.

Figure 7C:
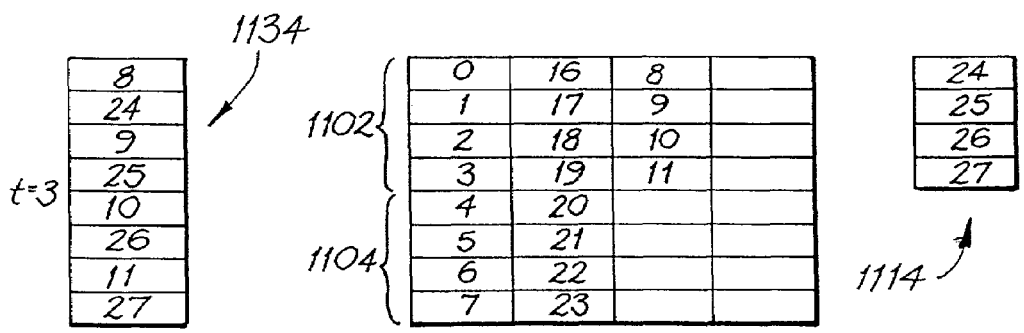

In the third clock cycle shown in FIG. 7C, a further group of new path metrics 1134 is presented. The new path metrics corresponding to states 8, 9, 10 and 11 are written into a third column of memory 1102, corresponding to Path Metric Store 1280 B0 and the contents of the holding registers 1114, being states 20, 21, 22 and 23, are written into a second column of a memory 1104, corresponding to Path Metric Store 1280 B1. The four new path metrics corresponding to states 24, 25, 26 and 27 are written into the holding registers 1114.

Figure 7D:
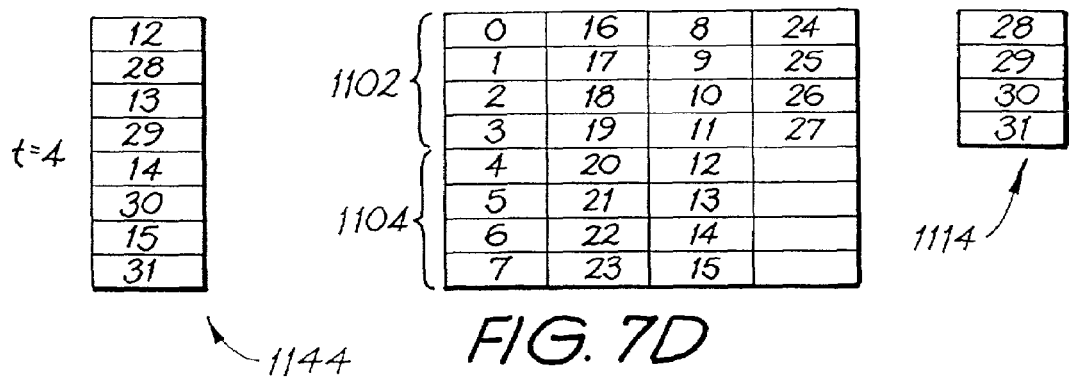

FIG. 7D shows the fourth clock cycle, during which the final eight new path metrics 1144 are presented. The new path metrics corresponding to states 12, 13, 14 and 15 are written to a third column of memory 1104, corresponding to Path Metric Store 1280 B1, the contents of the holding register corresponding to states 24, 25, 26 and 27 are written to a fourth column of memory 1102, corresponding to Path Metric Store 1280 B0, and the new path metrics corresponding to states 28, 29, 30 and 31 are written to holding registers 1114.

Figure 7E:
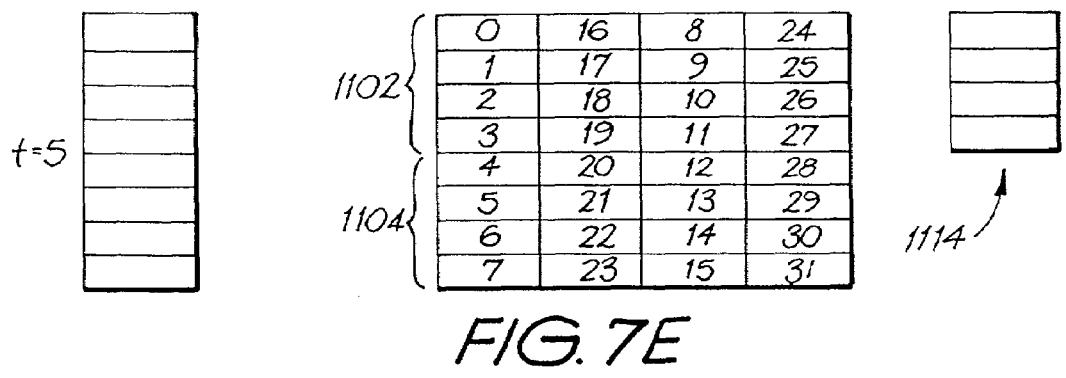

An additional clock cycle corresponding to t=5, as shown in FIG. 7E, is required to write the contents of the holding registers 1114 into a fourth column of memory 1104, corresponding to Path Metric Store 1280 B1.

Figure 7F:
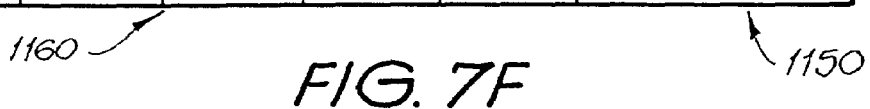
FIG. 7F is a representation of the addressing of the path metric columns.

FIG. 7F shows a representation of the addressing of the path metric columns for a 32-state trellis in accordance with a preferred embodiment of the present invention. The addressing sequence of the path metric columns 1150 corresponds to the read/write addresses of the path metric columns. Each row of the table 1160 corresponds to a different column of a trellis diagram, representing Symbol time n ($S_n$), Symbol time n+1 ($S_{n+1}$) and Symbol time n+2 ($S_{n+2}$). It is evident that the movement of the addresses of the path metric columns is periodic.

FIGS. 7A–E have shown the progression from $S_n$ to $S_{n+1}$. The next clock cycle, t=6, will begin the transition from $S_{n+1}$ to $S_{n+2}$ and columns 0, 2, 1, 3 will be executed in order to present a sequential list of states to the ACS units.

FIGS. 8A, 8B, 8C, 8D, 8E and 8F show the process by which a preferred embodiment of the invention implements in-place path metric addressing during navigation of a reverse trellis. FIG. 8A depicts the notation that will be followed in FIGS. 8B–F. FIG. 8B shows time t=1, corresponding to the first sub-trellis operation. The path metrics resident in the first column of memory A, $C_{0A}$, have been shifted to a hold register 3010. In FIG. 8C, time t=2, the first column of memory B, $C_{0B}$, is moved to the hold register 3010 and a function of $C_{0A}$ and $C_{2A}$ form resultant path metrics $C_{0A}'$ and $C_{0B}'$, which are written into the first column of memories A and B respectively. In FIG. 8D, the second column of memory A $C_{1A}$ is deposited in the hold register 3010. A function of the previous contents of the hold register 3010 $C_{0B}$ and $C_{2B}$ form new path metrics $C_{1A}'$ and $C_{1B}'$ which are written back into the third column of A and B respectively.

FIG. 8E shows time t=4 in which $C_{1B}$ is written to the hold register 3010. A function of $C_{1A}$ and $C_{3A}$ produces new path metrics $C_{2A}'$ and $C_{2B}'$, which are written into the second columns of memories A and B respectively. FIG. 8F shows the reverse sub-trellis operation corresponding to time t=5 in which a function of $C_{1B}$ and $C_{3B}$ forms resultant path metrics $C_{3A}'$ and $C_{3B}'$ which are written into fourth columns of memories A and B respectively. In the calculations of the reverse trellis, path metrics are presented to four butterfly processors in a scrambled manner and the in-place path metric addressing described in FIGS. 8B to 8F ensures that the resultant path metrics are presented in a sequential manner.

Figure 9A:
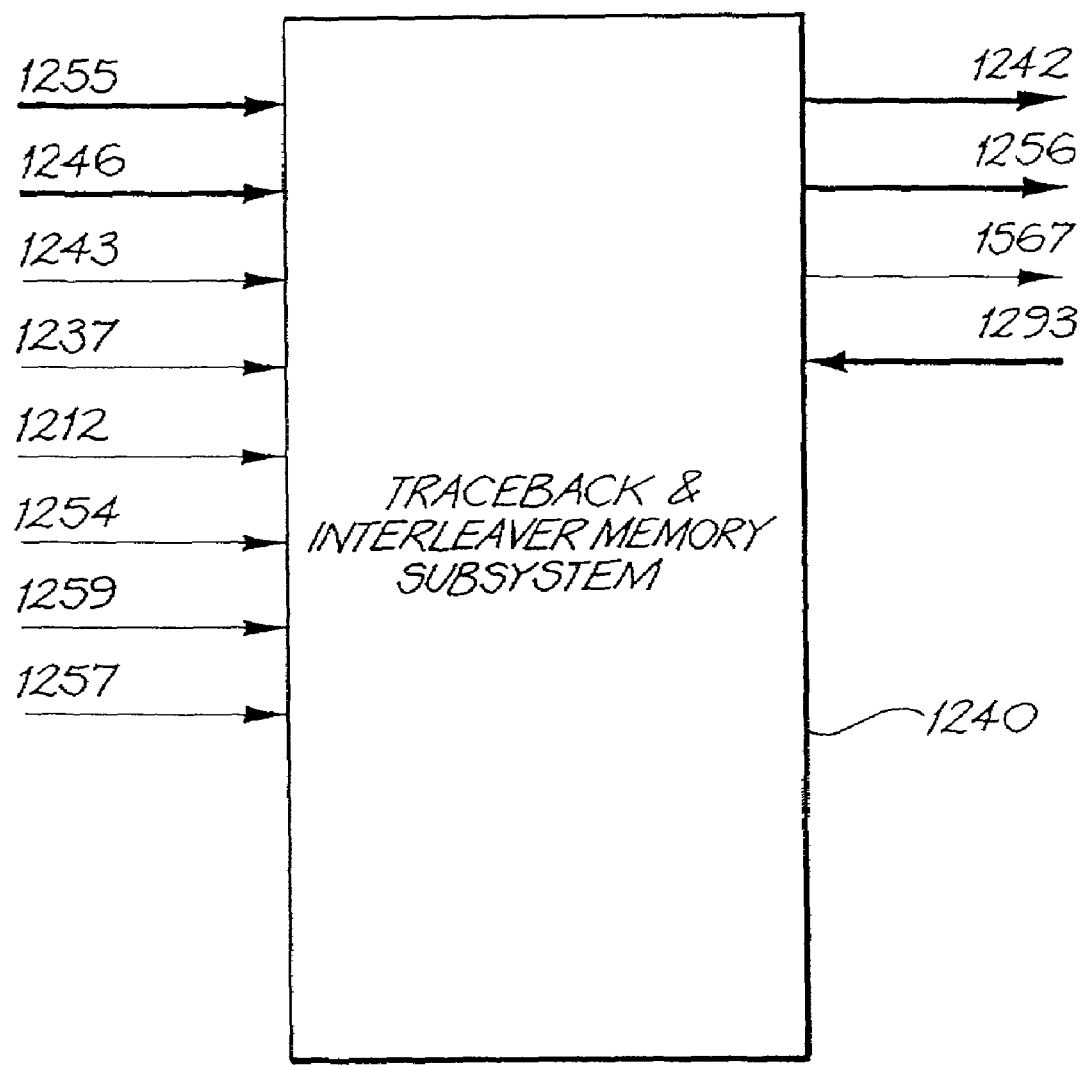
FIG. 9A is a schematic block diagram representation of an Intermediate Decoding Memory Processor of FIG. 4.

FIG. 9A shows a high level schematic block diagram representation of an embodiment of the Intermediate Decoding Memory and Processor 1240, which performs traceback and interleaver functions in respective decoding schemes. The Intermediate Decoding Memory and Processor 1240 receives as inputs decision bits 1255, normalising output 1246, spreading input 1243, intermediate decoding direction 1237, intermediate decoding mode 1212, a clocking signal 1254, a read/write clock 1257, a reset signal 1259 and the output 1293 from the LogLikelihood processor 1297. The Intermediate Decoding Memory and Processor 1240 produces outputs including extrinsic information 1242, interleaver extrinsic information 1256 and Traceback processor output 1567.

Figure 9B:
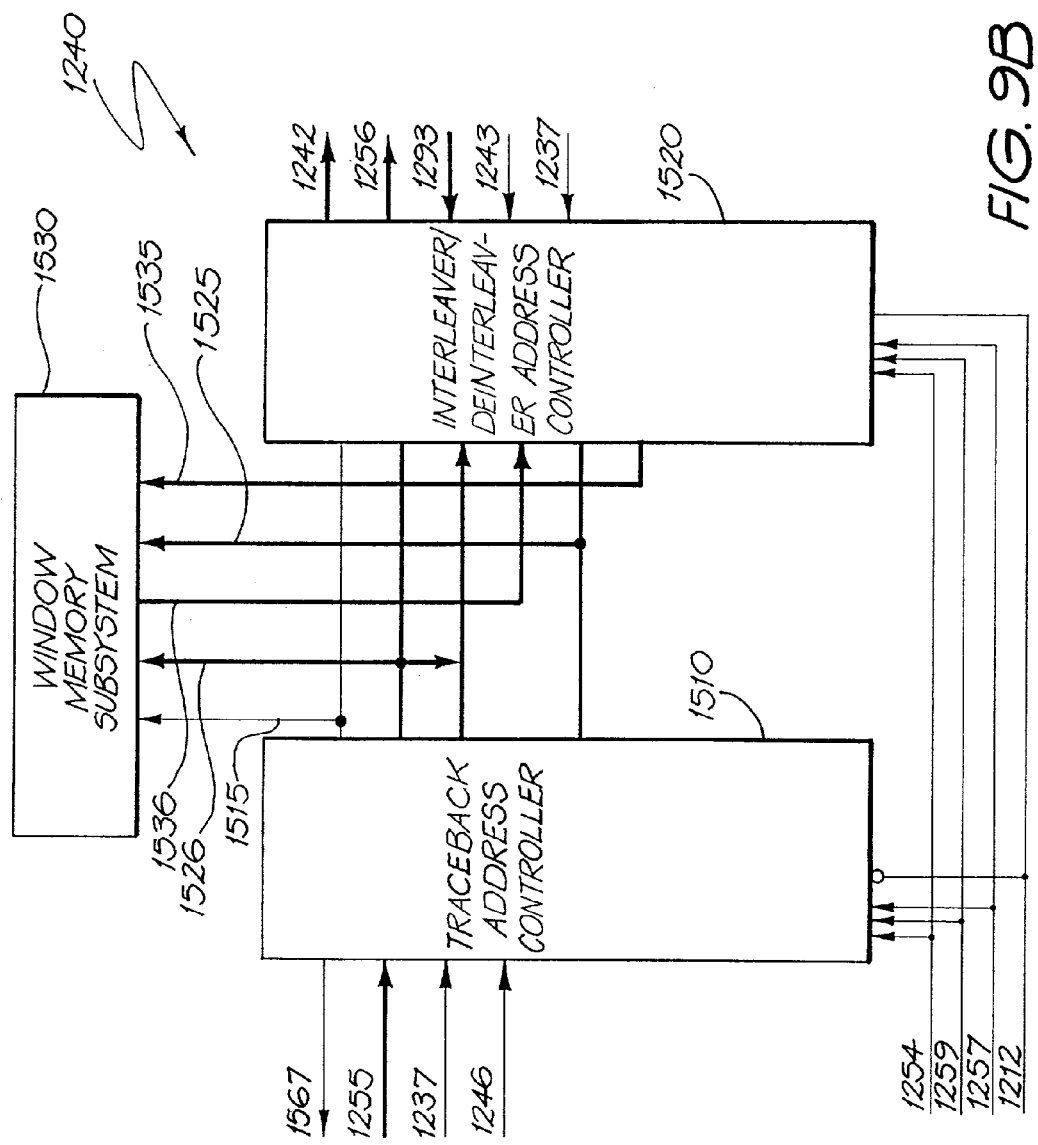
FIG. 9B is a schematic block diagram representation of an exploded view of FIG. 9A showing a Window Memory Subsystem, Traceback Controller and Interleaver Controller.

FIG. 9B shows an exploded view of the Intermediate Decoding Memory and Processor 1240. A Traceback Address Controller 1510 receives as inputs Decision Bits 1255, the Intermediate Decoding Direction 1237, Normalising Output 1246, the clocking signal 1254, reset signal 1259, read/write clock 1257 and the Intermediate Decoding Mode 1212, which is inverted. The Traceback Address Controller 1510 produces an output 1567.

The Traceback Address Controller 1510 writes Decision Bits 1255 to a Window Memory Subsystem 1520 every clock cycle. During traceback, the Traceback Address Controller 1510 examines a trellis section to determine a biggest value to be used as a starting point. It is to be noted that it is not necessary to store the complete value for each state as a new traceback byte address can be generated using one of the Decision Bits 1255.

An Interleaver Controller 1520 also receives a clocking signal 1254, reset signal 1259, read/write clock 1257 and Intermediate Decoding Mode 1212. In addition, the Interleaver Controller 1520 receives the output 1293 from the LogLikelihood Ratio Processor 1297, the Spreading Input 1243 and the Intermediate Decoding Direction 1237. The Interleaver Controller 1520 produces extrinsic information 1242 and 1256. The extrinsic data 1242 is used as a recursive input to the Butterfly Processors 1260 when the decoder 1200 operates as a Turbo decoder.

The Interleaver Controller 1520 produces extrinsic information 1242 and 1256 at the beginning of every clock cycle. At the end of every clock cycle, the Interleaver Controller 1520 receives new extrinsic information in the form of the output 1293 from the LogLikelihood Ratio Processor 1297 and writes it into memory.

The Traceback Address Controller 1510 and Interleaver Controller 1520 are interconnected and supply a joint read/write signal 1515 to a Window Memory Subsystem 1530. The Traceback Address Controller 1510, Interleaver Controller 1520 and Window Memory Subsystem 1530 are further interconnected by a bi-directional data bus 1526 and an address bus 1525. The Interleaver Controller 1520 has a second address bus 1535 connected to the Window Memory Subsystem 1530 and the Window Memory Subsystem 1530 produces an output on a second data bus 1536 to the Interleaver Controller 1520.

Figure 9C:
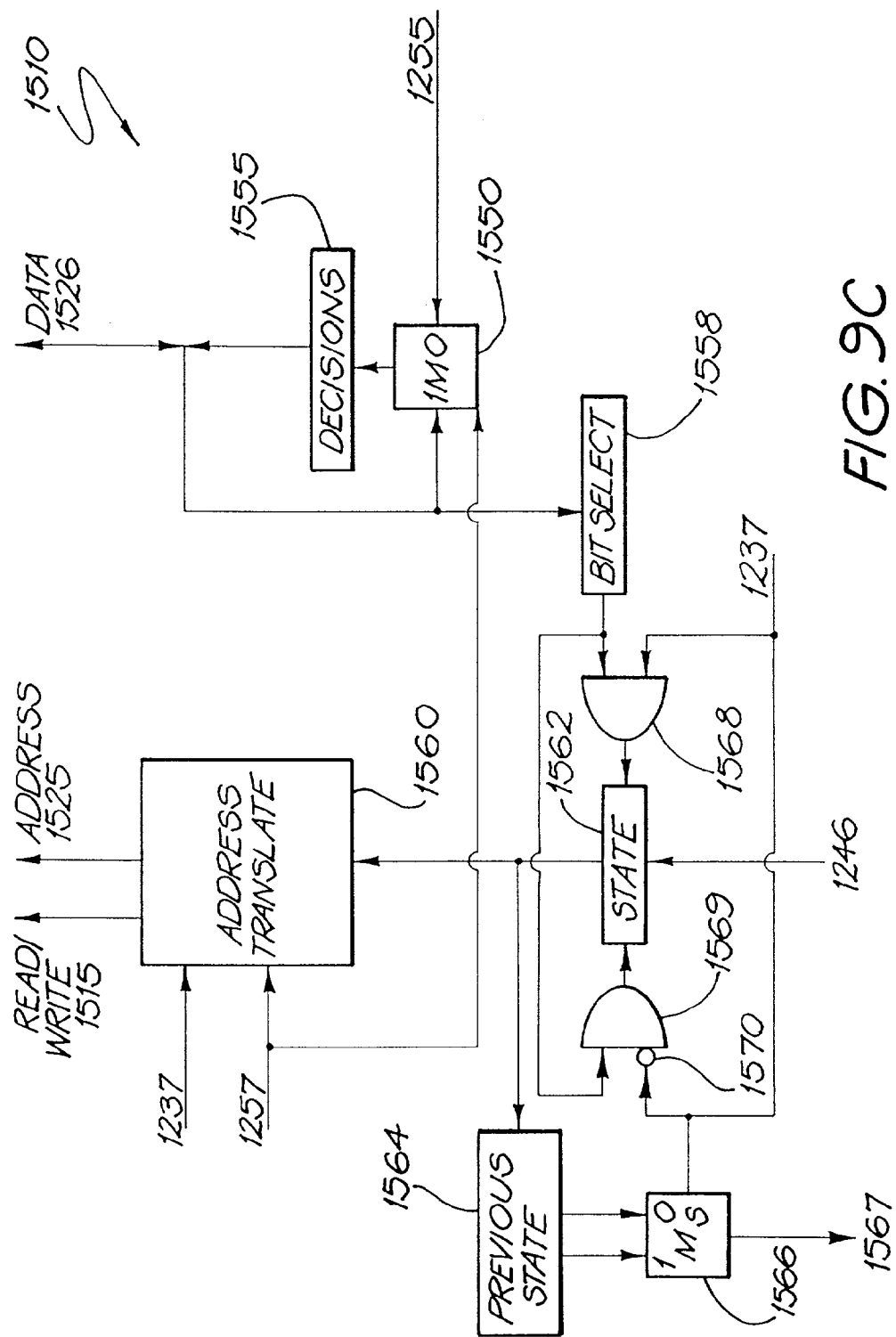
FIG. 9C is a schematic block diagram representation of a Traceback Controller of FIG. 9B.

FIG. 9C shows the Traceback Processor 1510. The decision bits 1255 are presented to a first multiplexer 1550. The output of the multiplexer 1550 is presented to a decisions register 1555. The output of the decisions register 1555 is data 1526, which is presented as an output of the Traceback Processor 1510 and is also fed back as a recursive input of the first multiplexer 1550 and as an input to a bit select 1558.

The Intermediate Decoding Direction 1237 is presented as an input to an address translation unit 1560. The address translation unit 1560 also receives a read/write clock 1257 and produces an output address 1525 and a read/write signal 1515. The read/write clock 1257 is also presented as the select of the first multiplexer 1550.

A normalising output 1246 is presented as an input to a state register 1562. The output of the state register 1562 is presented as an input to the address translation unit 1560, as well as being an input to a previous state unit 1564. The previous state unit 1564 presents two inputs to a second multiplexer 1566, whose output is the Traceback Processor Output 1567.

The output of the bit select 1558 is presented as an input to a first AND gate 1568. The output of the AND gate 1568 is presented as an input to the state register 1562. The output of the bit select 1558 is also presented to a second AND gate 1569, whose output is also presented to the state register 1562.

The Intermediate Decoding Direction 1237 is presented as the second input to the first AND gate 1568 and as the select input of the multiplexer 1566. The decode unit output 1502 is also presented, via a NOT gate 1570, to the second AND gate 1569.

Figure 9D:
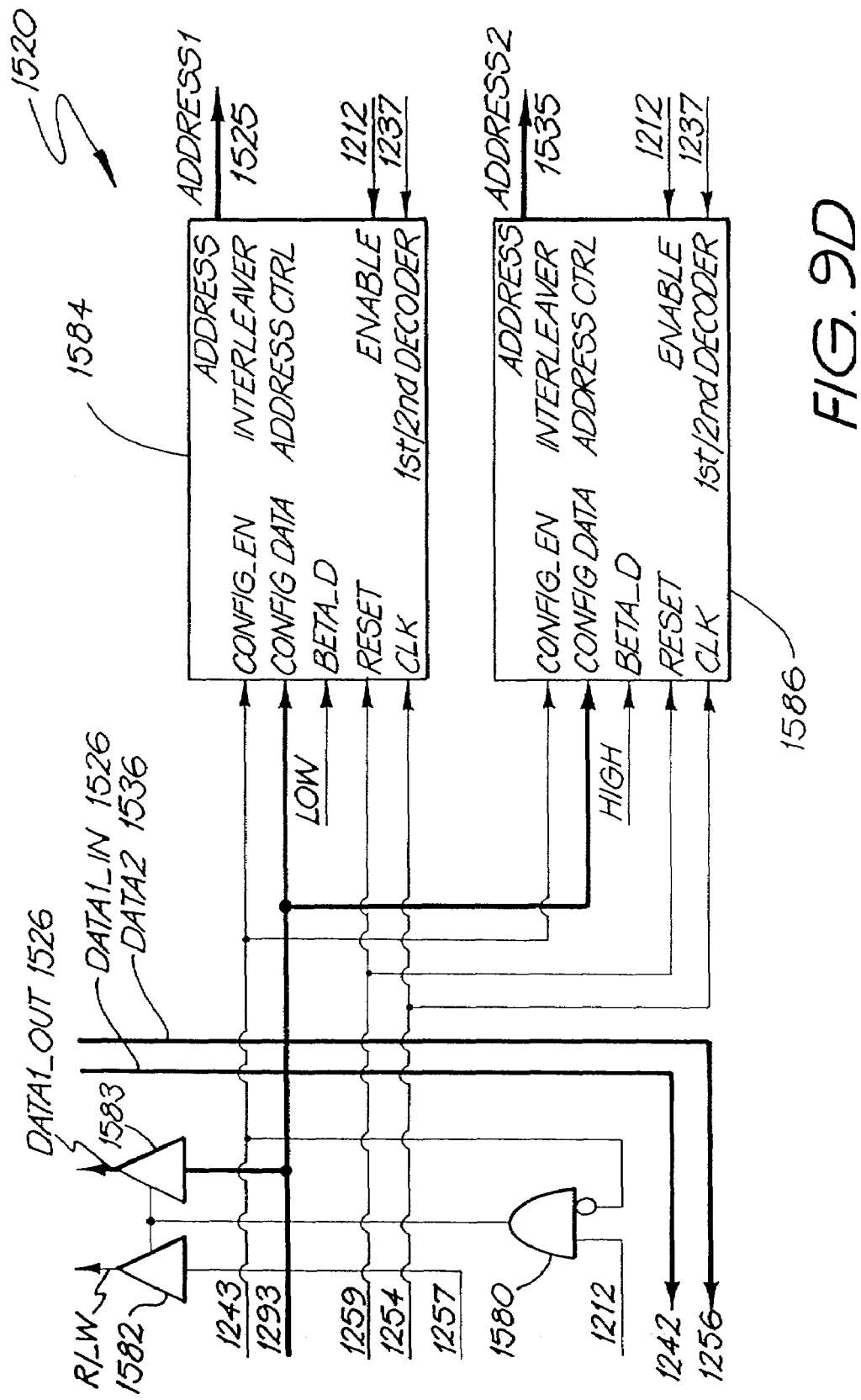
FIG. 9D is a schematic block diagram representation of an Interleaver of FIG. 9B.

FIG. 9D shows the interleaver controller of 1520 of FIG. 9B. The Intermediate decoding mode 1212 is presented to an AND gate 1580, whose output is presented to two tri-state buffers 1582 and 1583. The other input to the AND gate 1580 is the inverted form of the spreading input 1243. The tri-state buffer 1582 also receives as a input a read/write clock 1257. The second tri-state buffer 1583 receives the output 1293 from the LogLikelihood ratio processor 1297 as its second input. The output 1293 from the LogLikelihood Ratio Processor 1297 is also presented as inputs to two logic blocks 1584 and 1586. The spreading input 1243 is presented to each of the logic blocks 1584 and 1586, as is the reset signal 1259, and the clock signal 1254. The Interleaver 1520 receives data bus 1526 as an input and presents a corresponding output being extrinsic information 1242. A second data bus 1536 is output as interleaver extrinsic information 1256. The data bus 1526 is bi-directional, and the output of the Interleaver 1520 to the data bus 1526 is the output of the tri-state buffer 1583.

The first logic block 1584 receives the intermediate decoding mode 1212 and the intermediate decoding direction 1237 and produces an address 1525. The second logic block 1586 also receives the intermediate decoding mode 1212 and intermediate decoding direction 1237 and produces address 1535. Each of the logic blocks 1584 and 1586 also receive an input beta_d, which is a low or high power signal.

Figure 9E:
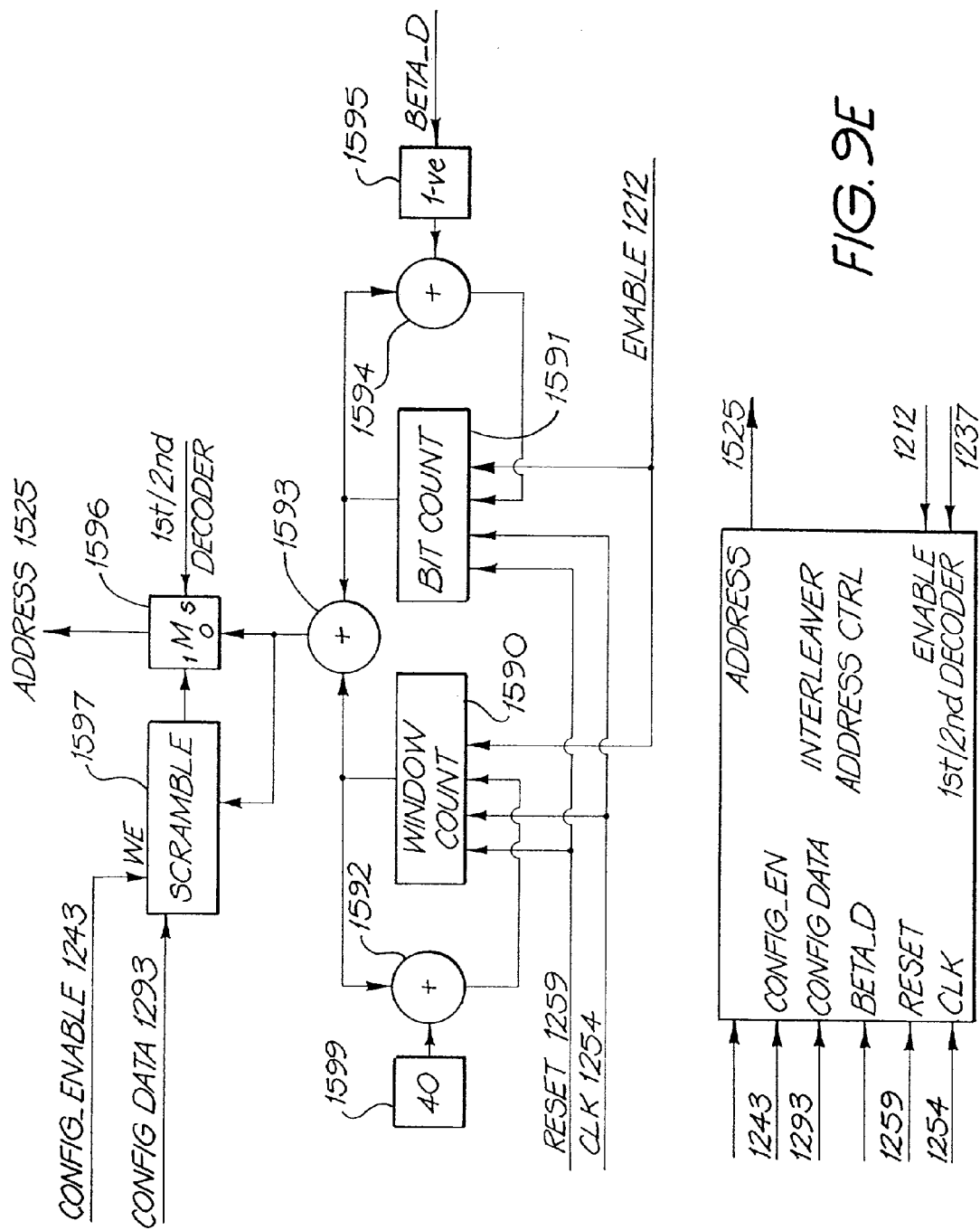
FIG. 9E is an exploded view of an Interleaver address controller of FIG. 9D.

FIG. 9E shows an exploded view of the logic block 1584 of FIG. 9D. The logic block 1586 of FIG. 9D has the same configuration. A window count 1590 receives as inputs a reset 1259, a clock 1254 and an enable 1212. It also receives as an input the output of a first adder 1592. The window count 1590 produces an output which is presented to adders 1592 and 1593. The first adder 1592 receives as a second input the constant 1599 and presents its output to the window count 1590. The bit count 1591 receives as inputs the reset 1259, the clock 1254, the enable 1212 and the output of a third adder 1594. The bit count 1591 produces an output which is presented to two adders 1593 and 1594. Beta_d is presented to an element 1595, which adds 1 and if beta_d is active, it negates the value and presents a result as a second input to the third adder 1594. The output of the adder 1594 is presented as a recursive input to the bit count 1591.

The output of the second adder 1593 is presented as an input to a multiplexer 1596 and to a scramble 1597. The multiplexer 1596 receives a select signal indicating if the architecture is operating as a first or second decoder, and a second input being the output of the scramble 1597. The output of the multiplexer 1596 is the address 1525. The scramble 1597 receives the Spreading Input 1243 as an enabling signal and the output 1293 from the LogLikelihood Ratio Processor 1297 as data. The scramble 1597 could be memory or logic function as is well known in the art and is used to implement scrambling of addresses between a first and second decoder when undertaking Turbo decoder calculations.

Figure 9F:
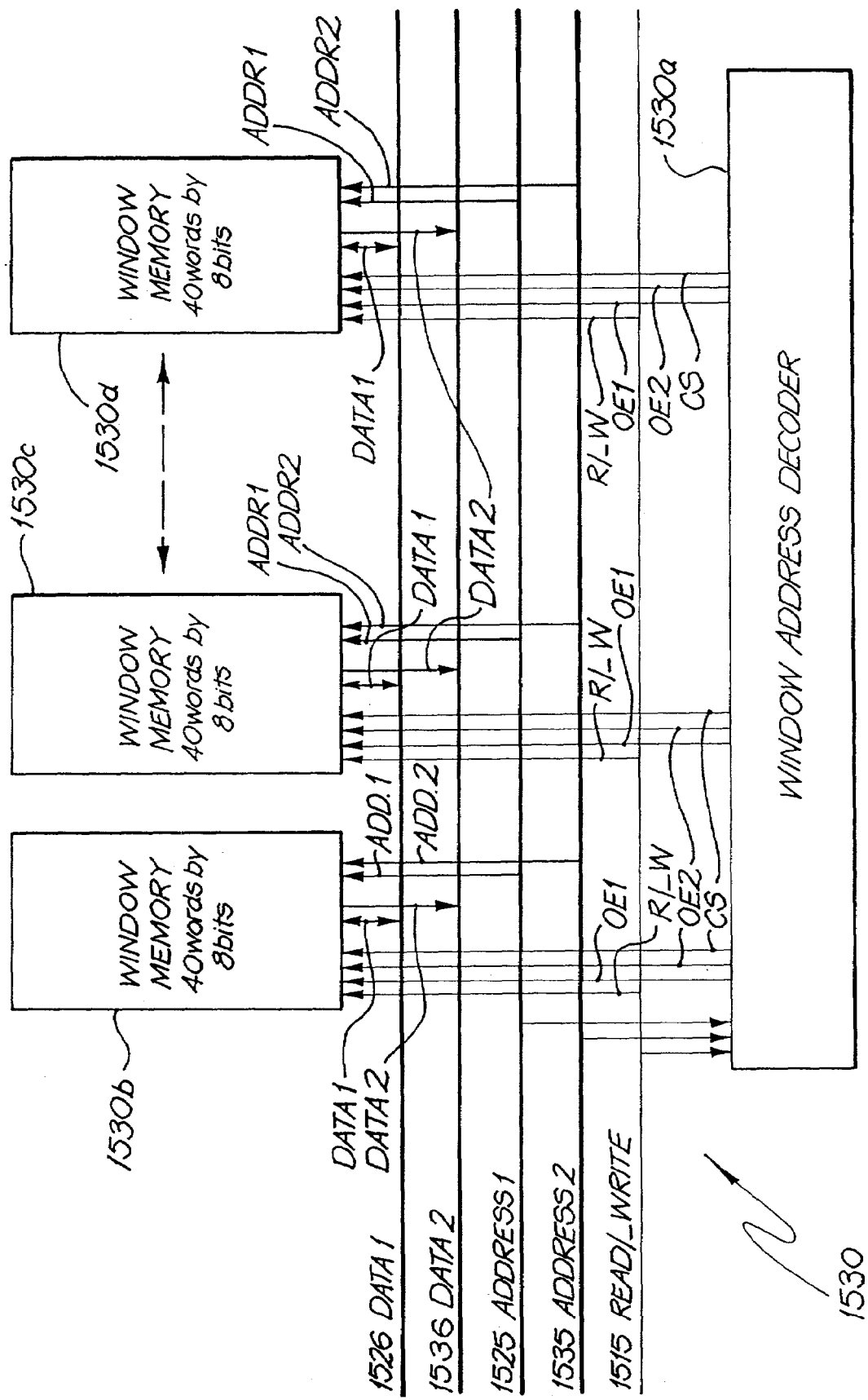
FIG. 9F is a schematic block diagram representation of a Window Memory Subsystem of FIG. 9B.

FIG. 9F shows a schematic block diagram representation of the window memory sub system 1530 of FIG. 9A. A read/write clock 1515, address buses 1525 and 1535, and data buses 1526 and 1536 are presented to a window address decoder 1530a and window memories 1530b . . . 1530d.

Figure 10A:
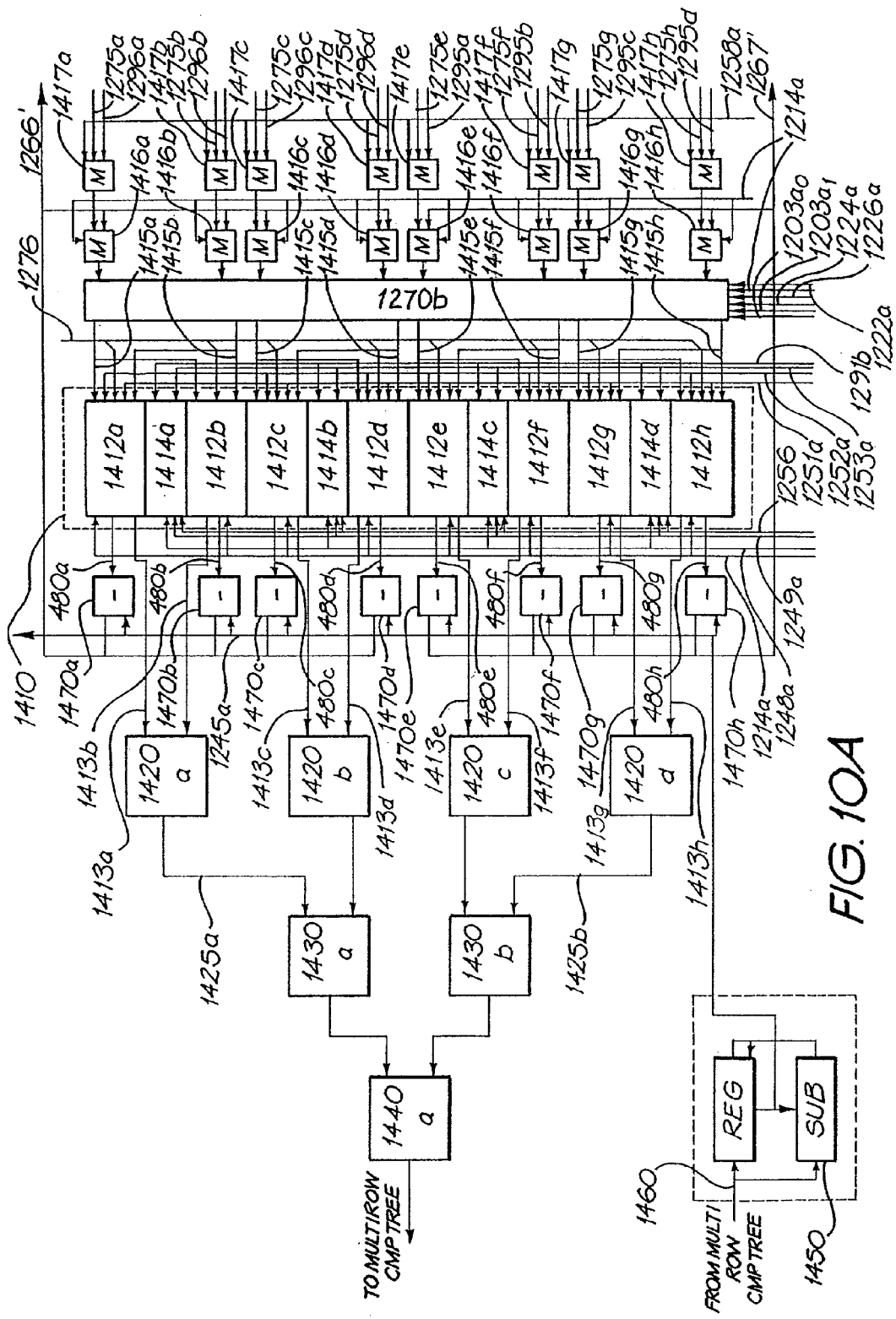
FIG. 10A is a schematic block diagram representation of a LogLikelihood processor of FIG. 4 for a single row decoder.

FIG. 10A shows the LogLikelihood Processor 1250a of FIG. 4. A bank of four butterfly units 1410 is provided and its constituent ACS units 1412a . . . 1412h are presented with pairs of reverse trellis path metrics 1415a . . . h from a Reverse Address Processor 1270b and stored path metrics 1276 from the Path Metric Store 1280. The stored path metrics 1276 represent alphas in the LogMAP calculation. Each of the ACS units 1412a . . . h is also presented with a LogLikelihood Mode 1214a, a LogLikelihood Clock 1251a and a LogLikelihood Reset 1252a. BMC units 1414a . . . 1414d are each provided with a number of inputs, including the LogLikelihood Rate 1248a, the LogLikelihood Constraint 1249a, the LogLikelihood Polynomials 1253a, interleaver extrinsic information 1256 and the Input Symbol History 1291b. The ACS units 1412a . . . h produce first outputs 1413a . . . 1413h, which are presented in sequential pairs to the ACS node units 1420a . . . 1420d. The ACS units 1412a . . . h produce second outputs 480a . . . h, each of which is presented to a corresponding normalising subtractor 1470a . . . 1470h. The normalising subtractors 1470a . . . 1470h produce outputs 1266' and 1267', which are fed recursively via multiplexers, as explained below, to the Reverse Address Processor 1270b and used to ensure that the path metrics remain within the dynamic range of the architecture.

Each of a first bank of multiplexers 1417a . . . h receives a corresponding normalised path metric 1275a . . . h from the Normalising Processor 1278 and a select signal 1258 from the control unit 1210. Multiplexers 1417a . . . d also receive corresponding path metrics 1296a . . . d, and multiplexers 1417e . . . h receive corresponding path metrics 1295a . . . d. The path metrics 1295a . . . d and 1296a . . . d represent betas in the LogMAP calculation. The select signal 1258 is used to determine whether the normalised path metrics 1275a . . . h or the path metrics 1295a . . . d and 1296a . . . d will be output.

Each of a second bank of multiplexers 1416a . . . h receives LogLikelihood Mode 1214a as a select signal and a corresponding output from the first bank of multiplexers 1417a . . . h. Multiplexers 1416a . . . d receive a third input, being the output 1266' of the normalising subtractors 1470a . . . d and multiplexers 1416e . . . h receive the output 1267' from the normalising subtractors 1470e . . . h. The outputs from the multiplexers 1416a . . . h are presented as inputs to the Reverse Address Processor 1270b.

The Reverse Address Processor 1270b also receives a LogLikelihood Mode 1214a, Turbo enable for LogLikelihood 0 Enable 1203a$_0$, Turbo enable for LogLikelihood 1 1203a$_1$, reverse trellis selector 1222a, reverse trellis transparent bit 1226a and the reverse trellis hold 1224a. The beta outputs 1266' and 1267' of the LogLikelihood Processor 1250a represent the final dummy beta values used for the start of the beta processing phase, when the decoder 1200 is operating in LogMAP/turbo mode.

The outputs of the ACS node units 1420a and 1420b are presented to an ACS node unit 1430a and the outputs of the ACS node units 1420c and 1420d are presented to an ACS node unit 1430b. The outputs of the ACS node units 1430a, 1430*b* are presented as inputs to a further ACS node unit 1440*a*, whose output is presented to a multi-row comparator tree, which spans the decoder when operated in a multi-row configuration so as to capture the maximum path metric being calculated for the state of the trellis being investigated. An output from the multi-row comparator tree is presented to a subtractor 1450 and a register 1460. The subtractor 1450 also presents a recursive input to the register 1460. The register output 1245*a* is fed to the subtractor 1450 and to each one of the normalising subtractors 1470*a* . . . 1470*h*, in addition to being an output of the LogLikelihood Processor 1250*a*.

Figure 10B:
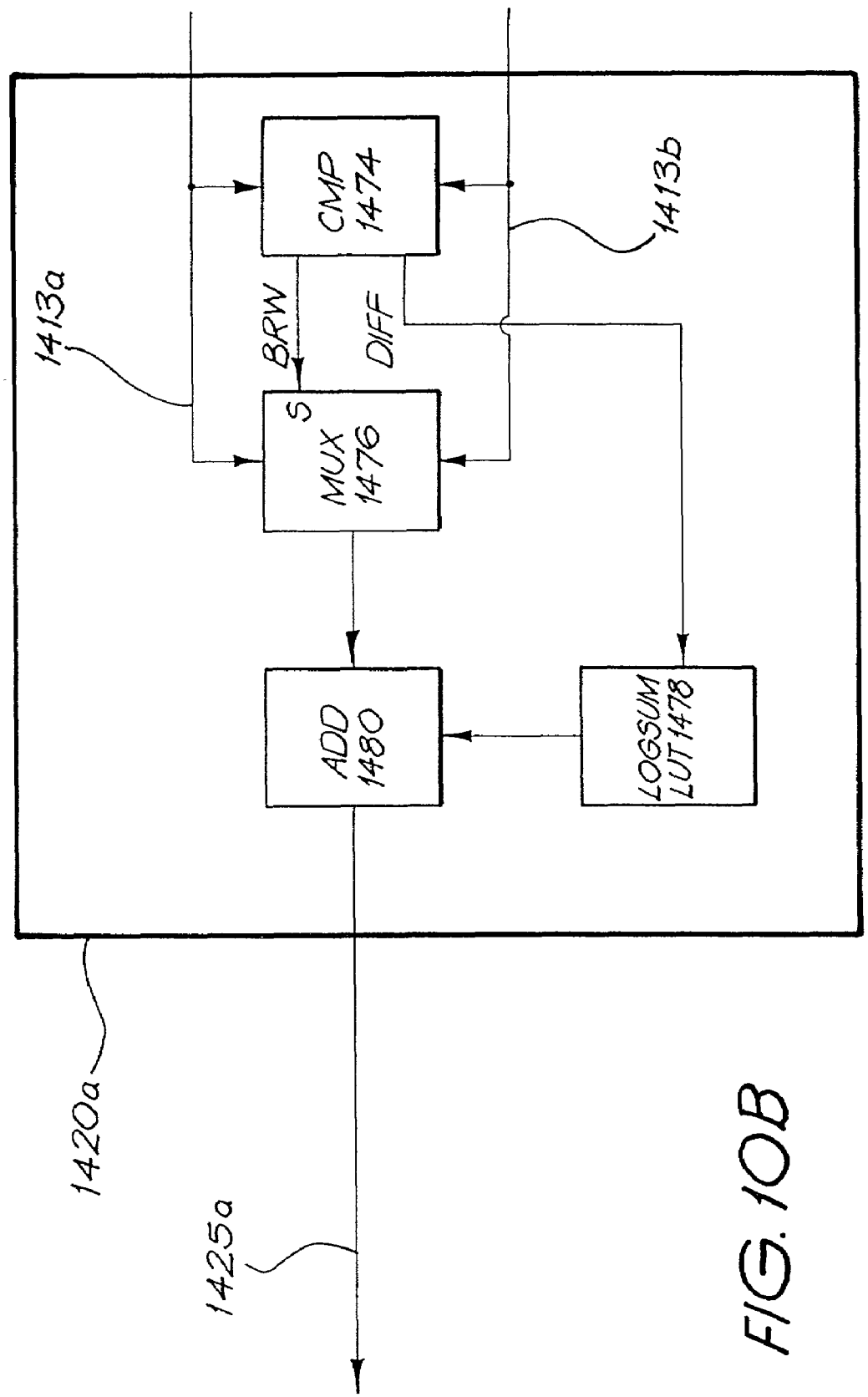
FIG. 10B is a schematic block diagram representation of an Add-Compare-Select Node unit of FIG. 10A.

FIG. 10B shows one arrangement of the ACS node unit 1420*a* of FIG. 10A. The outputs 1413*a* and 1413*b* from the ACS leaf units are presented as inputs to a comparator 1474 and a multiplexer 1476. A borrow output of the comparator 1474 is fed as a select signal of the multiplexer 1476. A difference output of the comparator 1474 is presented as an input to a log sum correction table 1478. The output of the log sum correction table 1478 is presented to an adder 1480, whose second input is the output of the multiplexer 1476. The adder 1480 computes and outputs the sum 1425*a* of its two inputs, the sum 1425*a* representing the maximum of the two inputs 1413*a* and 1413*b*, with a log-sum correction.

Figure 10C:
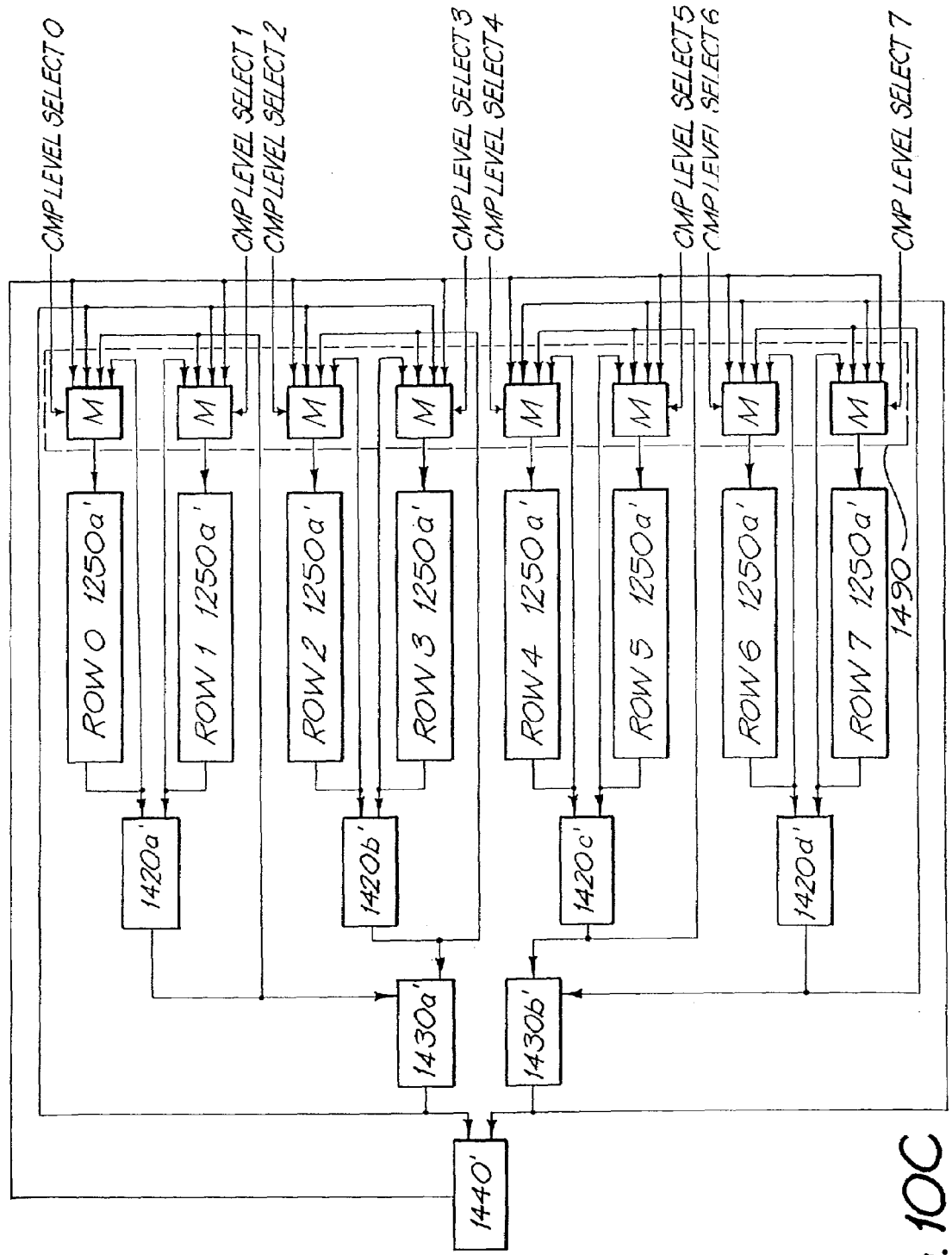
FIG. 10C is a schematic block diagram representation of a LogLikelihood processor of FIG. 4 for an eight row decoder.

FIG. 10C shows a configuration of a LogLikelihood processor 1250*a* of FIG. 4 for an eight row decoder embodiment. The LogLikelihood processors 1250*a*' in each of the rows are interconnected via a bank of multiplexers 1490. Each multiplexer 1490 presents a single input to a LogLikelihood processor 1250*a*' in its corresponding decoder row. Pairs of LogLikelihood processors 1250*a*' present their outputs as inputs to ACS node units 1420*a*', 1420*b*', 1420*c*' and 1420*d*'. The outputs of the LogLikelihood processors 1250*a*' are also presented as recursive inputs to the bank of multiplexers 1490. The ACS nodes units 1420*a*', 1420*b*', 1420*c*' and 1420*d*' are paired and present their outputs as inputs to further ACS nodes units 1430*a*' and 1430*b*'. The outputs of the ACS node units 1420*a*', 1420*b*', 1420*c*' and 1420*d*' are also presented as recursive inputs to the bank of multiplexers 1490. The ACS node units 1430*a*' present their outputs to a final ACS node unit 1440' and as recursive inputs to the bank of multiplexers 1490. The output of the final ACS node unit 1440' is presented as a final recursive input to the bank of multiplexers 1490. Each multiplexer 1490 is presented with a select signal.

Figure 10D:
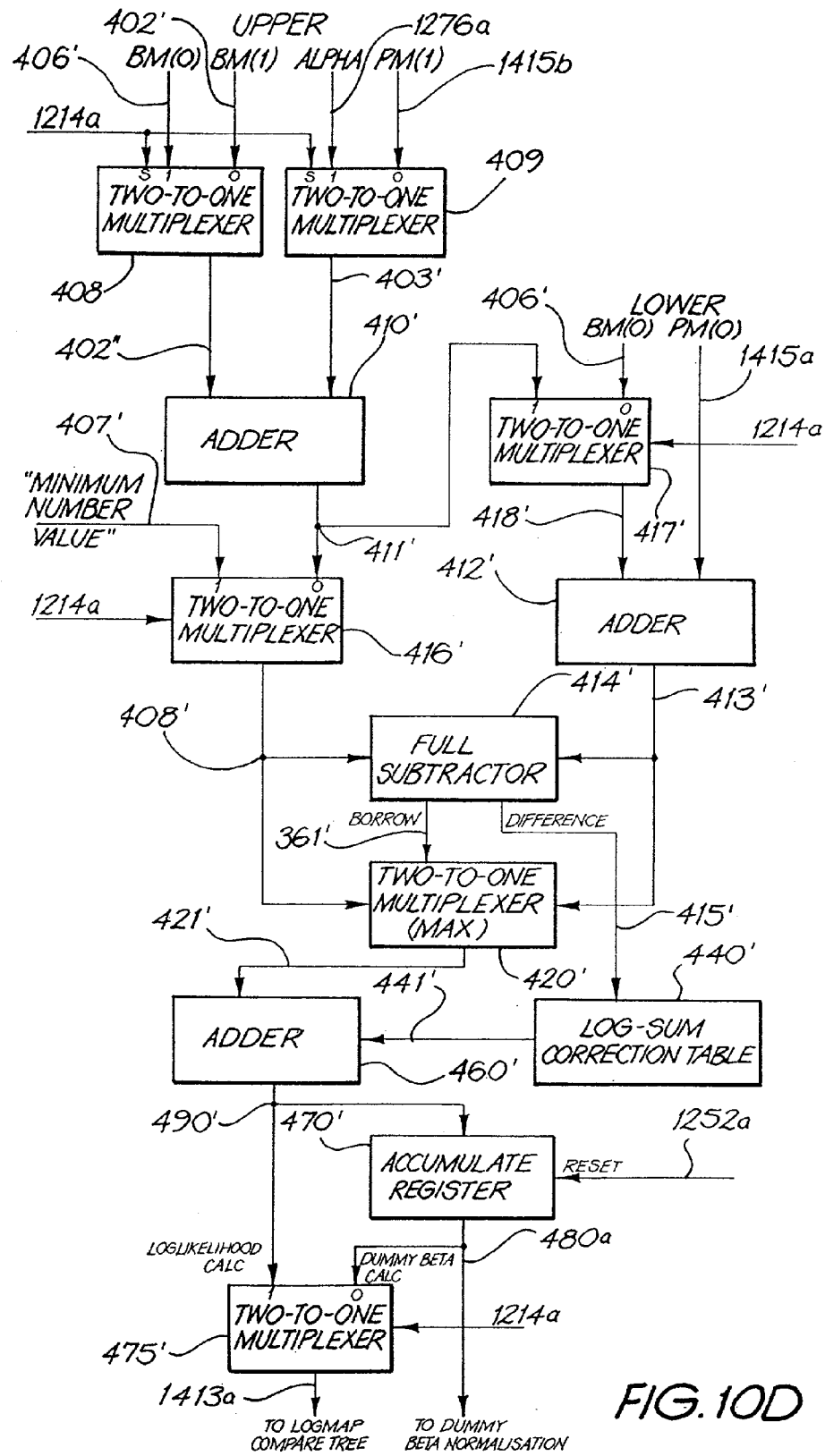
FIG. 10D is a schematic block diagram representation of an ACS unit of FIG. 10A.

FIG. 10D shows one useful architecture of an ACS unit 1412*a* of FIG. 10A. A first pair of inputs, branch metric 1 402' and branch metric 0 406', are presented to a multiplexer 408, which produces an output 402". A second pair of inputs, path metric 1276*a* and path metric 1 1415*b* are presented to a multiplexer 409, which produces an output 403'. Each of the multiplexers 408 and 409 receives LogLikelihood Mode 1214*a* as a select signal. When the LogLikelihood Mode 1214*a* is inactive, branch metric 1 402' is selected by multiplexer 408 and path metric 1 1415*b* is selected by multiplexer 409. Conversely, when LogLikelihood Mode 1214*a* is active, branch metric 0 406' is selected by multiplexer 408 and path metric 1276*a*, representing an alpha value, is selected by 409.

The outputs 402" and 403' of the multiplexers 408 and 409 are presented to an adder 410'. The sum 411' is output from the adder 410' and presented to a multiplexer 416' and a multiplexer 417'. The multiplexer 417' receives branch metric 0 406' as a second input and LogLikelihood Mode 1214*a* as a select signal. The output 418' of the multiplexer 417' is presented to an adder 412'. The adder 412' receives path metric 0 1415*a* as a second input. The adder 412' produces a sum 413', which represents the sum of alphas, betas and gammas. The sum 413' is presented to a Full Subtractor 414' and a multiplexer 420'. The multiplexer 416' receives a hardwired input 407' corresponding to the minimum 2s complement number able to be represented and a LogLikelihood Mode 1214*a* as a select signal. The Full Subtractor 414' also receives the output 408' of the multiplexer 416' as a second input and produces a borrow 361' and a difference 415'.

The output 408' of the multiplexer 416' is presented as a first input to a multiplexer 420'. The multiplexer 420' receives the sum 413' of the adder 412' as a second input. The borrow output 361' of the Full Subtractor 414' is fed to the multiplexer 420' to compute a maximum MAX of the input values. A second output 415' of the Full Subtractor 414', representing the difference of the multiplexer output 408' and the sum 413', is presented to a Log-sum correction table 440', which tweaks the result of the new path metric, when the output of the Full Subtractor 414' is small, to produce a more accurate result in the Log domain for LogMAP decoding. An output 441' of the Log-sum correction table 440' is presented to an Adder 460'. An output 421' of the multiplexer 420' is also presented to the Adder 460'. A result 490' from the Adder 460' is then presented as an input to an accumulate register 470'. The accumulate register 470' accumulates values for dummy beta LogMAP calculations. The output 480*a* of the accumulate register is presented as an input to a further multiplexer 475' and as an output of the ACS unit 1412*a* to be used in dummy beta computation. The multiplexer 475' receives the sum 490' as a second input and LogLikelihood Mode 1214*a* as a select signal. The output 1413*a* of the multiplexer 475' is the second output of the ACS unit 1412*a*.

Figure 11:
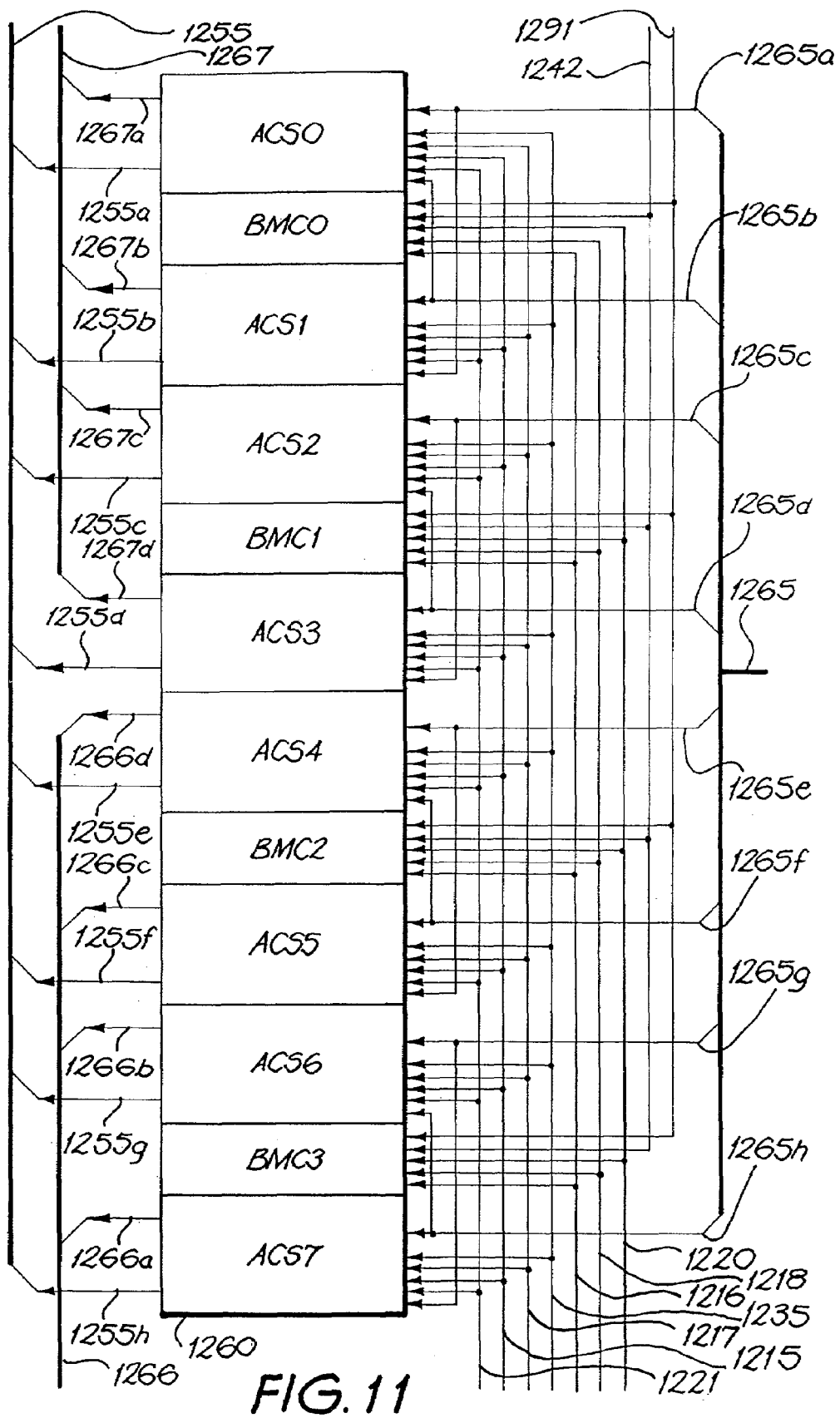
FIG. 11 is a schematic block diagram representation of a bank of butterfly decoding processors of FIG. 4.

FIG. 11 shows Butterfly Decoding Processors 1260 of FIG. 4 in accordance with a preferred embodiment. Each of the component ACS units ACS0 . . . ACS7 is presented with a number of inputs, including a butterfly mode 1221, a butterfly reset 1215, a butterfly clock 1217 and a beta-phase enable 1235. Each of the component BMC units BMC0 . . . BMC3 is presented with a butterfly rate 1216, a butterfly constraint 1220 and butterfly polynomials 1218. The reverse trellis path metrics 1265 fan out to present inputs 1265*a* . . . 1265*h* to the ACS units ACS0 . . . ACS7, such that each ACS unit receives two reverse trellis path metrics. Reverse trellis path metrics 1265*a* and 1265*b* are presented to each of the ACS units ACS0 and ACS1, reverse trellis path metrics 1265*c* and 1265*d* are presented to each of the ACS units ACS2 and ACS3, reverse trellis path metrics 1265*e* and 1265*f* are presented to each of the ACS units ACS4 and ACS5, and reverse trellis path metrics 1265*g* and 1265*h* are presented to each of the ACS units ACS6 and ACS7. The BMC units BMC0 . . . BMC3 also receive as inputs extrinsic information 1242 and input symbol history input symbol 1291*a*.

The Butterfly Decoding Processors 1260 are preferably formed by eight ACS units and four BMCs, configured as four butterfly processors:

(i) ACS0, BMC0, ACS1;
(ii) ACS2, BMC1, ACS3;
(iii) ACS4, BMC2, ACS5; and
(iv) ACS6, BMC3, ACS7.

The unified decoder architecture takes advantage of the fact that each state in a trellis diagram may only be impacted upon by two other states. A code with a minimum constraint length of k gives rise to a trellis diagram having $2^{k-1}$ states. A butterfly processor having two ACS units and an intermediary BMC unit is capable of processing two states in a trellis state diagram. Therefore, in order to process a code with constraint length 4 in one clock cycle, a total of eight ACS units are required. More states may be handled by processing over a greater number of clock cycles, or by having more butterfly processors.

The ACS units ACS0 . . . ACS7 produce corresponding outputs 1255a . . . h, which are aggregated to form decision bits 1255. New path metrics computed by ACS units ACS0 . . . ACS3 are presented as outputs 1267a . . . d and sent on upper new path metric bus 1267. The new path metrics 1266a . . . d calculated by ACS units ACS4 . . . 7 are presented to the lower new path metric bus 1266.

Figure 12:
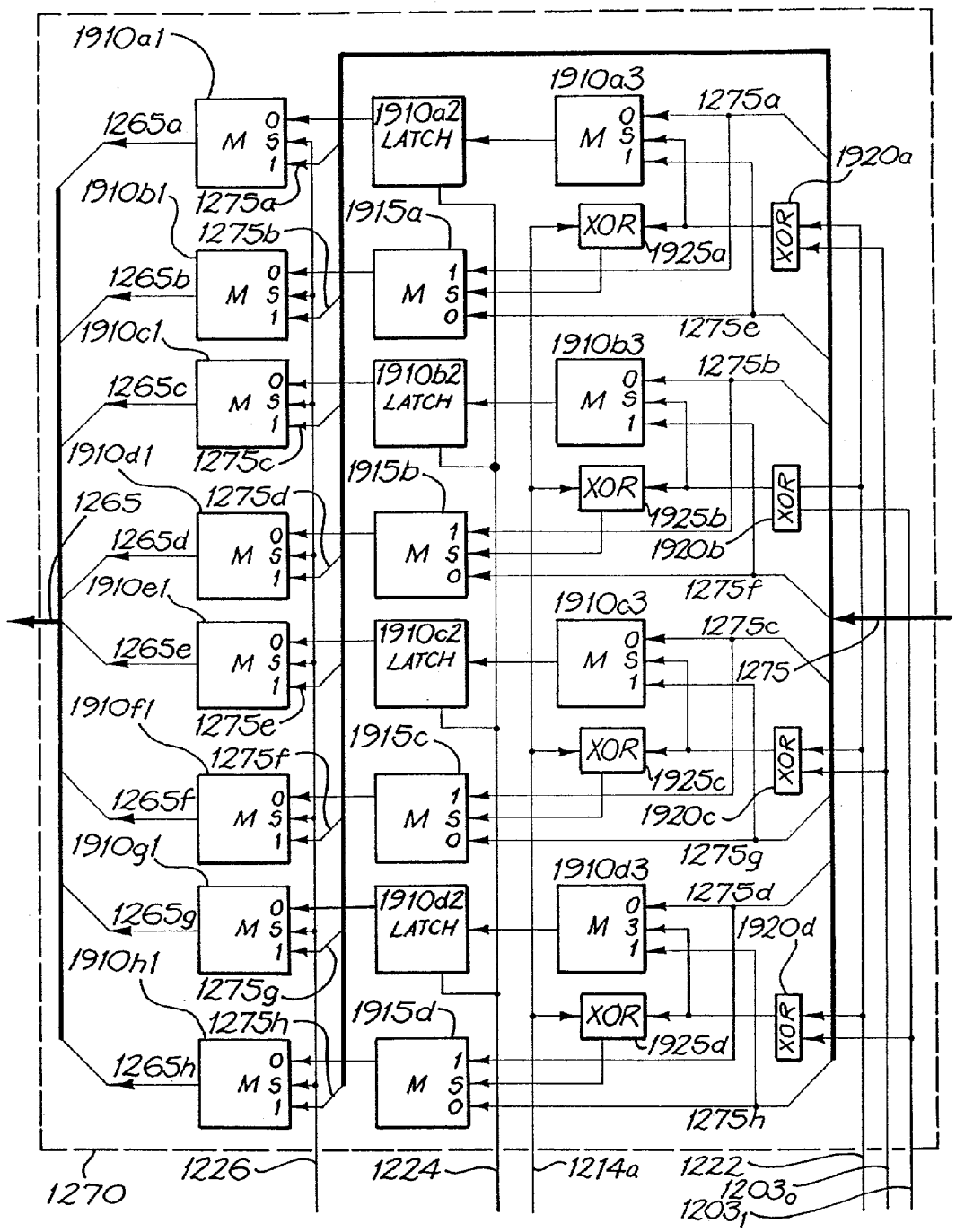
FIG. 12 is a schematic block diagram representation of a Reverse Address Processor of FIG. 4.

FIG. 12 shows the Reverse Address Processor 1270 of FIG. 4. The Reverse Address Processor 1270 provides facilities for delaying and ordering path metrics to produce a desired pattern of path metrics. The Reverse Address Processor 1270 is also capable of acting transparently when the decoder 1200 is operating in forward trellis mode such that input path metrics are presented as outputs without alteration. The Reverse Address Processor 1270 receives as inputs: a reverse trellis selector 1222, a reverse trellis hold 1224, a reverse trellis transparent bit 1226, a LogLikelihood Mode 1214, a LogLikelihood 0 Enable $1203_0$, a LogLikelihood 1 Enable $1203_1$, and the normalised path metrics 1275. The normalised path metrics 1275 fan out to present pairs of inputs 1275a and 1275e, 1275b and 1275f, 1275c and 1275g, and 1275d and 1275h to a first bank of corresponding multiplexers 1910a3, 1910b3, 1910c3 and 1910d3, and a second bank of corresponding multiplexers 1915a . . . 1915d.

The reverse trellis selector 1222 is presented to each of the first bank of XOR gates 1920a . . . d. The XOR gates 1920a and 1920c receive LogLikelihood 0 Enable $1203_0$ and XOR gates 1920b and 1920d receive LogLikelihood 1 Enable $1203_1$. Each XOR gate 1920a . . . d produces an output which is presented to a corresponding XOR gate in a second bank of XOR gates 1925a . . . d and to a corresponding one of the multiplexers 1910a3 . . . 1910d3. Each of the second bank of XOR gates 1925a . . . d receives LogLikelihood Enable 1214 as a second input and produces an output to a corresponding multiplexer in the second bank of multiplexers 1915a . . . d. As mentioned above, each multiplexer 1915a . . . d receives a pair of normalised path metrics The outputs from the XOR gates 1925a . . . d act as select signals for the respective multiplexers 1915a . . . d to choose one of the presented normalised path metrics. Each of the multiplexers 1915a . . . d presents an output to a corresponding one of multiplexers 1910b1, 1910d1, 1910f1 and 1910h1.

Multiplexers 1910a3 . . . d3 an 1915a . . . d are presented with different pairs of inputs depending on the values of the LogLikelihood Enable 1214 and the LogLikelihood Enable 0 $1203_0$ and LogLikelihood 1 Enable $1203_1$. LogLikelihood 0 Enable $1203_0$ is enabled for LogLikelihood Processor 0 and disabled for LogLikelihood Processor 1. Conversely, LogLikelihood 1 Enable $1203_1$ is enabled for LogLikelihood Processor 1 and disabled for LogLikelihood Processor 0. As the Reverse Address Processor 1270 is used in several locations within the unified decoder 1200, the Reverse Address Processor 1270 must be capable of handling different modes of operation. When the LogLikelihood Enable 1214 and LogLikelihood Enables $1203_0$ and $1203_1$ are inactive, the Reverse Address Processor 1270 is in Viterbi mode operating on a trellis generated by a non-systematic convolutional code. When LogLikelihood Enable 1214 is active, the Reverse Address Processor 1270 is performing reverse trellis switching for the LogLikelihood operation for Log-MAP decoding. When either of the LogLikelihood Enables $1203_0$ and $1203_1$ is active with the LogLikelihood Enable 1214 active, the Reverse Address Processor 1270 is performing switching appropriate for a LogLikelihood operation using a recursive systematic code, as in Turbo decoding. The XOR gates implement the appropriate switching for the different operating modes of the Reverse Address Processor 1270.

Each of the first bank of multiplexers 1910a3 . . . 1910d3 produces an output which is presented to a corresponding latch 1910a2 . . . 1910d2. Each of the latches 1910a2 . . . 1910d2 receives the reverse trellis hold 1224 as an input and presents a delayed output as the second input to a corresponding one of the multiplexers 1910a1, 1910c1, 1910e1 and 1910g1.

The reverse trellis transparent bit 1226 is broadcast to each of a third bank of multiplexers 1910a1 . . . 1910h1, which produce corresponding path metrics 1265a . . . h. The path metrics 1265a . . . 1265h are collated and presented as reverse trellis path metrics 1265, the output of the Reverse Address Processor 1270. When the decoder 1200 is operating in the forward trellis direction, the reverse trellis transparent bit 1226 is set such that the Reverse Address Processor 1270 allows the normalised path metrics 1275 to pass through to become the reverse trellis path metrics 1265, without alteration.

Figure 13:
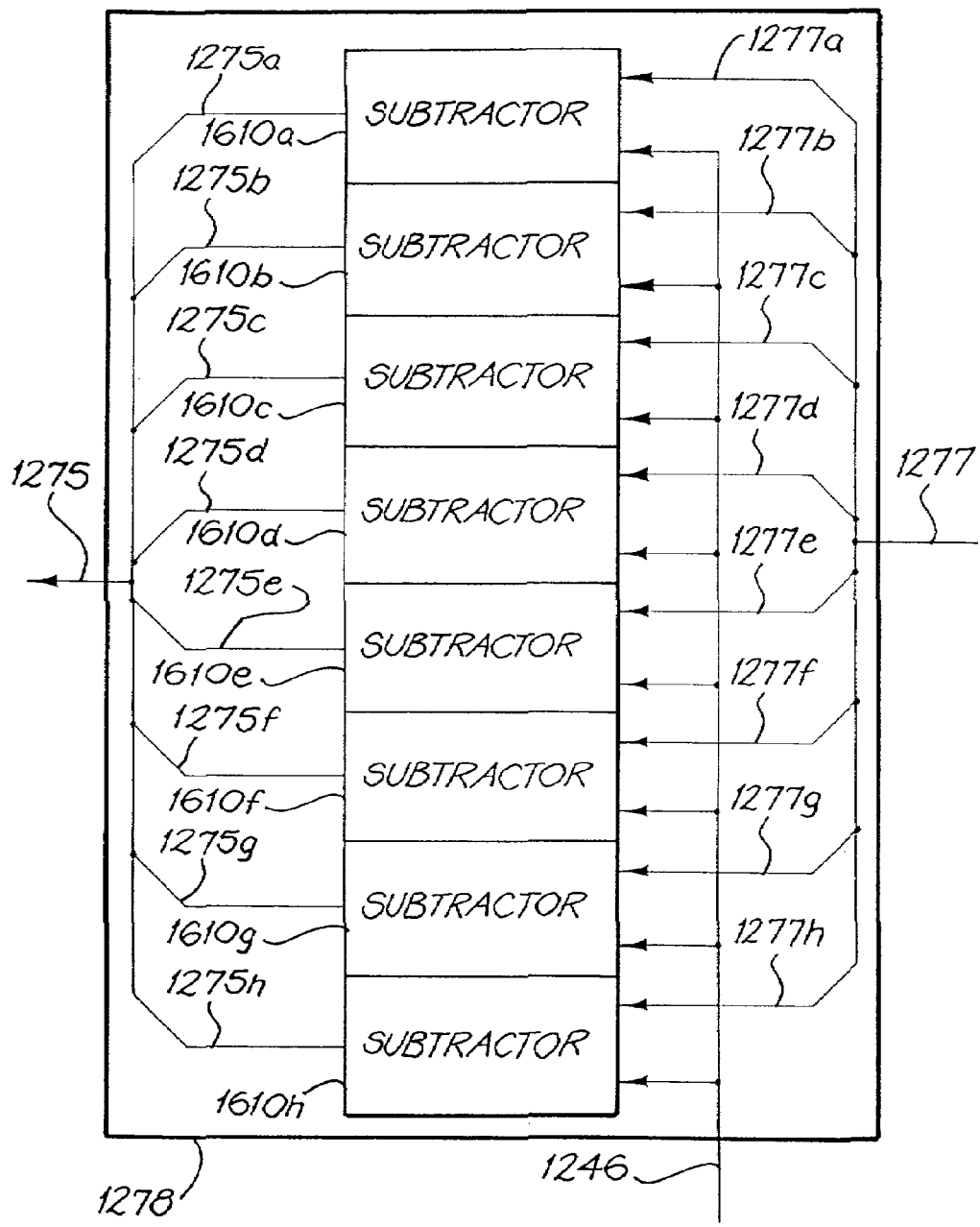
FIG. 13 is a schematic block diagram representation of Normalisation Subtractors of FIG. 4.

FIG. 13 shows Normalisation Subtractors 1278 of FIG. 4. The normalising output 1246 is presented as an input to each of the subtractors 1610a . . . 1610h. The output 1277 of the bank of multiplexers 1278a is presented as individual path metrics 1277a . . . 1277h, each of which is presented to corresponding subtractors 1610a . . . 1610h. The outputs 1275a . . . h of the subtractors 1610a . . . 1610h form the normalised path metrics 1275. The normalising subtractors 1278 are used to subtract the maximum path metric, calculated during the traversal of the trellis and presented as the normalising output 1246, from the new path metrics to ensure that the path metric values are retained within the dynamic range of the architecture.

Figure 14:
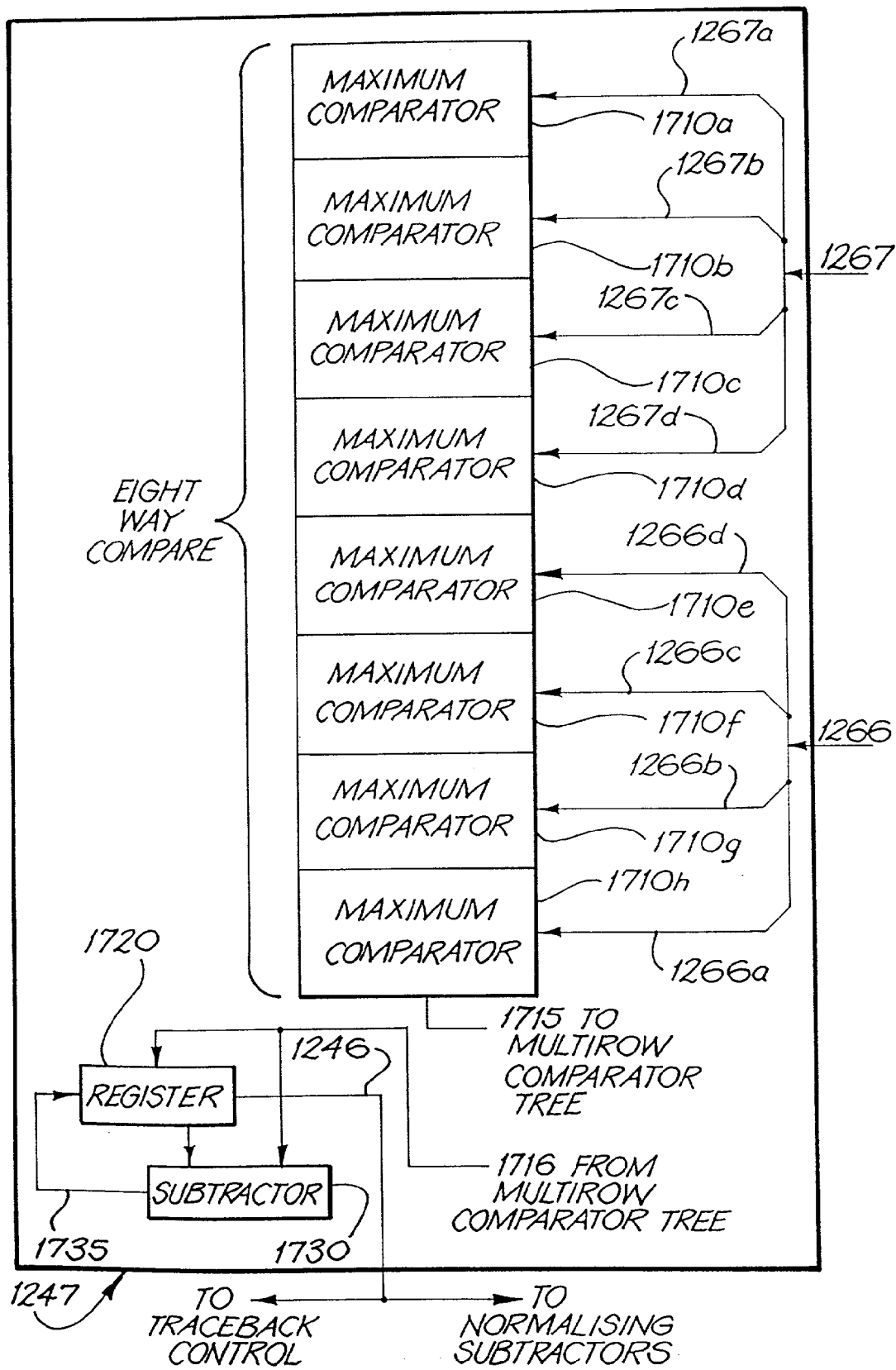
FIG. 14 is a schematic block diagram representation of a Comparator of FIG. 4.

FIG. 14 shows a comparator 1247 of FIG. 4, in accordance with a preferred embodiment of the invention. The butterfly path metrics presented on bus 1267 are fanned out to produce inputs 1267a . . . 1267d to corresponding maximum comparators 1710a . . . 1710d. Similarly, the butterfly path metrics presented on bus 1266 are fanned out to produce inputs 1266a . . . 1266d to corresponding maximum comparators 1710e . . . 1710h. The path metrics 1266a . . . 1266d and 1267a . . . 1267d are compared against one another and a maximum path metric 1715 is output to a multi-row comparator tree, shown in FIG. 17, which spans the decoder when operated in a multi-row configuration so as to capture the maximum path metric being calculated for the state of the trellis being investigated. An output 1716 from the multi-row comparator tree is presented to a register 1720, which stores the greatest path metric calculated during the traversal of the trellis. The output 1716 is also presented as an input to a subtractor 1730. The register 1720 provides a second input to the subtractor 1730, the input being the greatest path metric calculated thus far during the traversal of the trellis. The subtractor compares the greatest path metric calculated during the traversal of the trellis with the maximum path metric 1715 and if the maximum path metric 1715, which has just been calculated, is greater than the greatest path metric calculated during the traversal of the trellis, a load signal 1735 is enabled to the register 1720 so that the maximum path metric 1715 is loaded into the register 1720 to become the greatest path metric calculated during the traversal of the trellis. The register provides a further output, being a normalising output 1246, which is fed to the normalising subtractors 1278 and to the Intermediate Decoding Memory and Processor 1240. The normalising output 1246 is used to ensure that calculated path metric values remain within the dynamic range of the architecture.

Figure 15:
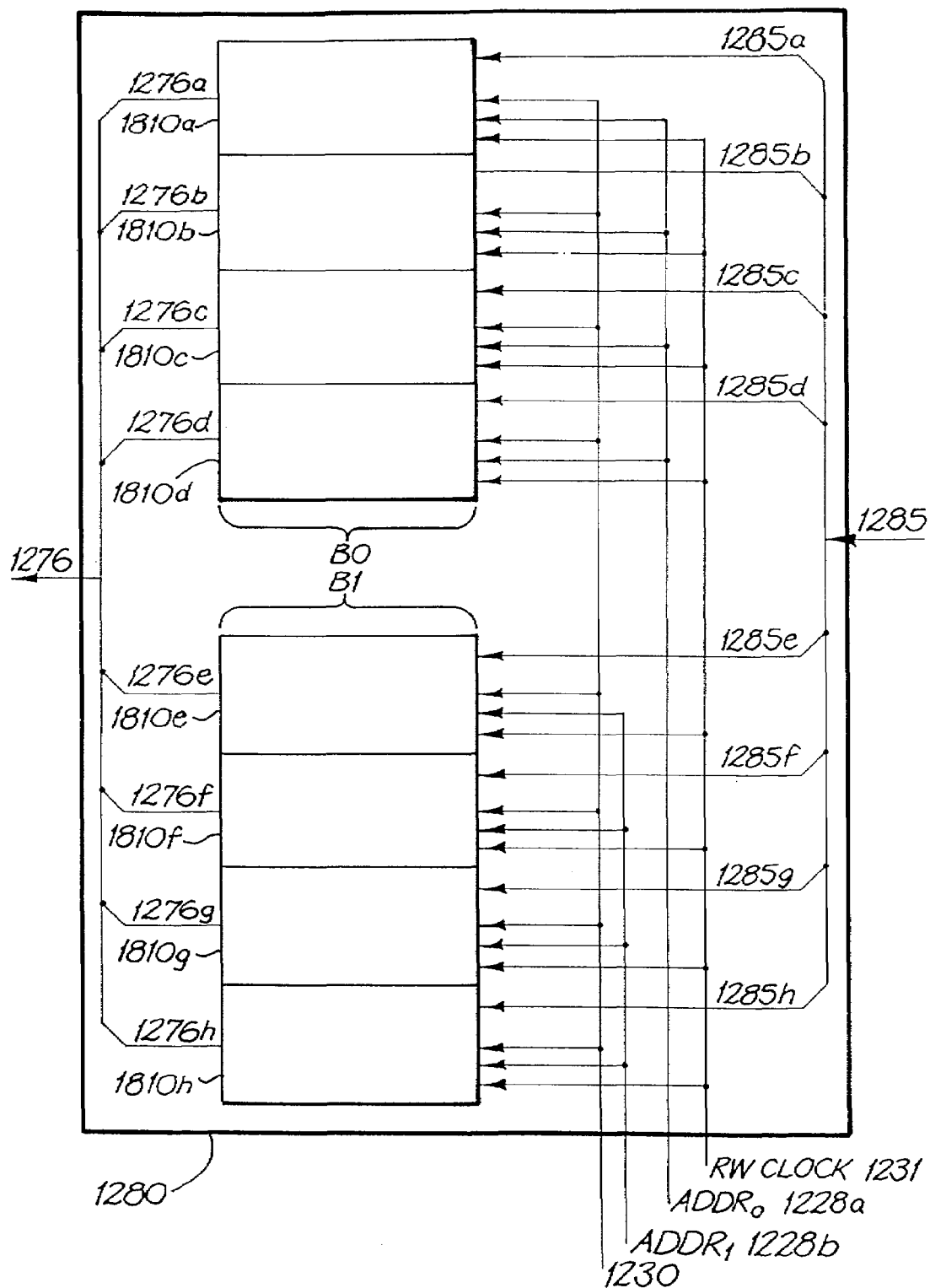
FIG. 15 is a schematic block diagram representation of a Path Metric Memory of FIG. 4.

FIG. 15 shows a path metric memory 1280 of FIG. 4, in accordance with a preferred embodiment. A path metric reset 1230 and path metric read/write clock 1231 are presented to each of the memory units 1810a . . . 1810h. The upper memory blocks 1810a . . . 1810d are clustered as B0, and receive an input ADDR0 1228a. Conversely, the lower memory blocks 1810e . . . 1810h are clustered to form B1, and receive a corresponding input ADDR1 1228b. The path metric store 1280 receives the forward trellis path metrics 1285, which fan out and provide a path metric 1285a . . . 1285h to each of corresponding memory blocks 1810a . . . 1810h, as shown in the diagram. The path metric store 1280 buffers the forward trellis path metrics 1285 for one trellis processing cycle and then produces outputs 1276a . . . 1276h, which are aggregated and form the stored path metrics 1276.

Figure 16:
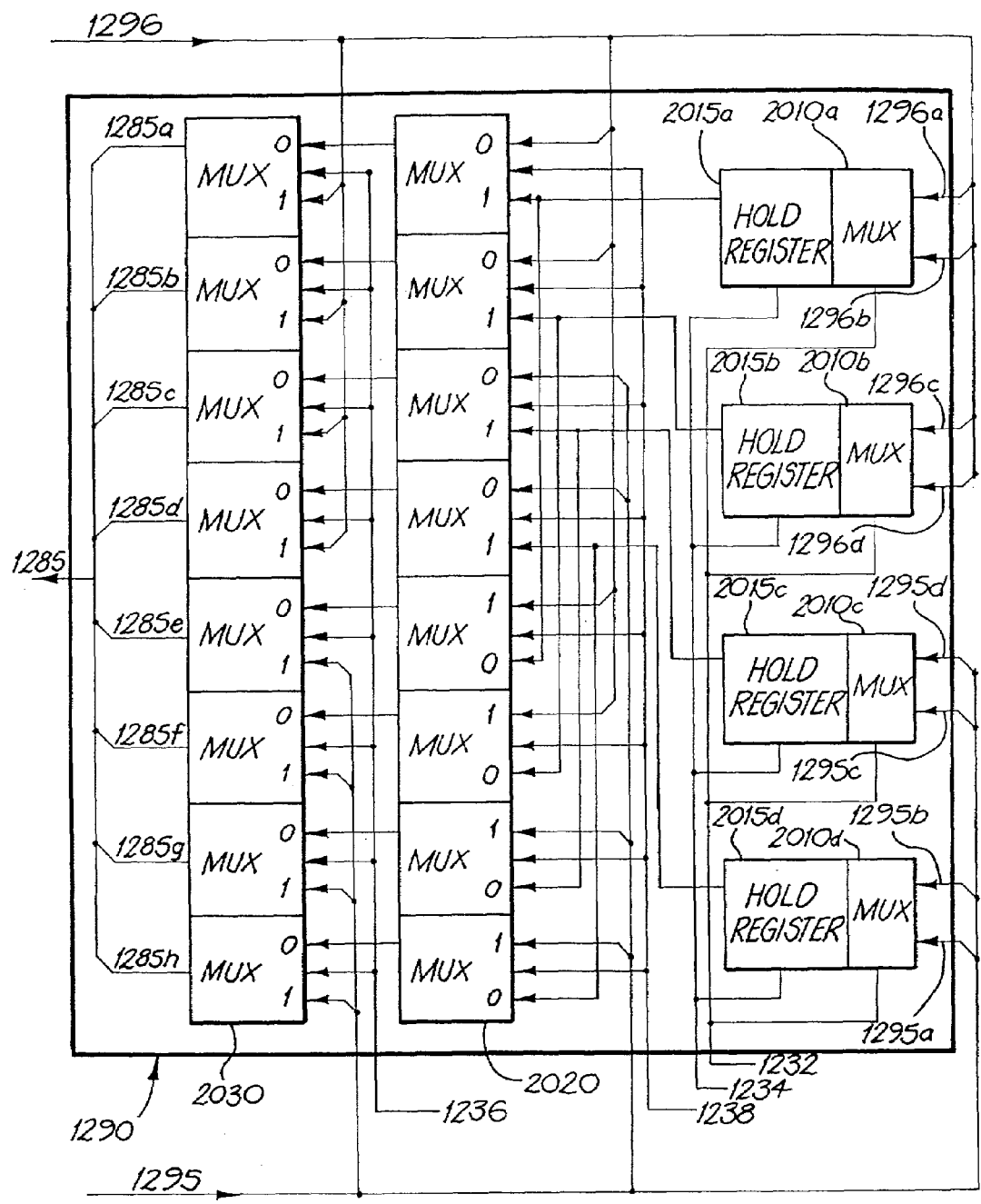
FIG. 16 is a schematic block diagram representation of a Forward Address Processor.

FIG. 16 shows a Forward Address Processor 1290 of FIG. 4, in accordance with a preferred embodiment of the present invention. The Forward Address Processor 1290 provides facilities for delaying and ordering path metrics to produce a desired pattern of path metrics. The Forward Address Processor 1290 is also capable of acting transparently when the decoder 1200 is operating in reverse trellis mode such that input path metrics are presented as outputs without alteration. The upper path metric bus 1296 is broken into its component path metrics 1296a . . . 1296d, which are presented, as indicated, to two multiplexers 2010a and 2010b, each of the multiplexers receiving two input path metrics. The lower path metric bus 1295 is broken into its constituent path metrics 1295a . . . 1295d and presented, as indicated, to two multiplexers 2010c and 2010d, each of the multiplexers receiving two input path metrics. The multiplexers 2010a . . . 2010d each receive a forward trellis select 1232, which indicates which of the presented path metrics 1296a . . . 1296d and 1295a . . . 1295d is to be selected.

Each of the multiplexers 2010a . . . 2010d feeds into a corresponding hold register 2015a . . . 2015d. The hold registers 2015a . . . 2015d each receive an input, being forward trellis hold 1234. The purpose of the multiplexers 2010a . . . 2010d and the hold registers 2015a . . . 2015d is to delay certain of the path metrics 1296a . . . 1296d and 1295a . . . 1295d by a clock cycle as part of the in-place path metric addressing.

Each of the hold registers 2015a . . . 2015d produces an output which is presented to a bank of multiplexers 2020 as indicated. The other inputs to the bank of multiplexers 2020 are the constituent path metrics of the upper path metric bus 1296 and the lower path metric 1295, also as shown. A path metric input multiplexer select 1238 is broadcast to the bank of multiplexers 2020. The bank of multiplexers 2020 produces outputs to a second bank of multiplexers 2030, whose other inputs are the constituent path metrics of upper path metric bus 1296 and lower path metric bus 1295. A forward trellis transparent bit 1236 is provided to the second bank of multiplexers 2030 and is used to effect a transparent path when the decoder 1200 is operating in the reverse trellis mode. The bank of multiplexers 2030 produces path metrics 1285a . . . 1285h, which are collated to form the forward trellis path metrics 1285, being the output of the Forward Address Processor 1290.

Figure 17:
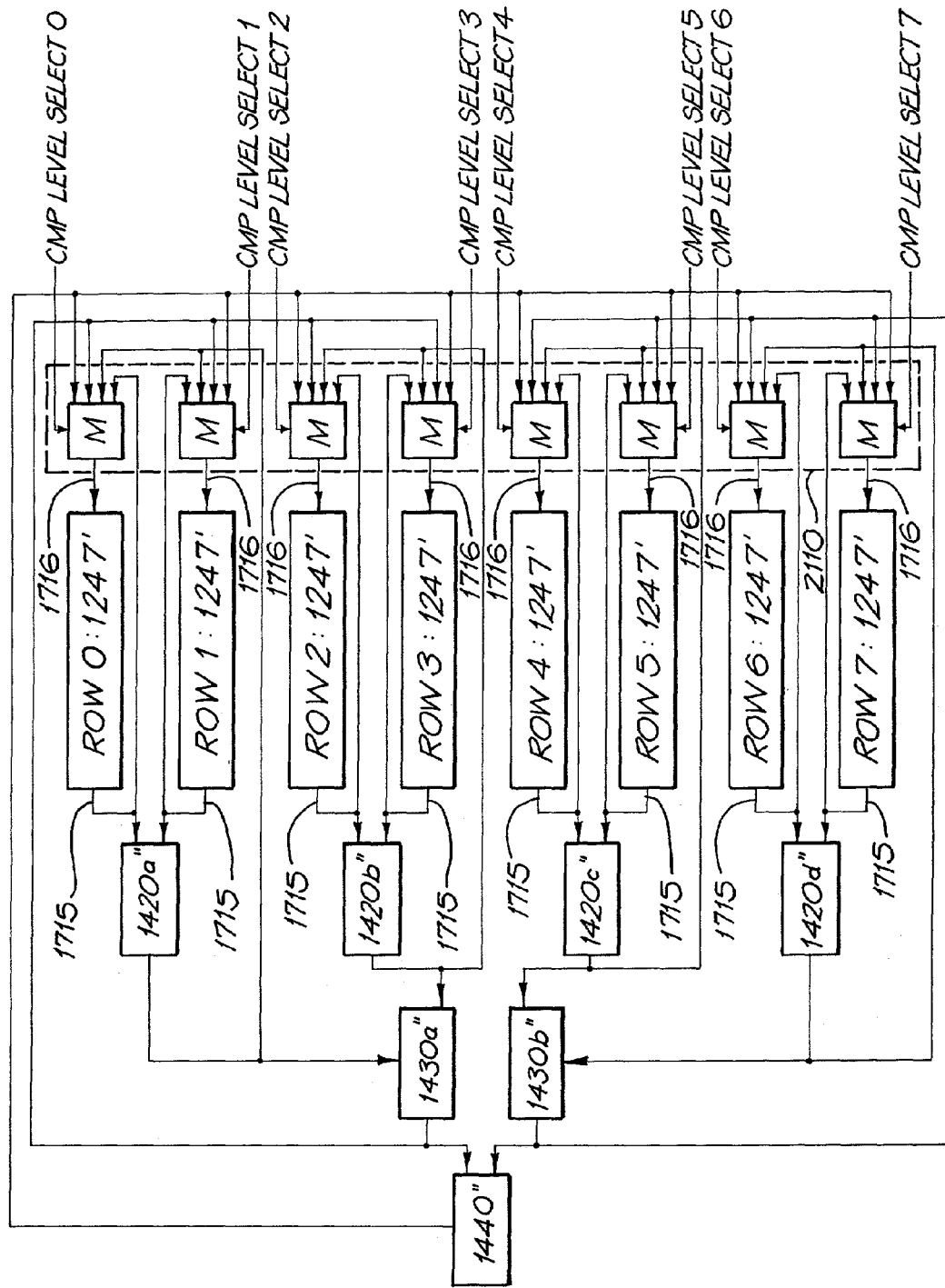
FIG. 17 is a schematic block diagram representation of a Comparator (ACS level) of FIG. 4.

FIG. 17 shows the Comparator 1247 of FIG. 4, when used in an eight row decoder configuration. The comparators 1247' in each of the rows are interconnected via a bank of multiplexers 2110. Each multiplexer 2110 presents a single input 1716 to a corresponding comparator 1247' in its corresponding decoder row. Pairs of comparators 1247' present their outputs 1715 as inputs to ACS node units 1420a", 1420b", 1420c" and 1420d", each of which spans two rows of the decoder. The outputs 1715 of the comparators 1247' are also presented as recursive inputs to the bank of multiplexers 2110. The ACS nodes units 1420a", 1420b", 1420c" and 1420d" are paired and present their outputs as inputs to further ACS nodes units 1430a" and 1430b". The outputs of the ACS node units 1420a", 1420b", 1420c" and 1420d" are also presented as recursive inputs to the bank of multiplexers 2110. The ACS node units 1430a" present their outputs to a final ACS node unit 1440" and as recursive inputs to the bank of multiplexers 2110. The output of the final ACS node unit 1440" is presented as a final recursive input to the bank of multiplexers 2110. Each multiplexer 2110 is presented with a select signal.

Figure 18:
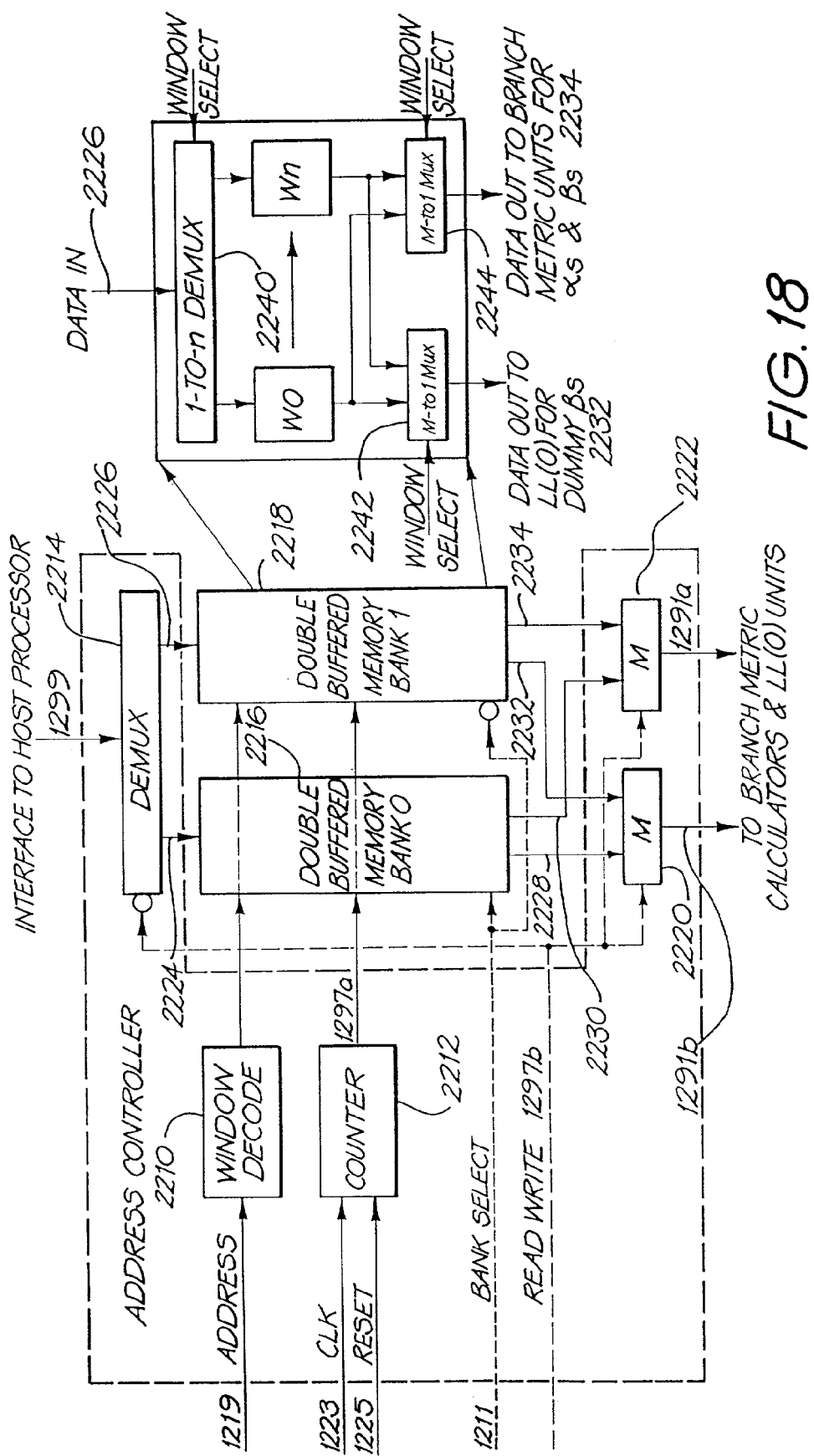
FIG. 18 is a schematic block diagram representation of an Input Symbol History of FIG. 4.

FIG. 18 shows the configuration of the Input Symbol History 1298, including an address controller, of FIG. 4. An Input Symbol History Address 1219 is presented as an input to a Window Decoder 2210, which decodes the address to enable access to a first double buffered memory bank-0 2216 and a second double buffered memory bank-1 2218. The Input Symbol History 1298 double buffers received input to ensure that a continuous data flow is maintained. Input Symbol History clock 1223 and Input Symbol History reset 1225 are presented to a counter 2212, whose output 1297a is also presented to the double buffered memory bank-0 2216 and the double buffered memory bank-1 2218. Input symbols 1299 are presented from a host processor to a demultiplexer 2214. The demultiplexer 2214 produces an output 2224 to double buffered memory bank-0 2216 and the second output 2226 to a double buffered memory bank-1 2218. The demultiplexer 2214 also receives as an input a read/write signal 1297b. The read/write signal 1297b also feeds a first multiplexer 2220 and a second multiplexer 2222. Each of the double buffered memory banks 2216 and 2218 is presented with a bank select signal 1211, with the bank select signal 1211 being inverted at the interface to double buffered memory bank-1 2218.

Double buffered memory bank-0 2216 produces a first output 2228 to the multiplexer 2220 and a second output 2230 to a second multiplexer 2222. Double buffered memory bank-1 2218 produces a corresponding first output 2232 which feeds multiplexer 2220 and a second output 2234 which is presented to the second multiplexer 2222. The first multiplexer 2220 produces an output 1291b which is presented as an input to LogLikelihood processor-0 1250b. The second multiplexer 2222 produces an output 1291a which is presented as an input to the butterfly processors 1260.

FIG. 18 also shows an exploded view of the double buffered memory bank-1 2218. Incoming data 2226 is presented to a 1-to-n demultiplexer 2240, which also receives a window select, being the output of the window decode 2210. N outputs from the demultiplexer 2240 are presented to n corresponding windows W0 . . . Wn, each of which produces an output which is presented to a first m-to-1 multiplexer 2242 and a second m-to-1 multiplexer 2244. Each of the m-to-1 multiplexers 2242, 2244 also receives a window select input signal. The first m-to-1 multiplexer 2242 produces the output 2232 which is used for the dummy beta calculations and is destined for the LogLikelihood ratio processor-0 1250a. The second m-to-1 multiplexer 2244 produces the output 2234, which is used for calculating alphas and betas in the branch metric units of the butterfly processors 1260.

Figure 19:
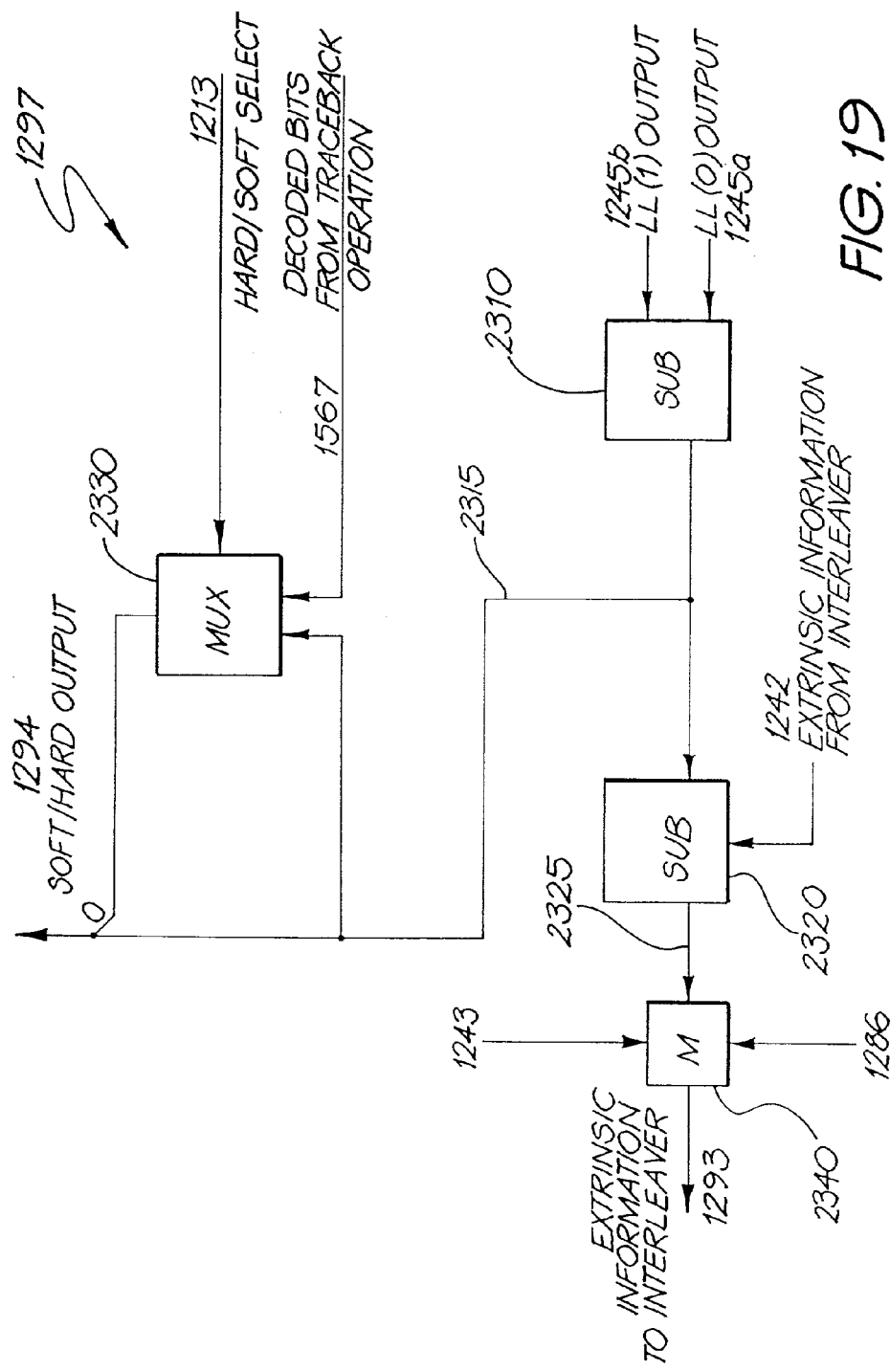
FIG. 19 is a schematic block diagram representation of a LogLikelihood Ratio Processor of FIG. 4.

FIG. 19 shows the LogLikelihood ratio processor 1297 of FIG. 4. The LogLikelihood ratio processor 1297 receives inputs 1245a and 1245b, which are output from LogLikelihood processor-0 1250a and LogLikelihood processor-1 1250b, respectively. The LogLikelihood ratio processor 1297 also receives as inputs the extrinsic information 1242, the hard or soft output select 1213, Spreading Input 1243, the Traceback Process Output 1567 and Scramble Address Data 1286.

A subtractor 2310 receives the inputs 1245a and 1245b, representing the likelihood of a "1" and a "0", respectively, and produces an output 2315 which feeds a second subtractor 2320. The output 2315 of the subtractor 2310 also feeds a first multiplexer 2330 and forms part of an output 1294. The second input to the subtractor 2320 is the extrinsic information 1242. The output 2325 of the subtractor 2320 is presented to a second multiplexer 2340.

The Traceback Process Output 1567 is presented as a second input to the first multiplexer 2330. The hard or soft output select 1213 is presented as the select input of the multiplexer 2330 and the output of the multiplexer 2330 forms the zero bit of the decoded output 1294. The output 2315 of the subtractor 2310 is combined with the least significant bit of the output of the multiplexer 2330 to form a multi-bit decoded output 1294.

The second multiplexer 2340 receives Scramble Address Data 1286 as its second input and Spreading Input 1243 as its select signal. The second multiplexer 2340 produces an output 1293, which is fed from the LogLikelihood ratio processor 1297 to the Intermediate Decoding Result and Memory 1240.

The embodiment shown in FIG. 3 operates in a five-phase mode. As no loglikelihood processors are present, more path metric memory is required to store more alphas and betas in the computations performed by LogLikelihood Processors 1250a and 1250b in the embodiment of FIG. 4, which operates in a two-phase mode.

OPERATION

The first step in the operation of the decoder 1200 is to initialise the decoder such that the architecture embodies the required configuration of either convolutional decoding or turbo decoding. The variables available for manipulation include the number of columns needed for the trellis size in question, the number of states in the trellis, the mask for the appropriate number of bits to be used in the addressing of the columns in the path metric memory and the decision depth of the traceback process. The register which holds the winning path metric for the symbol being processed is initialised and sequential numbers are assigned to a register bank whose values are permuted between every symbol time to reflect the column address sequence required for each trellis operation.

It is to be noted that the decoder 1200 can operate in either the forward or reverse trellis direction.

In the case in which the trellis is being navigated in the forward direction, the Reverse Address Processor 1270 is configured to operate in transparent mode by setting the Reverse Trellis Transparent Bit 1226. When navigating the trellis in the forward direction, the sequential numbers are rotated to the left after their first use.

An iterative process begins by reading the path metrics from the column of the path metric store 1280 B0 and B1 corresponding to the number of the iteration. The sequential list of path metrics held in the first column of 1280 B0 and 1280 B1 are presented to the butterfly processors 1260. The butterfly processors 1260 produce, via the bank of multiplexers 1250c, new path metrics, which are no longer in sequential destination state order and are fed into the Forward Address Processor 1290. The Forward Address Processor 1290 essentially performs a sort operation on each column of new path metrics with the resultant effect being that the columns in the path metrics memory 1280 B0 and B1 represent a set of sequential states when reading down the column. During each column operation, as shown in FIGS. 7A–E, half of the eight new path metrics are written directly into the path metric store 1280, whilst the remaining new path metrics are written into the hold registers 2015a... 2015d within the Forward Address Processor 1290. This alternates between each group of path metrics.

The navigation through the forward trellis requires a number of column iterations, being one more than the number of columns needed for the particular trellis in question. If the number of iteration is even, path metrics from buses 1296A, C, E, G are written into the column of path metric store 1280 B0 corresponding to the number of the iteration. Path metrics from the buses 1296B, D, F, H are contemporaneously written into the hold registers 2015a... 2015d of the Forward Address Processor 1290.

If, however, it is an odd iteration, the path metrics from buses 1296A, C, E, G are written into the hold registers 2015a... 2015d of the Forward Address Processor 1290 and path metrics from buses 1296B, D, F, H are written into the column of the path metric store 1280 corresponding to the number of the iteration.

During the column operations, the decision bits 1255 generated by the ACS units of the butterfly processor 1260 are grouped into a byte and written into the Intermediate Decoding Memory and Processor 1240. The next iteration in the process begins by reading the column address from the path metric store 1280 B0 and B1 corresponding to the number of the next iteration. The iterative process continues until the number of column iterations corresponds to one more than the number of columns required for the trellis being calculated.

A further write operation is required at the end of the iterative process to transfer the four new path metrics in the hold register of the Forward Address Processor 1290. The four new path metrics are written into the final column of path metric store memory 1280 B1. The final result is that the new path metrics have been written into path metric store 1280 B0 and B1, albeit in a different column order. However, it is to be noted that the order within each column has not changed.

When the trellis is being navigated in the reverse direction, the sequential numbers are rotated to the right and then used for the first time. A group of four path metrics are fetched from the first column of path metrics 1280 B0 and are placed in the holding registers within the Reverse Address Processor 1270. The Forward Address Processor 1290 is configured to operate in a transparent mode by setting the forward trellis transparent bit 1236. The corresponding reverse trellis transparent bit 1226 is set such that Reverse Address Processor 1270 is enabled. The navigation through the reverse trellis is described in FIGS. 8A–8F.

Navigating the trellis in the reverse direction requires a number of iterations corresponding to one more than the number of columns required for the particular trellis. When navigating the trellis in the reverse direction, the in-place path metric system always presents a scrambled list of path metrics through the Reverse Address Processor 1270 to produce a non-sequential list of path metrics to the butterfly processors 1260. The resultant trellis state ordering produced by the butterfly processors 1260 is trellis state sequential.

In the event that an even iteration is being undertaken, the column in the path metrics store 1280 B0 corresponding to the number of iterations plus one is read and passed through the multiplexers 1278a, normalising processors 1278 and the Reverse Address Processor 1270 to the butterfly processors 1260. The path metrics currently held in the Reverse Address Processor 1270 are also read into the butterfly processor 1260. The column in path metric store 1280 equivalent to the number of the iteration is read and written into the hold register of the Reverse Address Processor 1270.

In the case that the number of the iteration is odd, the column of path metric store 1280 B1 corresponding to the number of the iteration plus one is read and passed through the multiplexers 1278a and normalising processors 1278 to the Reverse Address Processor 1270 and then to the butterfly processor 1260. The path metrics held in the Reverse Address Processor 1270 are also presented as inputs to the butterfly processor 1260. The column of path metrics store 1280 B0 corresponding to the number of the iteration is read and written into the hold register of the Reverse Address Processor 1270.

At this point of the navigation of the reverse trellis, the sequential list of path metrics held in the first column of path metric stores 1280 B0 and B1 is presented to the Reverse Address Processor 1270. The Reverse Address Processor 1270 performs a sort operation on each column of new path metrics to the effect that the resultant columns presented to the butterfly processor 1260 are no longer in sequential destination state order. The butterfly processor 1260 produces eight new path metrics, which are presented, via a bank of multiplexers 1250c, to the Forward Address Processor 1290. The Forward Address Processor 1290 is in transparent mode, so the trellis-state sequential list of path metrics produced by the butterfly processors 1260, via the bank of multiplexers 1250c, is written back into the path metric stores 1280 B0 and B1. The path metrics stores 1280 B0 and B1 represent a set of sequential states when reading down the column.

During the column operations, the decision bits 1255 generated by the ACS units of the butterfly processors 1260 are grouped into a byte and presented to the Intermediate Decoding Memory and Processor 1240. The next iteration commences by reading the appropriate column of path metrics from path metric stores 1280 B0 and B1.

At the conclusion of the iterative process, the new path metrics are back in path metrics store 1280 B0 and B1, albeit in a different column order. It is to be noted that the ordering within each column has not changed.

The traceback processor 1510 within the Intermediate Decoding Memory and Processor 1240 knows the trellis processing direction and the bit location of the decision bit as it performs the well known pointer based traceback operation. The decision bit is extracted from one byte and is used to generate the next pointer into the traceback memory 1530. Traceback terminates when a predefined traceback depth has been achieved. The traceback depth is typically between five and nine times the constraint length of the code.

When the decoder 1200 is being used for turbo decoding, the processing is broken into two distinct phases: dummy-beta/alpha processing and beta/LLR processing. When either the forward trellis or the reverse trellis operation is mentioned the above processing occurs, but only for the degenerate case of when the number of trellis states matches the number of ACS units ACS0 . . . ACS7 in a multiple (power of 2) of the ACS unit size of the butterfly processors 1260. The LogLikelihood processor-0 1250a and the ACS units within the butterfly processor 1260 are each equipped with registers to allow the respective ACS units to accumulate results needed for alpha and beta calculations.

The calculation of dummy-betas and alphas occur in parallel. The LogLikelihood processor-0 1250a performs a dummy beta calculation using the leaf ACS units at its disposal. This calculation requires access to the input symbol history buffer and the Intermediate Decoding Memory and Processor interleaver memory, each of which is a windowed memory system. The input symbol history buffer is organised into banks 2216 and 2218 of the size of a processing window. The LogLikelihood processor-0 1250a accumulates dummy betas by processing at time t the window to be processed at time t+1. The LogLikelihood processor-0 1250a does not need to access the path metric stores 1280, which is why the LogLikelihood ratio processor-0 1250a can operate in parallel to the ACS units contained within the Butterfly processors 1260.

The LogLikelihood ratio processor-0 1250a performs normalisation on the dummy beta values by using the adders in the ACS tree to determine the maximum beta calculated. This value is then subtracted from the inputs to the leaf ACS units of the LogLikelihood ratio processor-0 1250a before they are used.

The butterfly processors 1260 perform alpha computations, accumulating alpha values in the registers contained within constituent ACS units. The butterfly processors 1260 perform the forward trellis operation and normalisation as is usual during the forward trellis navigation.

The dummy betas calculated by the LogLikelihood ratio processor-0 1250a are presented to the butterfly processors 1260 at the start of the beta calculation phase.

During calculation of the betas, both LogLikelihood processors 1250a and 1250b are used in conjunction with the butterfly processors 1260. Each of the LogLikelihood processors 1250a, 1250b accepts alphas from the path metric store 1280, betas resulting from the previous clock cycle and extrinsic information 1242 produced from the Intermediate Decoding Memory and Processor 1240 to create a LogLikelihood result for a "1" and "0", respectively. The LogLikelihood calculations can span multiple rows since they are determining the maximum result over all the states.

Beta computations work in the reverse direction through the input symbol history window, compared to the alphas, and use gammas used in the alpha calculations. The beta computations use the same trellis branch metric assignments that were used for the alpha calculations.

When the whole block of input history has been processed and the resultant outputs have been fed into the interleaver 1520, the process is able to commence for the second half of the turbo decoder operation. The interleaver operation during first decoder operation is read sequentially and written sequentially. During second decoder operation, the interleaver is read from and written to, albeit using the random address sequence as determined by the scrambler address output. During second decoder operation, the read and write addresses are the same. The interleaver operation after the first decoder writes in sequentially and reads out randomly, as per the predefined spreading sequence which is used to give the first and second decoders their statistical independence. The interleaver operation for the second decoder writes randomly, as per the spreading sequence, and reads sequentially.

It is to be noted that because the encoders used for turbo encoding do not have to be the same, the decoding rates and constraints of the second decoder need not necessarily be the same as those for the first decoder. This may require that the configuration of the turbo decoder be changed between block processing operations. If this is the case, it is easily dealt with by manipulating the contents of the configuration registers.

Each block of input symbol history requires several complete turbo iterations in order to be decoded to within an acceptable bit error rate. The number of iterations required is configurable to ensure that the required bit error rate is achieved.

A benefit of the architecture in question is that it only requires two phases to complete one turbo decode iteration. This provides flexibility in the use of the architecture and allows the number of decoder rows used to be traded for the number of iterations required. For example, a turbo decoder that does four iterations may be implemented using two decoder rows requiring two iteration times.

Figure 20A:
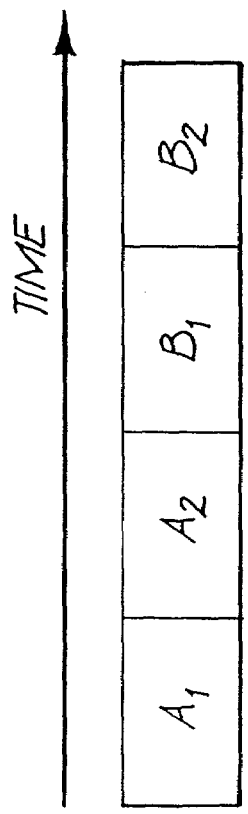
FIGS. 20A and 20B illustrate use of multiple decoders to implement a single Turbo decoder.

LogMAP computation is performed using a sliding window algorithm. The sliding window algorithm is implemented in 2 phases. In a single decoder this results in increased latency: 2 passes over each window as shown in the configuration (with only a single decoder being used) in FIG. 20A. The first pass computes the dummy beta values and the forward alpha values in parallel and stores the forward alpha values in the alpha memory (NOTE: this memory is the same memory as used in the Viterbi algorithm for path metric storage). The second pass reads the alpha values and computes the beta values according to the LogMAP algorithm and outputs LogLikelihood ratios (LLR).

Figure 20B:
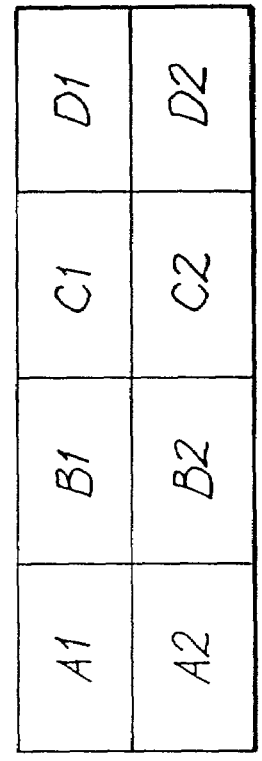

When multiple decoders are used, the computation of the two phases can be overlapped and the decoder can process a single block with reduced latency. Multiple decoders can operate separately on different data streams or they can co-operate to increase the decoding speed of a single stream, as shown in the configuration of FIG. 20B. The implementation shown in FIG. 3 can process 4 independent streams or 2 streams with increased speed (and reduced latency) or 1 stream with further increased speed (and minimal latency).

Table 1 demonstrates the flexibility of the unified decoder to support multiple encoded streams simultaneously. For example, a decoder with 4 decoder rows can process up to 4 data streams at the same time. Furthermore, the decoder rows can operate together to decode fewer streams at higher throughput. This is useful for minimizing the latency of voice decoding. Table 1 demonstrates the flexibility of this approach and the appropriate decoding speed-up obtained in each case. (Again—this list is by no-means complete—more decoder rows can be connected together to achieve even greater flexibility.)

TABLE 1

Example decoding configurations of multi-bank interconnected decoders.

| Scenario | Decoder Configuration | Decoding Speed-Up (over convolutional/ turbo on 1 decoder) |
|---|---|---|
| 1 convolutional | 4 decoders per stream | 4X (conv) |
| 2 convolutional | 2 decoders per stream | 2X (conv), 2X (conv) |

TABLE 1-continued

Example decoding configurations of multi-bank interconnected decoders.

| Scenario | Decoder Configuration | Decoding Speed-Up (over convolutional/ turbo on 1 decoder) |
|---|---|---|
| 3 convolutional | 1 decoder for 2 streams, 2 decoders for 1 stream | 1X (conv), 1X (conv), 2X (conv) |
| 4 convolutional | 1 decoder per stream | 1X, 1X, 1X, 1X |
| 1 turbo | 2 decoders per stream | 2X (turbo) |
| 2 turbo | 1 decoder per stream | 1X, 1X |
| 4 turbo | 1 decoder per stream | 1X, 1X, 1X, 1X |
| 1 convolutional & 1 turbo | 1 decoder conv, 2 decoders turbo | 1X (conv), 2X (turbo) |

Figure 21:
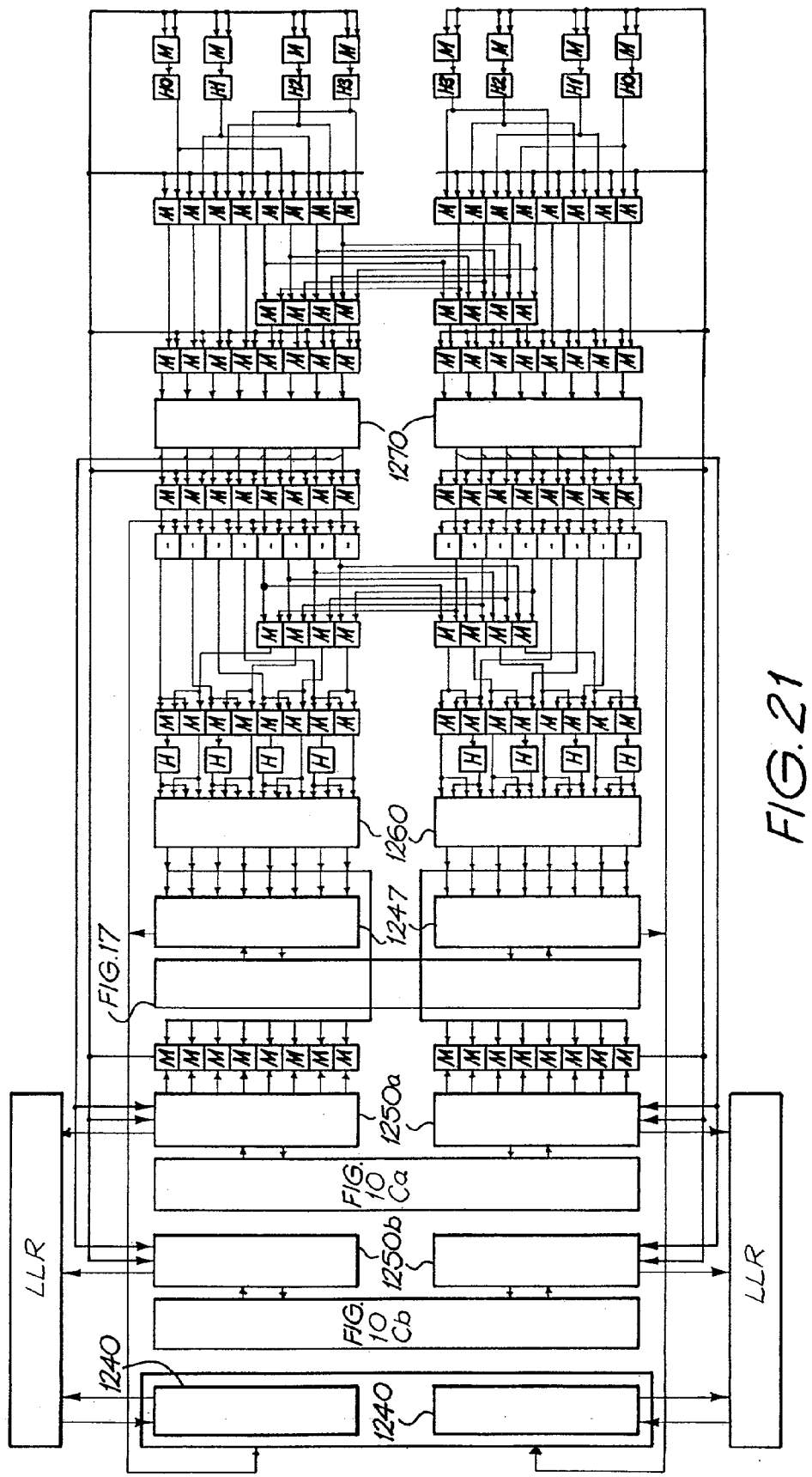
FIG. 21 is a schematic block diagram representation of two interconnected decoders operating together as a single decoder (16-state trellises every cycle)
Figure 22:
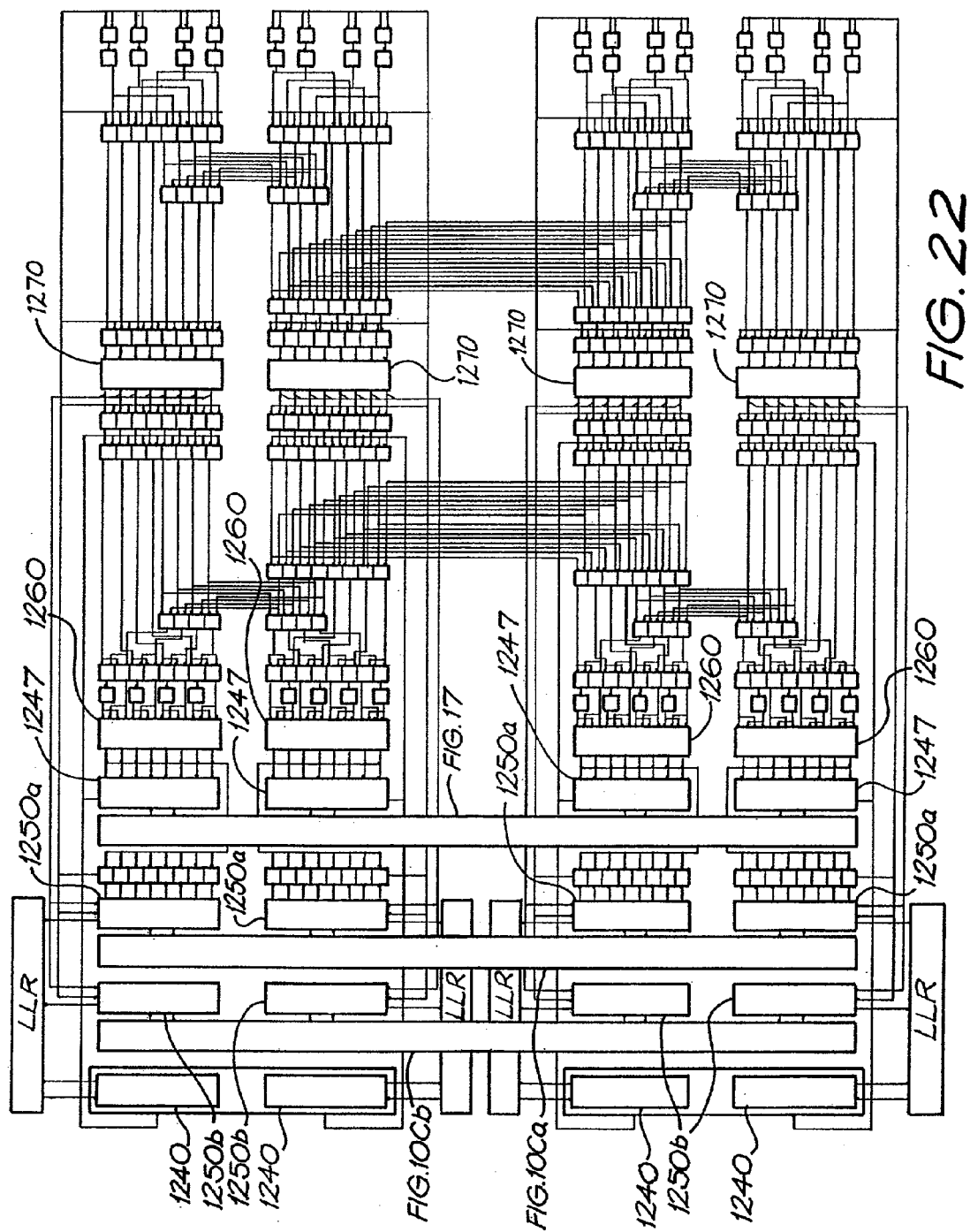
FIG. 22 is a schematic block diagram representation of four interconnected decoders operating together as a single decoder for even higher performance decoding (32-state trellises every cycle)

To demonstrate how 2 or 4 decoders can co-operate to decode fewer data streams at a higher speed, FIG. 21 shows the interconnections between two decoders. The boxes marked "M" are multiplexers that enable some of the path metrics from adjacent decoders to be swapped before writing to the path metric memories. In this manner, the decoders can operate as a single decoder. Furthermore, FIG. 22 shows how 4 decoders can be interconnected to function as either a single decoder, two separate decoders, or 4 separate decoders.

To demonstrate the multi-standard nature of the unified decoder, the decoder can support any combination of the standards shown in Table 2. (This list is by no means complete—but is included to demonstrate the flexible (and therefore useful) nature of this unified decoder).

TABLE 2

Example of standards supported by unified decoder.

| Standard | Code Rate | Constraint Length |
|---|---|---|
| GSM - full-rate voice | ½ | 5 |
| GSM - half-rate voice | ⅓ | 7 |
| GSM - data full-rate (9.6 Kbps) | ½ | 5 |
| GSM - data full rate (4.8 Kbps) | ⅓ | 5 |
| GSM - data full rate (2.4 Kbps) | ⅙ | 5 |
| GPRS - CS-1 | ½ | 5 |
| EDGE - MCS (1–9) | ⅓ | 7 |
| GSM-AMR TCH/AFS6.7 | ¼ | 7 |
| GSM-AMR TCH/AFS5.15 | ⅕ | 7 |
| UMTS Voice (slotted) | ½ | 9 |
| UMTS Voice (normal) | ⅓ | 9 |
| UMTS Data (Turbo) | ½ | 4 |
| UMTS Data (Turbo) | ⅓ | 4 |
| CDMA 2000 Voice | ½ | 9 |
| CDMA 2000 Voice | ¼ | 9 |
| CDMA 2000 Data (Turbo) | ¼ | 4 |

The unified decoder 900 implements the decoding required for convolutional encoded and turbo encoded data streams and can support multiple data streams and multiple voice streams simultaneously. When decoding Turbo-encoded data streams, this decoder implements an iterative Turbo decoder using either the MAX-LOG MAP or the LOG-MAP soft-output MAP algorithms. The decoder maximizes the re-use of its components to enable the efficient implementation of both convolutional and turbo decoding systems.

The decoder can be dynamically partitioned, as required, to decode voice streams for different standards. The decoder can process streams with different coding rates (rate ½, rate ⅓, rate ¼, etc.). It can also process streams encoded with different constraint lengths. As such, the unified decoder architecture is capable of supporting each of the mobile wireless standards currently defined: first, second and third generation for both voice and data.

Figure 23A:
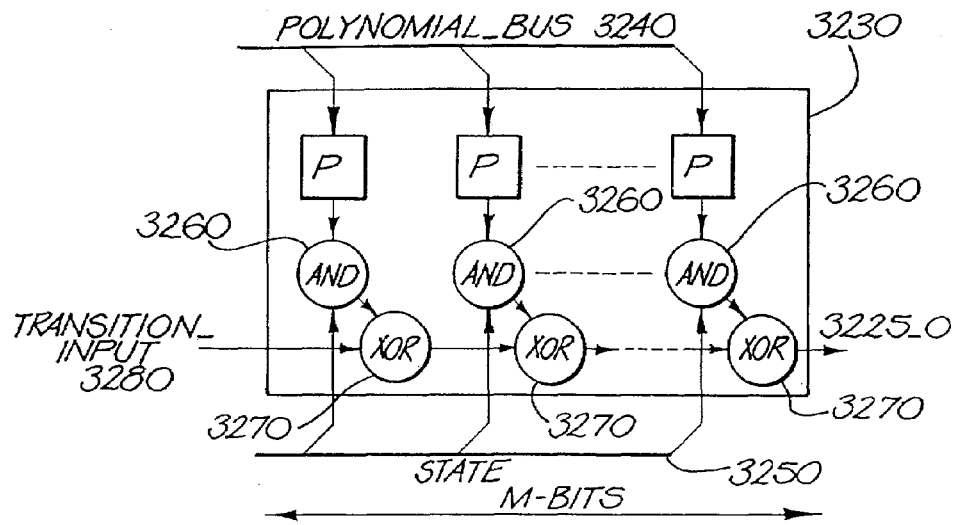
FIGS. 23A and 23B are schematic block diagram representations of a non-systematic encoder.

The unified decoder architecture of the preferred embodiment encapsulates the functionality of non-systematic (feed forward) encoders and systematic encoders (feed backward) in a single architecture. FIG. 23A shows mixing of polynomials 3240 and state bits 3250 to produce a single code bit 3225_0 of a code word 3225. Polynomials 3240 are presented to corresponding AND gates 3260, which also receive states 3250 as inputs. Each of the AND gates 3260 produces an output to a corresponding XOR gate 3270. Each XOR gate 3270 also receives a TRANSITION INPUT 3280 and produces an output 3225_0 of the M-bit non-systematic encoder 3230.

Figure 23B:
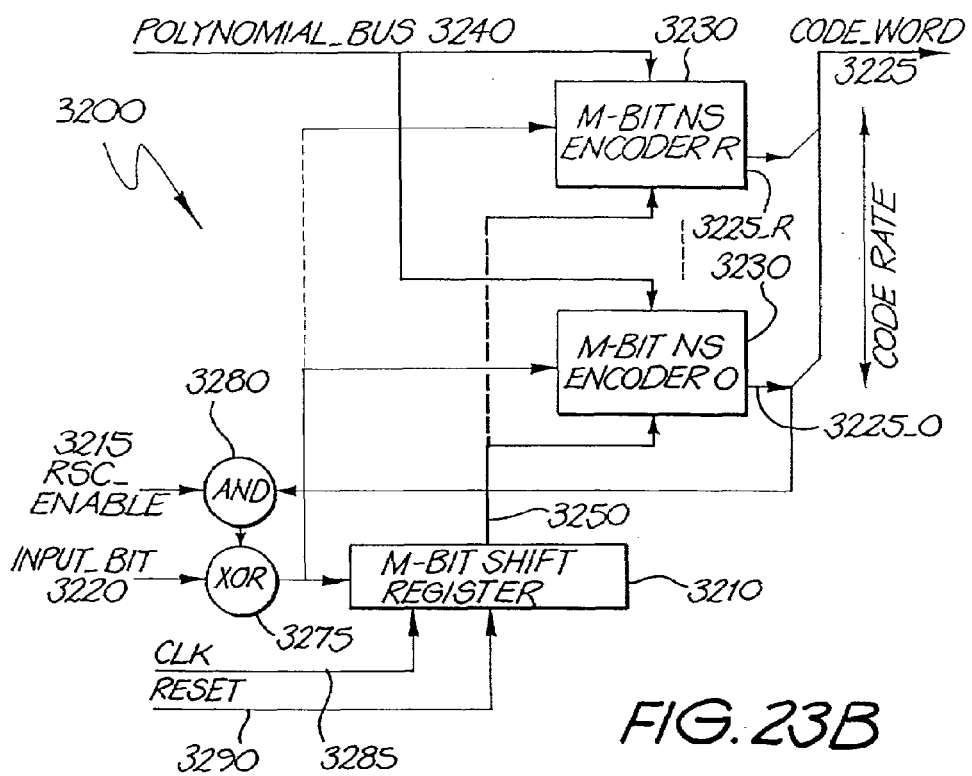

FIG. 23B shows a whole encoder 3200 for a code word 3225. Polynomials 3240 are presented to corresponding M-bit non-systematic encoders 3230. An input bit 3220 is presented to an XOR gate 3275. A RSC_ENABLE signal is presented to an AND gate 3280, the output of which is the second input of the XOR gate 3275. The AND gate 3280 also receives as an input the output of the encoders 3230. The XOR gate 3275 presents an output to an M-bit shift register 3210 and to each of the encoders 3230. The M-Bit Shift Register 3210 also receives a clock signal 3285 and a reset signal 3290 and holds a state of the encoder 3200 at a time T. The state value is used in conjunction with each particular polynomial 3240 (as specified by a particular code) to produce a non-systematic code bit. The output 3250 of the register 3210 is broadcast to each of the encoders 3230. The outputs 3225_0 . . . 3225_R of the encoder 3230 are collated to form the CODE_WORD 3225.

By enabling the RSC_ENABLE 3215, the encoder 3200 becomes a recursive, systematic (RS) encoder. In a recursive, systematic code, the input bit 3220 forms the systematic bit of a code word 3225. The generated bits of each M-Bit Encoder 3230 form the remainder of the RS code word 3225.

In the case of a non-systematic encoder the CODE_WORD 3225 would contain R bits (where R=the rate of the code). When the RSC_ENABLE 3215 is active, the CODE_WORD 3225 is typically 1-bit wide. The output CODE_WORD 3225 (in this case 1-bit wide) and the INPUT_BIT 3220 form the RS code word.

It is apparent from the above that the embodiment(s) of the invention are applicable to the decoding of multiple wireless transmission standards using a unified, scalable architecture.

The foregoing describes only one embodiment/some embodiments of the present invention, and modifications and/or changes can be made thereto without departing from the scope and spirit of the invention, the embodiment(s) being illustrative and not restrictive.

We claim:

1. A reconfigurable architecture for decoding data communications signals transmitted according to one of a plurality of coding schemes, said coding schemes comprising convolutional and turbo codes, said architecture comprising:
a trellis processing arrangement for receiving an input signal derived from said transmitted signals and new path metrics for determining intermediate decoded results using said new path metrics;
an intermediate store for receiving modified decoded results and for providing a decoded output; and
control processor means coupled to said trellis processing arrangement and operable to configure said architecture for one of convolutional or turbo decoding by (i) developing said new path metrics using generated path metrics output from the trellis processing arrangement, (ii) determining said modified decoded results from said intermediate decoded results, and (iii) for determining said decoded output from a selected one of said modified decoded results.

2. The reconfigurable architecture as claimed in claim 1, wherein when said control processor means configures said architecture for convolutional decoding using a Viterbi algorithm, said new path metrics comprise said generated path metrics, said intermediate decoding results comprise decision bits from said trellis processing arrangement, and said intermediate store and said control arrangement implement traceback processing of said intermediate decoded results to provide a convolutionally decoded output.

3. The reconfigurable architecture as claimed in claim 2, wherein said trellis processing arrangement comprises:
butterfly processor means configured for receiving said input symbol and for generating intermediate decoded results and generated path metrics;
a first path metric store for providing old path metrics to said butterfly processor means; and
a second path metric store for receiving new path metrics and buffering said new path metrics to said first path metric store.

4. The reconfigurable architecture as claimed in claim 1, wherein when said control processor means configures said architecture for convolutional decoding using a LogMap algorithm, said trellis processing arrangement implements LogMAP trellis processing and said intermediate store forms part of a store within said trellis processing arrangement.

5. The reconfigurable architecture as claimed in claim 4, wherein said trellis processing arrangement comprises:
butterfly processor means configured for receiving said input symbol and for generating intermediate decoded results and generated path metrics;
a first path metric store for providing old path metrics to said butterfly processor means; and
a second path metric store for receiving new path metrics and buffering said new path metrics to said first path metric store.

6. The reconfigurable architecture as claimed in claim 5, wherein said intermediate store forms part of said first path metric store.

7. The reconfigurable architecture as claimed in claim 5, wherein said first and second path metric stores are formed by a double buffered memory arrangement.

8. The reconfigurable architecture as claimed in claim 5, wherein said first and second stores comprise registers.

9. The reconfigurable architecture as claimed in claim 5, wherein said second path metric store is formed using a plurality of hold registers, said architecture further comprising a multiplexer arrangement interconnecting said hold registers and said first path metric store, said multiplexer arrangement being configurable by said control processor means to update said first path metric store with a specifically ordered sequence of said new path metrics supplied to said hold registers in an originating sequence.

10. The reconfigurable architecture as claimed in claim 1, wherein when said control processor means configures said architecture for turbo decoding, said intermediate decoding results comprise extrinsic information that is modified by said control processor means using interleaving, and said trellis processing arrangement implementing LogMAP trellis processing to produce new extrinsic information supplied to said intermediate store, to provide a turbo decoded output.

11. The reconfigurable architecture as claimed in claim 10, wherein said trellis processing arrangement comprises:
butterfly processor means configured for receiving said input symbol and for generating intermediate decoded results and generated path metrics;
a first path metric store for providing old path metrics to said butterfly processor means; and a second path metric store for receiving new path metrics and buffering said new path metrics to said first path metric store.

12. The reconfigurable architecture as claimed in claim 11 wherein said intermediate store forms part of said first path metric store.

13. The reconfigurable architecture as claimed in claim 11, wherein said first and second path metric stores are formed by a double buffered memory arrangement.

14. The reconfigurable architecture as claimed in claim 11, wherein said first and second stores comprise registers.

15. The reconfigurable architecture as claimed in claim 11, wherein said second path metric store is formed using a plurality of hold registers, said architecture further comprising a multiplexer arrangement interconnecting said hold registers and said first path metric store, said multiplexer arrangement being configurable by said control processor means to update said first path metric store with a specifically ordered sequence of said new path metrics supplied to said hold registers in an originating sequence.

16. A telecommunications decoding device comprising:
a parallel arrangement of decoding processors and at least one store each arranged in a process loop conveying decoding process values received by and generated from said decoding processors;
wherein said decoding processors receive coded data and present decoded results, and a flow of said decoding process values about said process loop is controlled to alter a decoding function performed by said device from one decoding scheme to at least one other decoding scheme.

17. The telecommunications decoding device according to claim 16, wherein said process loop comprises said decoding processors for generating path metrics in a first time period for retention in said store, said store presenting said path metrics to said decoding processors in a following time period.

18. The telecommunications decoding device according to claim 17, wherein said process loop further comprises at least one address processor configured to alter a generated order in which said path metrics are generated by said decoding processors to a supply order by which said path metrics are supplied to said decoding processors.

19. The telecommunications decoding device according to claim 18 wherein said address processor comprises an intermediate store and switching arrangement arranged between said decoding processors and said at least one store.

20. The telecommunications decoding device according to claim 18 wherein said address processor comprises an intermediate store and switching arrangement arranged between said at least one store and said decoding processors.

21. The telecommunications decoding device according to claim 19 or 20 wherein said intermediate store provides a delay of said first time period to said path metrics as determined by a predetermined path metric pattern established by said parallel arrangement.

22. The telecommunications decoding device according to claim 21 wherein said decoding processor comprises first, second and third bank of multiplexers and said intermediate store, each of said banks receiving path metrics generated from said decoding processors, said first bank presenting selected path metrics to said intermediate store, said intermediate store delaying the selected path metrics and presenting the selected path metrics to said second bank in the further time period, said second and third banks configured by said parallel arrangement to present a predetermined sequence of said path metrics and said selected path metrics to said first store.

23. The telecommunications decoding device according to claim 21 wherein said decoding processor comprises first, second and third bank of multiplexers and said intermediate store, each of said first and second banks receiving path metrics generated from said first store, said first bank presenting selected path metrics to said intermediate store and said third bank of multiplexers, said intermediate store delaying the selected path metrics and presenting the selected path metrics to said third bank in the further time period, said first, second and third banks configured by said parallel arrangement to present a predetermined sequence of said path metrics and said selected path metrics to said decoding processors.

24. The telecommunications decoding device according to claim 16, wherein said coded data is encoded using one of convolutional or turbo codes.

25. The telecommunications decoding device according to claim 16, wherein said decoding processors are butterfly processors.

26. The telecommunications decoding device according to claim 16, wherein said parallel arrangement reconfigures a flow of said decoding process values about said process loop to implement convolutional decoding.

27. The telecommunications decoding device according to claim 16, wherein said parallel arrangement reconfigures a flow of said decoding process values about said process loop to implement turbo decoding.

28. The telecommunications decoding device according to claim 16, wherein said process loop further comprises at least one of a forward address processor and a reverse address processor, wherein path metrics generated by said decoding processors are presented to said forward address processor, said forward address processor generating outputs presented to said store, said store presenting outputs to said reverse address processor, said reverse address processor presenting outputs to said decoding processors, said parallel arrangement enabling one of said forward address processor and said reverse address processor according to a desired direction of evaluation of a coding trellis and said parallel arrangement reconfiguring said flow of decoding process values to present a predetermined sequence of path metrics to the decoding processors.

29. A method of handling path metrics in a telecommunications decoding device configured for decoding one of convolutional and turbo codes, said method comprising the steps of:
storing new path metrics generated as part of a decoding process; and
providing the stored path metrics to a reverse address processor for altering a pattern of said path metrics to be provided to decoding processors that generate said new path metrics supplied to a forward address processor, the forward address processor outputting said path metrics to said store, wherein during one of forward trellis decoding and reverse trellis decoding the complementing reverse address processor and forward address processor is disabled from the corresponding altering function.

30. A reconfigurable architecture for decoding data communications signals transmitted according to one of a plurality of coding schemes, said coding schemes comprising convolutional and turbo codes, said architecture comprising:
- a symbol history means for receiving an input symbol derived from said transmitted signals to be decoded and for providing a buffered input symbol delayed by a predetermined period;
- a butterfly processor configured for receiving said input symbol and for generating intermediate decoded results and new path metrics from said input symbol and old path metrics;
- comparator means for receiving said new path metrics and determining a greatest path metric obtained during a calculation of a column of a decoding trellis by said butterfly processor;
- a traceback and interleaver processor for receiving said greatest path metric and said decoded results;
- a first bank of multiplexers arranged to receive said new path metrics and log outputs from a first LogLikelihood processor and to output one thereof as process metrics;
- said process metrics being supplied to each of said first LogLikelihood processor and a second LogLikelihood processor, said first LogLikelihood processor receiving said buffered input symbol, each of said LogLikelihood processors determining a log- likelihood value, said values being supplied together with outputs of said traceback and interleaver processor to a LogLikelihood ratio processor for providing a decoded output for said input symbol from said architecture;
- said process metrics being further supplied to a processing chain configured to provide said old path metrics to said butterfly processor, said processing chain comprising a forward trellis processor for ordering said process metrics into a path metrics store, a second bank of multiplexers for selecting path metrics from said store or said process metrics for supply to a normalising processor also input with said greatest path metric, and a reverse trellis processor for receiving an output of said normalising processor to order normalised path metrics to form said old path metrics; and
- a control arrangement coupled to each of said symbol history means, said butterfly processing means, said comparator means, said first bank of multiplexers, said first LogLikelihood processor means, said second LogLikelihood processor means, said traceback and interleaver processor, said LogLikelihood ratio processor, said forward trellis processor, said path metric stores, said second bank of multiplexers, said normalising processor and said reverse trellis processor, said control arrangement being operable to configure said architecture for one of convolutional or turbo decoding according to one of a forward trellis coding or a reverse trellis coding.

31. A reconfigurable architecture as claimed in claim 30, wherein said control arrangement receives a plurality of control inputs comprising:
- a coding rate of said input symbols indicating how much information is used to represent a single data bit presented in a transmitted block;
- a constraint length specifying the complexity of trellis to be decoded;
- polynomials for use by said butterfly processor and said LogLikelihood processors, the polynomials corresponding to a specific one of coding schemes;
- a number of iterations for turbo decoding;
- a block length for defining how much data is to be processed;
- a clock signal; and
- a reset signal;
- wherein said received control inputs are used by said control arrangement to configure said architecture.

32. A reconfigurable architecture as claimed in claim 30, wherein said normalising processor receives said greatest path metric from said comparator means and subtracts said greatest path metric from path metrics received from said path metrics store to ensure that said new path metrics are retained within a dynamic range of said architecture.

33. A reconfigurable architecture as claimed in claim 30, wherein said first and second banks of multiplexer provide points of interconnection to a further one or more of said reconfigurable architecture for one of scaled or multiple decoding.

34. A reconfigurable architecture as claimed in claim 30, wherein said decoded output is a soft decision output when said architecture is configured for turbo decoding.

35. A reconfigurable architecture as claimed in claim 30, wherein said decoded output is a hard decision output when said architecture is configured for convolutional decoding using a Viterbi algorithm.

36. A reconfigurable architecture as claimed in claim 30, wherein said decoded output is a soft decision output when said architecture is configured for convolutional decoding using a LogMAP algorithm.

37. A reconfigurable architecture as claimed in claim 30, wherein said architecture is capable of outputting a maximum accumulated path metric.

38. A reconfigurable architecture as claimed in claim 30, wherein said architecture is capable of outputting a minimum accumulated path metric.

39. A reconfigurable architecture as claimed in claim 30, wherein said architecture is capable of outputting maximum and minimum accumulated path metrics.

40. A decoder, comprising:
- a plurality of computation units, each of said computation units performing a single function; wherein
- in a first mode of operation, at least a first subset of said computation units are arranged to decode an input symbol at a first time according to a first decoding mode, and
- in a second mode of operation, at least a second subset of said computation units, which includes at least one computation unit that was in said first subset, are arranged to decode said input signal at a second time according to a second decoding mode.

41. A telecommunications decoding device comprising a reconfigurable architecture for decoding input data provided according to one of a plurality of coding schemes, said architecture comprising a plurality of atomic processing units, each said atomic processing unit being coupled via a binary tree arrangement of switching structures to provide a modified decoding arrangement producing a single decoded output, said single decoded output being presented recursively via a bank of multiplexers as an input to each said atomic unit.

42. The device according to claim 41, wherein said coding schemes comprise convolutional codes and turbo codes.

43. The device according to claim 42, wherein when input data comprises convolutional codes input to each one of a plurality of said devices, said devices decode said input data over a period substantially inversely proportional to the number of said devices.

44. The device according to claim 42, wherein when said input data comprises turbo codes supplied to each of a plurality of said devices, said devices decode said input data over a period substantially inversely proportional to the number of said devices.

45. The device according to claim 42, wherein one or more of said atomic processing units act on different code blocks to improve throughput of the telecommunications decoding device.

46. A telecommunications decoder for decoding input symbols to provide output data, said decoding involving evaluation of a trellis for each said input symbol, said decoder comprising:

means for evaluating said trellis in a first direction;

means for evaluating said trellis in a second direction; and means for enabling operation of one of said processors according to a determined coding arrangement of said input symbols wherein said decoding is based on covolutional codes.

47. The telecommunications decoder as claimed in claim 46, wherein a sliding window algorithm to enable a first and second passes when performing LogMAP calculations.

48. The telecommunications decoder as claimed in claim 47, wherein the same decoder that performs LogMAP calculations to perform Viterbi calculations.

* * * * *